United States Patent
Edel

(10) Patent No.: US 6,522,517 B1
(45) Date of Patent: *Feb. 18, 2003

(54) METHOD AND APPARATUS FOR CONTROLLING THE MAGNETIZATION OF CURRENT TRANSFORMERS AND OTHER MAGNETIC BODIES

(76) Inventor: Thomas G. Edel, 9232 N. Tyler Ave., Portland, OR (US) 97203-2356

( * ) Notice: Subject to any disclaimer, the term of this patent is extended or adjusted under 35 U.S.C. 154(b) by 155 days.

This patent is subject to a terminal disclaimer.

(21) Appl. No.: 09/713,921

(22) Filed: Nov. 15, 2000

Related U.S. Application Data

(63) Continuation-in-part of application No. 09/541,403, filed on Mar. 31, 2000, now Pat. No. 6,160,697, which is a continuation-in-part of application No. 09/257,221, filed on Feb. 25, 1999, now abandoned.

(51) Int. Cl.[7] .................................................. H01H 47/00
(52) U.S. Cl. ......................... 361/143; 361/146; 361/149
(58) Field of Search ................................. 361/143, 146, 361/149

(56) References Cited

U.S. PATENT DOCUMENTS

| | | |
|---|---|---|
| 3,772,617 A | 11/1973 | Ciesielka |
| 3,859,573 A | 1/1975 | Siems et al. |
| RE28,851 E | 6/1976 | Milkovic |
| 4,007,414 A | 2/1977 | Shima et al. |
| 4,456,875 A | 6/1984 | Chenier |
| 4,471,403 A | 9/1984 | Dress et al. |
| 4,616,174 A | 10/1986 | Jorgensen |
| 4,616,403 A | 10/1986 | Jorgensen |
| 5,896,027 A | 4/1999 | So et al. |
| 6,028,422 A | 2/2000 | Preusse |
| 6,160,697 A | * 12/2000 | Edel .......................... 361/143 |

OTHER PUBLICATIONS

Y. Suzuki et al, Analysis of a Zero–Flux Type Current Sensor, IEEE Transactions on Magnetics, vol. 29, No. 6, Nov. 1993, pp. 3183–3185.

PCT International Search Report, application No. PCT/US 00/30358, Filing Date Nov. 3, 2000, Report Completion Date Jun. 13, 2001, Applicant Thomas G. Edel, Report by European Patent Office.

Y. Suzuki et al, Analysis of a Zero–Flux Type Current Sensor, IEEE Transactions on Magnetics, vol. 29, No. 6, Nov. 1993, pp. 3183–3185.

* cited by examiner

Primary Examiner—Stephen W. Jackson

(57) ABSTRACT

A varying voltage is applied to a conductive winding (61) that magnetically interacts with a magnetic body (60). The varying voltage causes the voltage induced in the winding to have such waveform and magnitude that the integral over time of the induced voltage correlates to desired changes of the induction level (magnetic flux density). The induction level of a magnetic body may be controlled to transition from an initial induction level to a preferred induction level, to maintain a preferred induction level, to reduce fluctuations around a preferred induction level, or to vary with time in a preferred manner. The invention is especially applicable to ordinary current transformers, which may be demagnetized automatically while remaining in service. Once demagnetized, ordinary current transformers are able to accurately sense nonsymmetrical currents, including d-c currents and a-c currents that have d-c components. A demagnetizing mode, during which the current transformer is demagnetized, and a current-sensing mode, during which current transformer secondary current is sensed, are usually utilized sequentially. For a-c power system applications, a current transformer demagnetizing circuit may include an adjustable impedance with a suitable control circuit. A controllable active voltage source may alternately be used as part of a current transformer demagnetizing circuit, in which case an ordinary current transformer may be used to sense d-c current as well as a-c current. A controllable active voltage source may also be used to improve current transformer accuracy by reducing the amount that the induction level of the core fluctuates, regardless of whether the demagnetizing aspect of the invention is utilized.

75 Claims, 15 Drawing Sheets

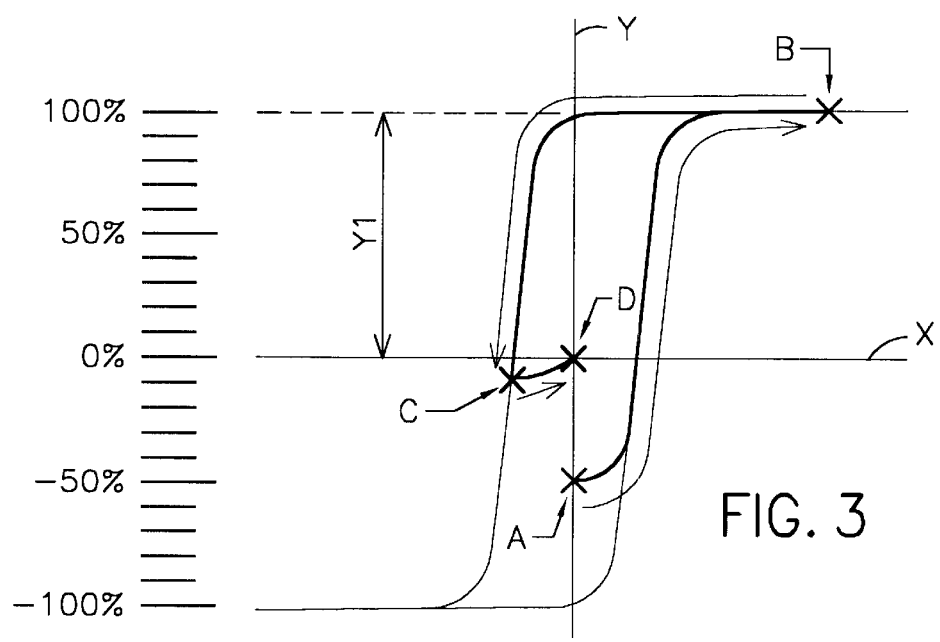
FIG. 3
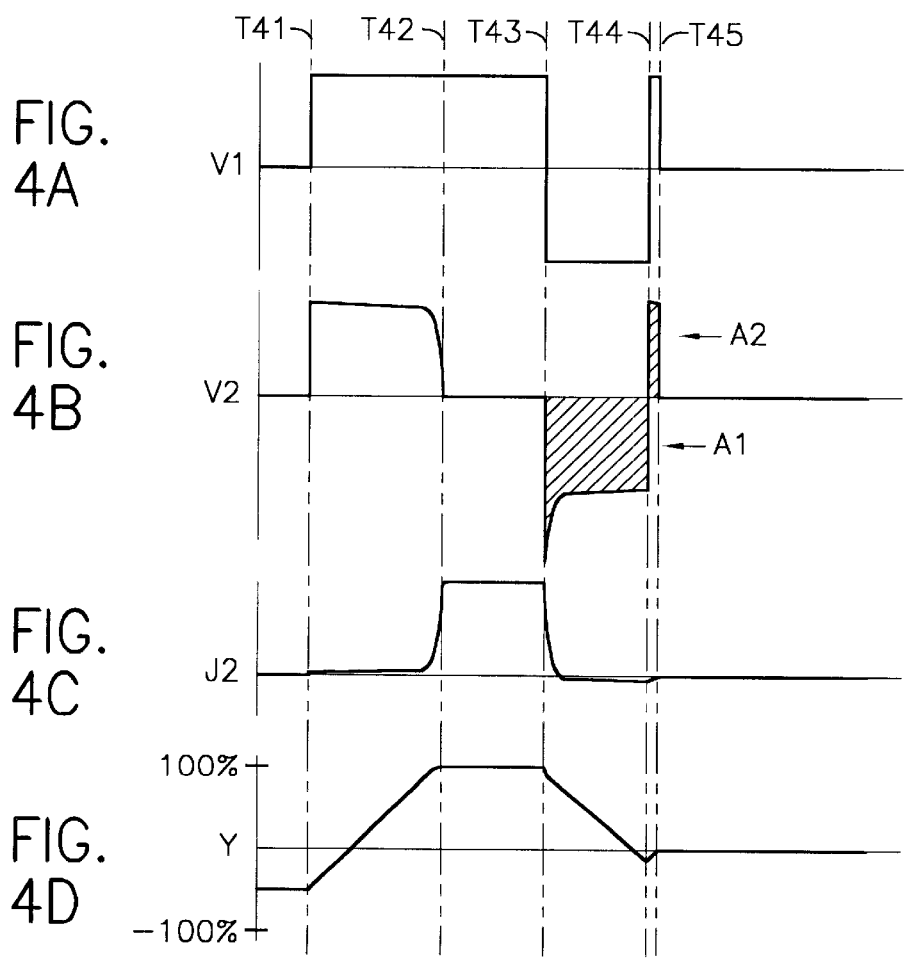
FIG. 4A
FIG. 4B
FIG. 4C
FIG. 4D

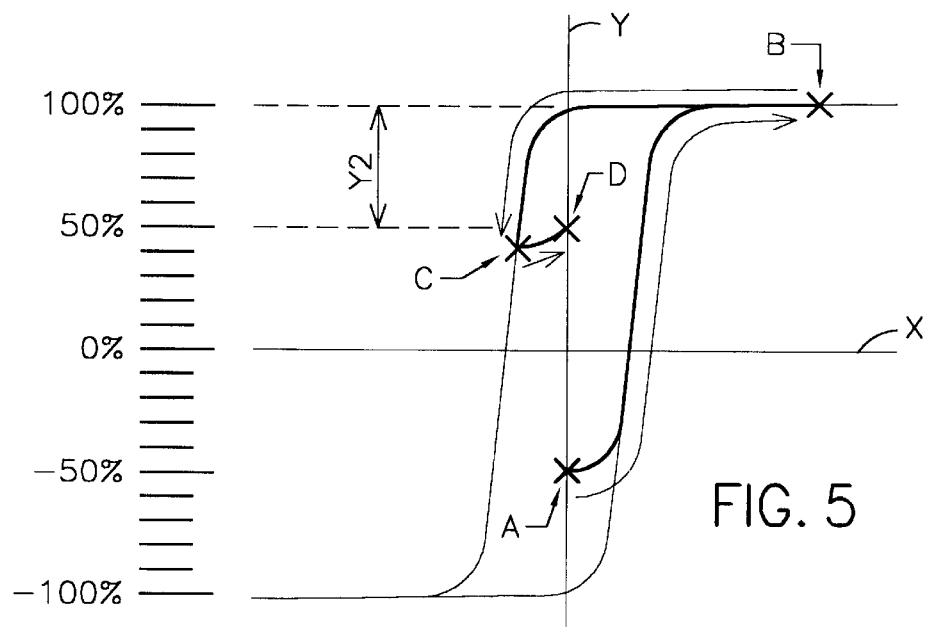
FIG. 5
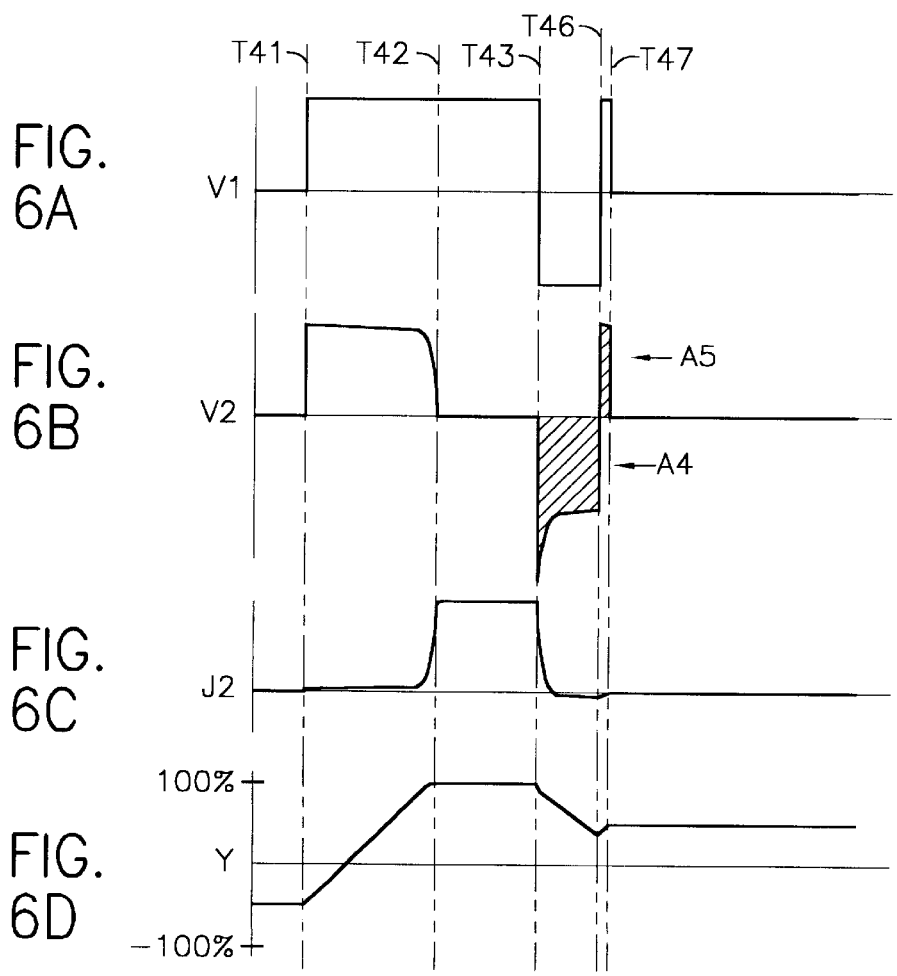
FIG. 6A
FIG. 6B
FIG. 6C
FIG. 6D

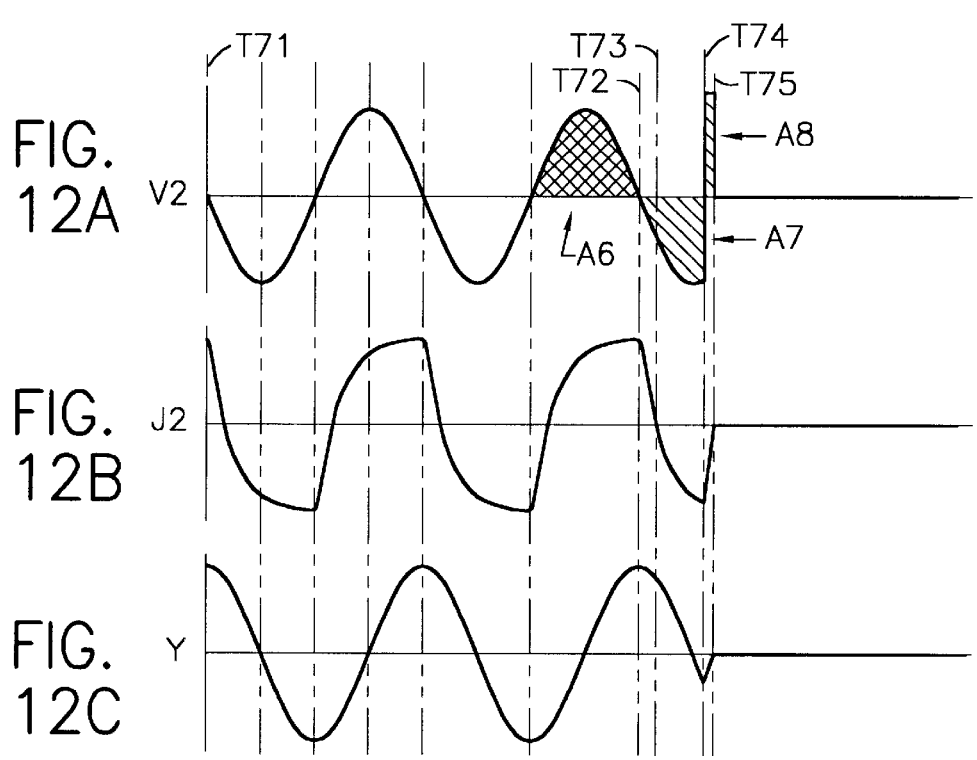
FIG. 12A
FIG. 12B
FIG. 12C
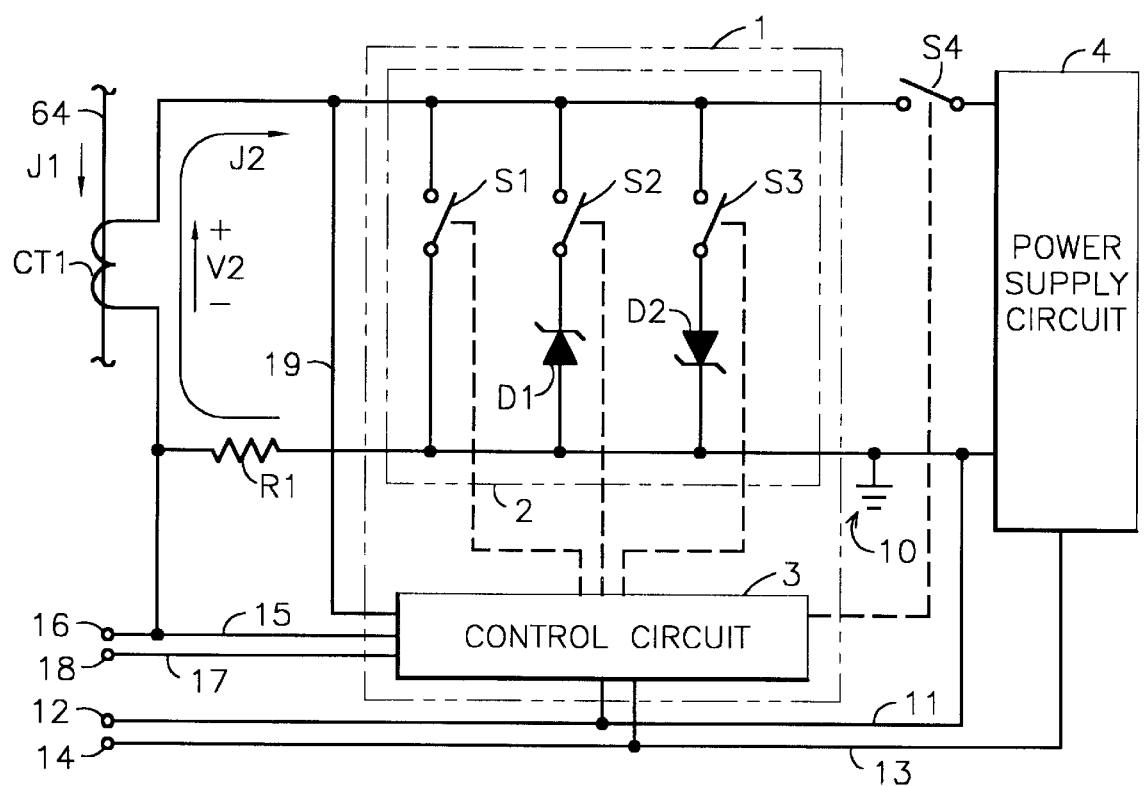
FIG. 13

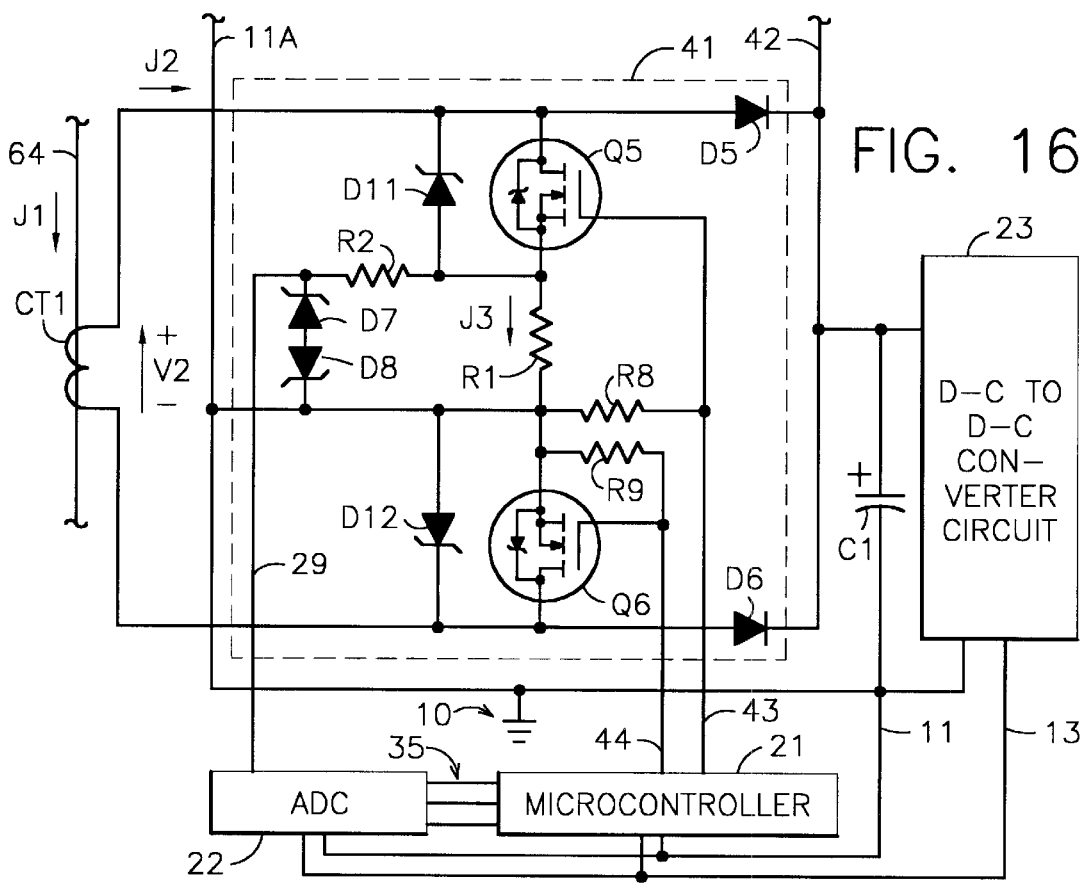
FIG. 16
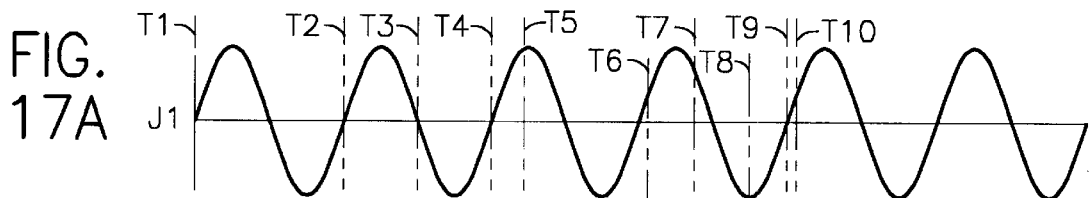
FIG. 17A  J1
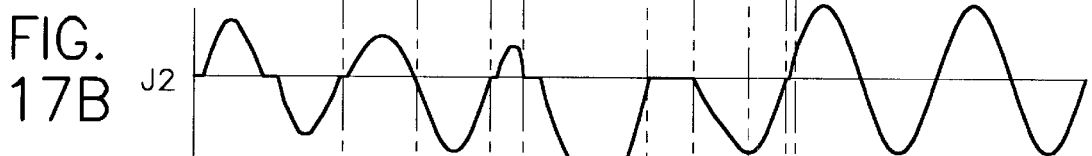
FIG. 17B  J2
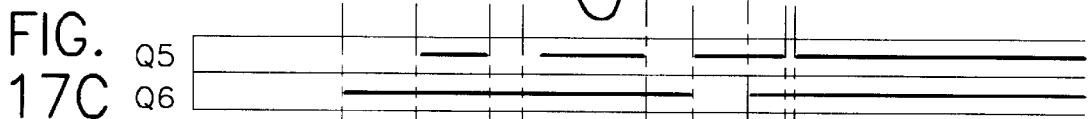
FIG. 17C  Q5 Q6
FIG. 17D  V2

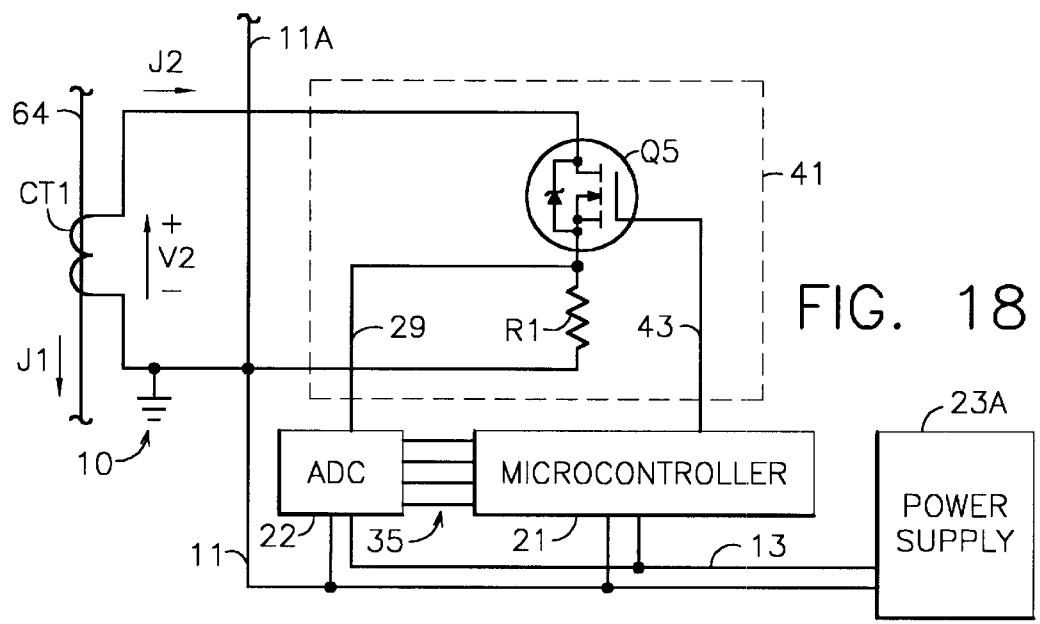
FIG. 18
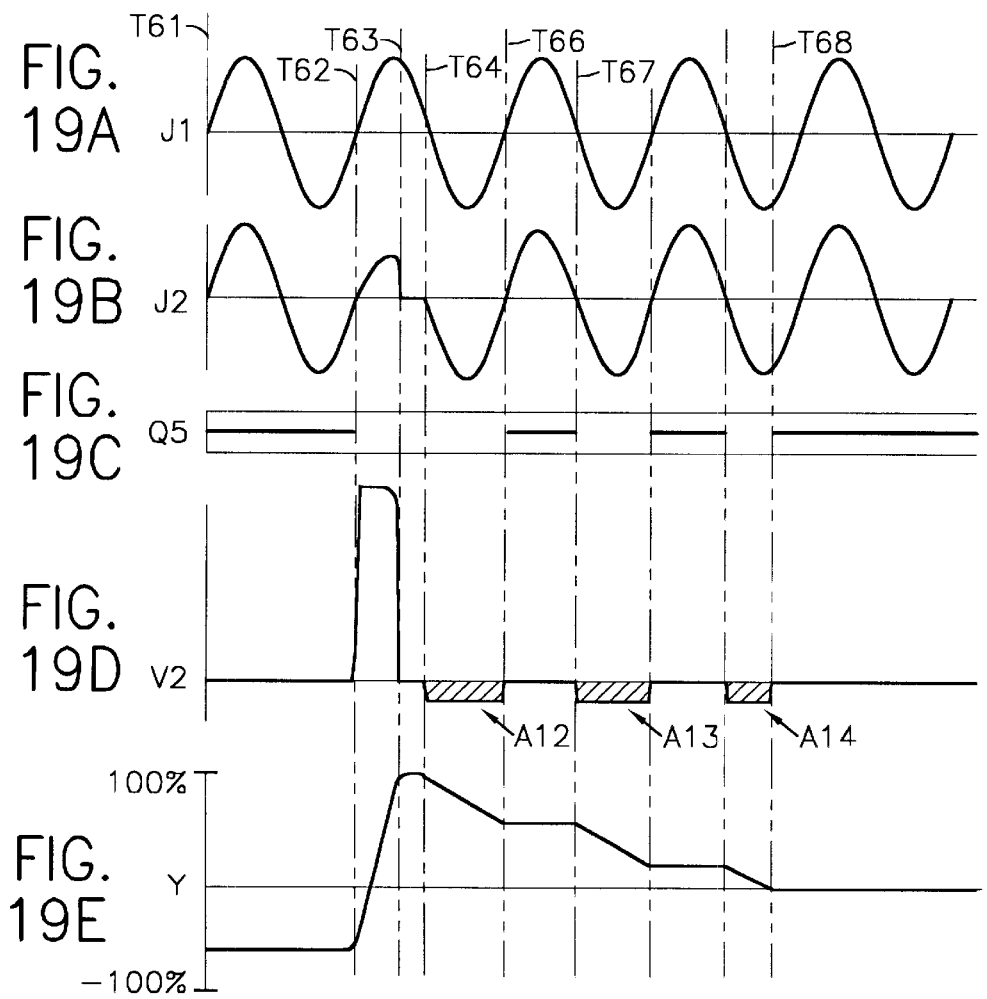

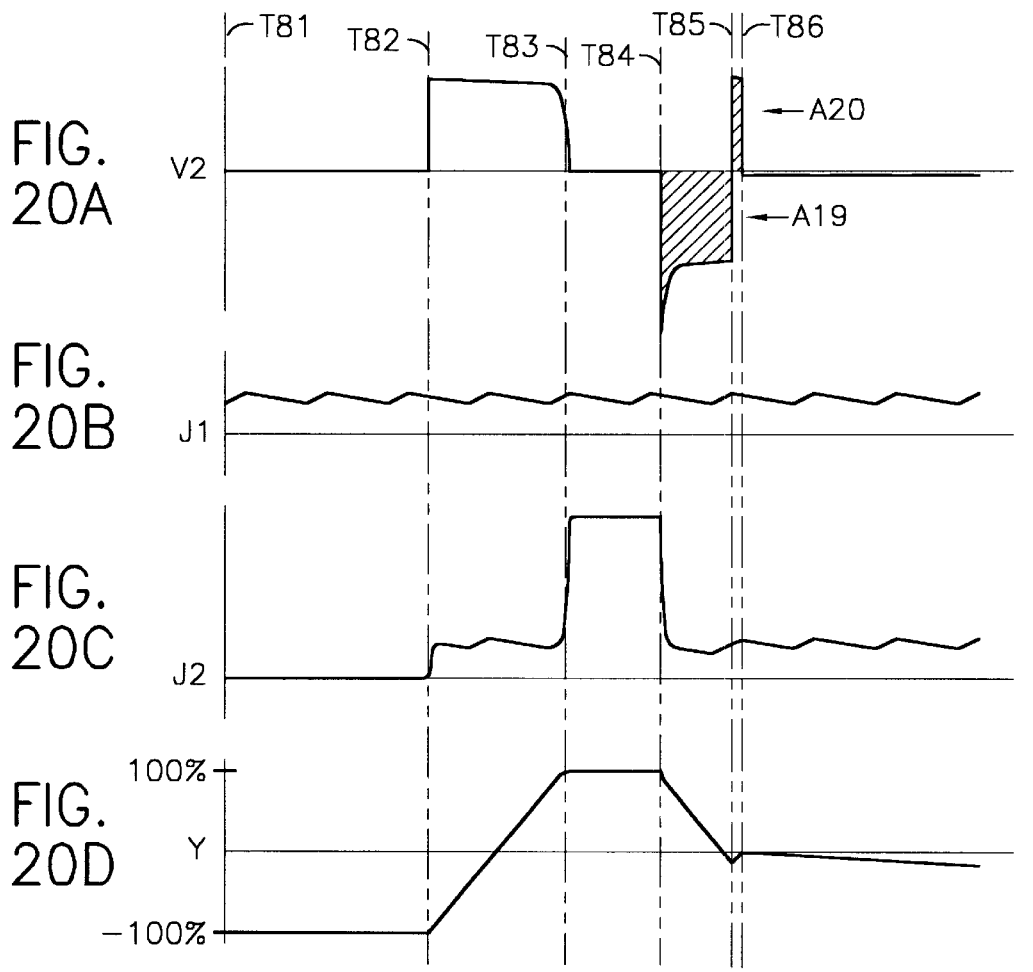
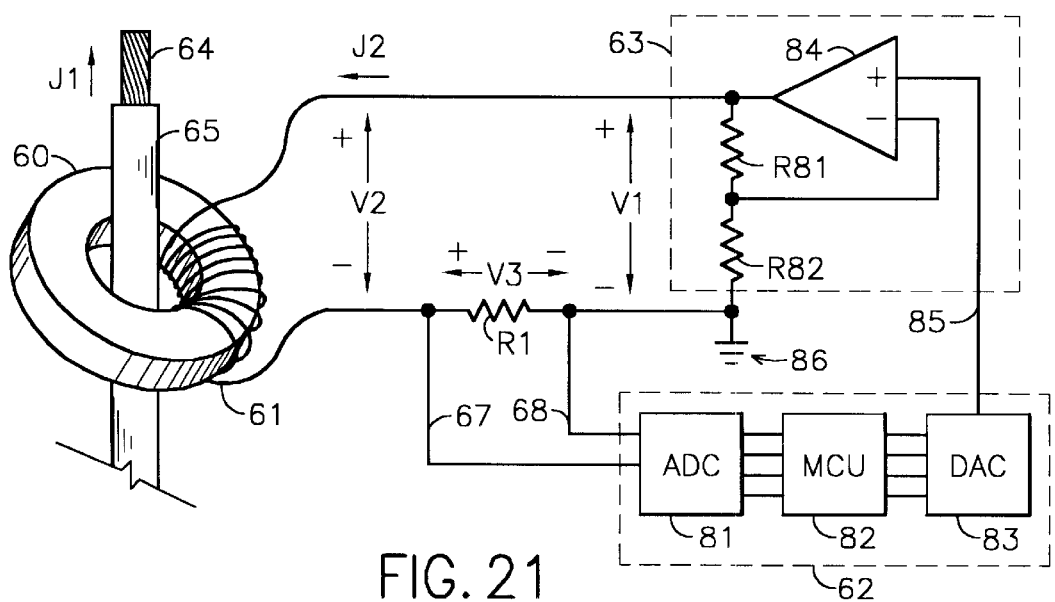

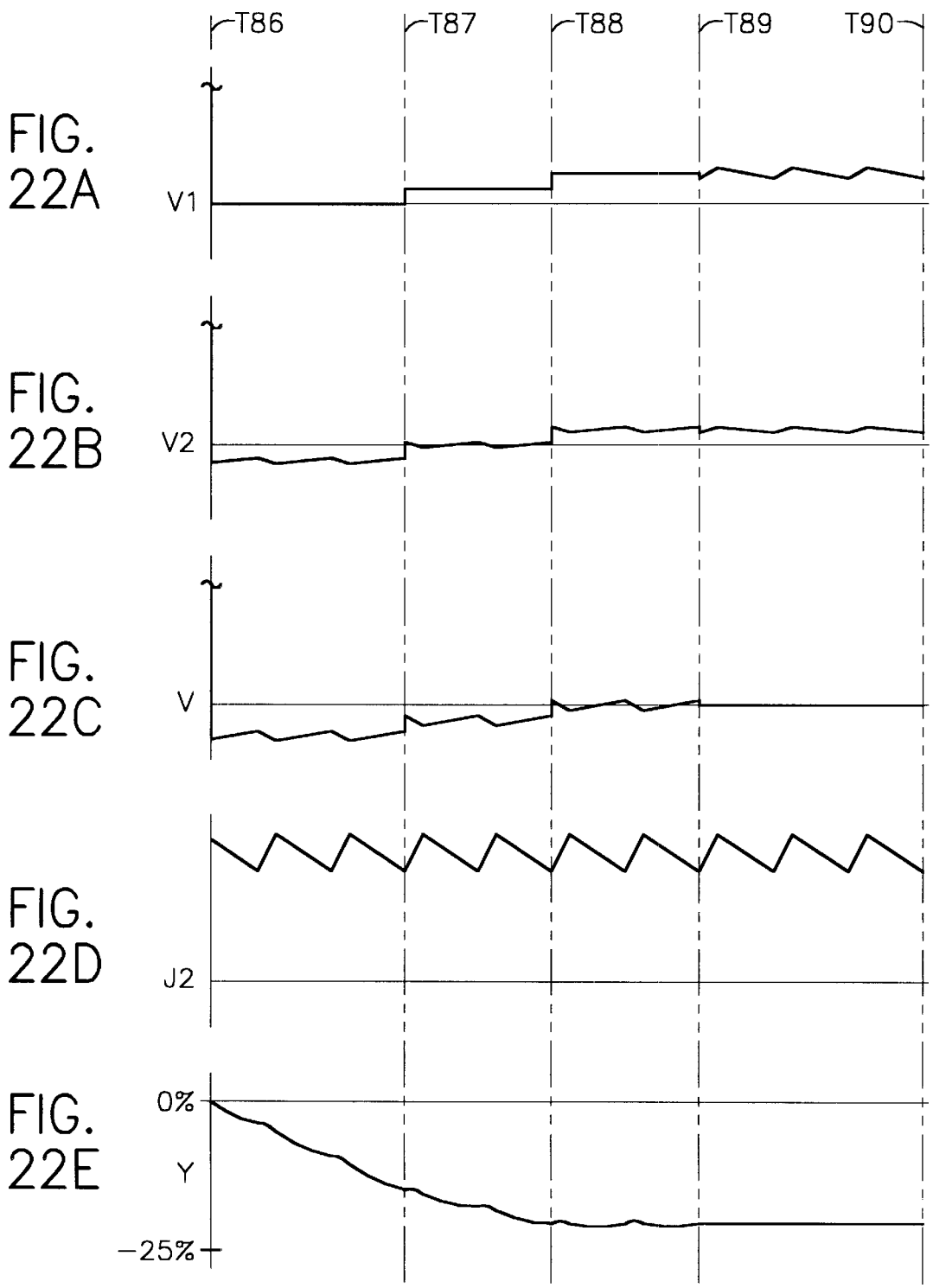

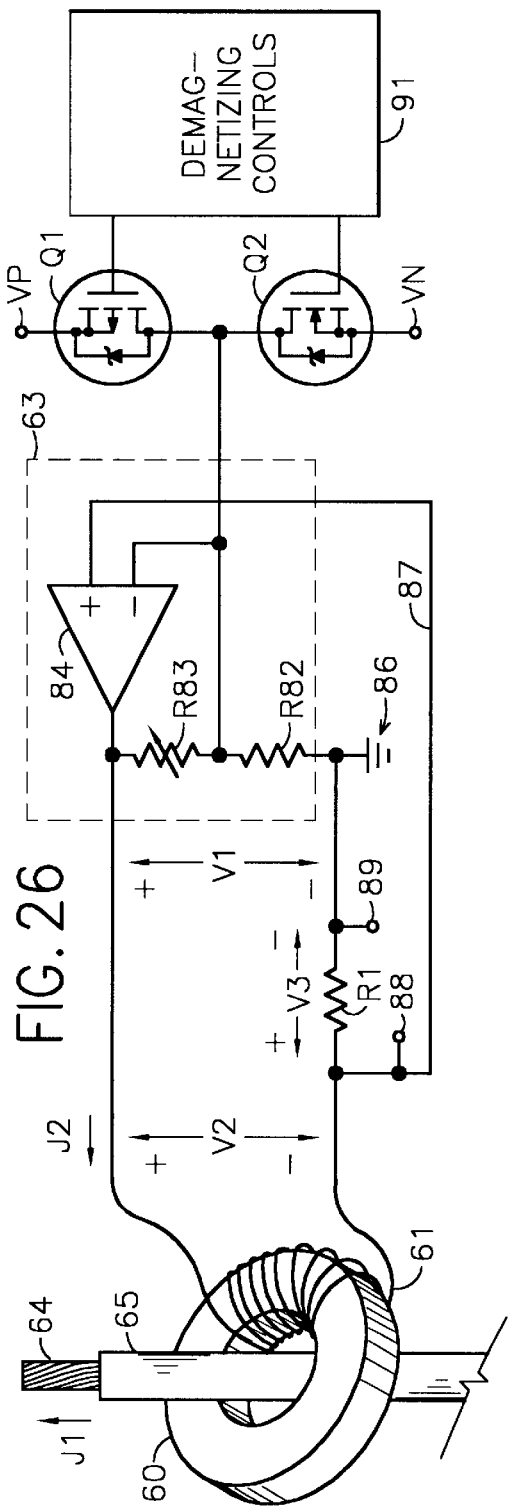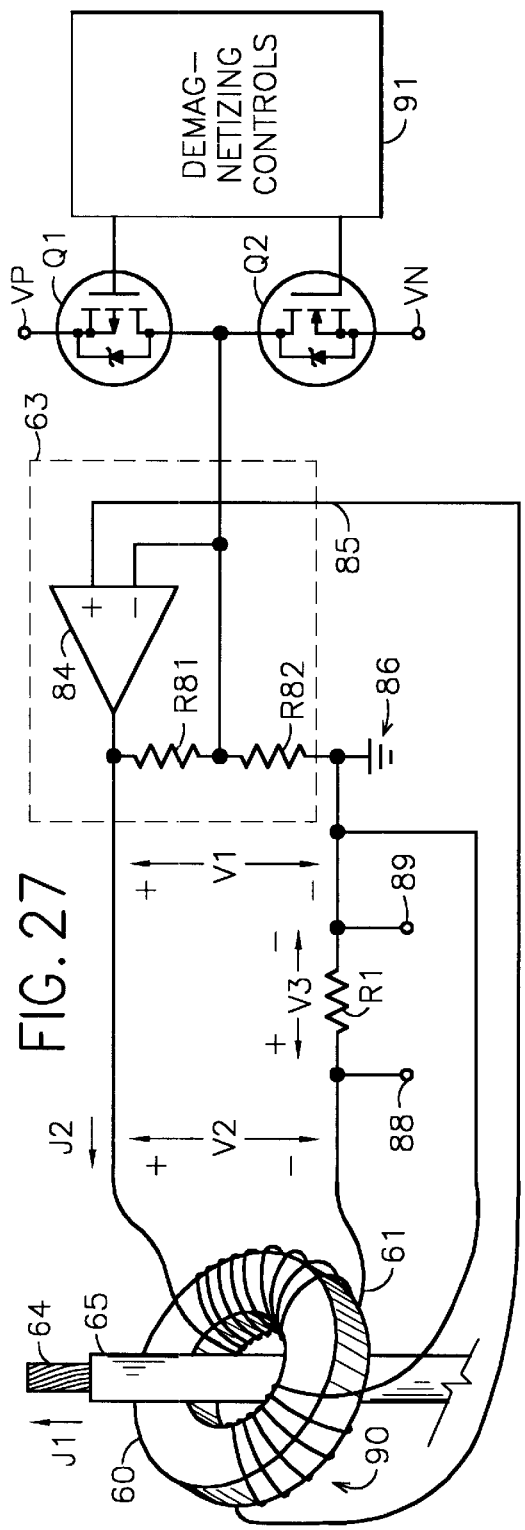

METHOD AND APPARATUS FOR CONTROLLING THE MAGNETIZATION OF CURRENT TRANSFORMERS AND OTHER MAGNETIC BODIES

CROSS-REFERENCE TO RELATED APPLICATION

This is a continuation-in-part of application Ser. No. 09/541,403, filed Mar. 31, 2000, now U.S. Pat. No. 6,160,697, which is a continuation-in-part of application Ser. No. 09/257,221, filed Feb. 25, 1999, now abandoned.

BACKGROUND ART

This invention relates to the art of controlling the magnetic flux density within magnetic bodies. A varying voltage applied to a conductive winding causes the voltage induced in the winding to have such waveform and magnitude that the integral over time of the induced voltage correlates to desired changes of the magnetic induction level.

Prior art methods, that utilize a conductive winding to control magnetization, generally focus on controlling winding current to control the induction level of a magnetic body. The winding current directly correlates with magnetic field intensity. Changes in magnetic field intensity are coordinated with hysteresis-curve properties of the magnetic material to control the induction level. (As used throughout this disclosure, the following terms are synonymous. "magnetization," "magnetic induction," "flux density" and "induction level").

Many applications are particularly concerned with how a magnetic body may be demagnetized. Most prior-art demagnetizing methods (that effectively reduce the induction level of a magnetic body to near zero) utilize a declining alternating magnetic field. The alternating magnetic field is usually produced by a conductive winding conducting a declining alternating current. Many different embodiments of this demagnetizing method are well established in the prior art.

Other applications are concerned with how a magnetic body may be magnetized to a preferred induction level. To establish a preferred induction level, prior art methods generally apply a current with controlled magnitude to a winding (usually with the magnetic body initially in a demagnetized state). The current is understood to produce a magnetic field in the magnetic body that is proportional to current magnitude. Current magnitude (and magnetic field strength) is coordinated with hysteresis curve properties of the magnetic body to produce a preferred induction level. Many different embodiments of this magnetizing method are also well established in the prior art.

Of particular relevance to the present invention is the relationship between voltage induced in a winding and changing magnetic flux. The relationship between induced voltage and changing magnetic flux was originally stated in a general way by Michael Faraday, and is widely known as Faraday's Law. Faraday's Law basically states that the voltage induced around a closed path is proportional to the rate of change of magnetic flux within the closed path. It is well established in prior art how Faraday's Law can be used along with a conductive winding to measure changes of induction level in a magnetic body. However, the prior art does not appear to address how the induction level of a magnetic body can be controlled by controlling the voltage induced in a winding.

The initial motivation for developing the present invention was to provide a way to demagnetize current transformers while the current transformers remain in service. The prior art does not address this problem very well.

Most current monitoring systems for a-c (alternating-current) electric power systems utilize current transformers to provide input currents that are isolated from the electric power system conductors. A primary winding of a current transformer is connected in series with a current-carrying conductor while a secondary winding is magnetically coupled to the primary winding by a suitable magnetic core. A current is induced in the secondary winding that is proportional to the primary current. The secondary current is isolated from the primary current and is smaller than the primary current by the turns ratio of the primary and secondary windings. The primary winding frequently consists of only one turn, which is often just the current-carrying conductor installed through an opening in the middle of the current transformer magnetic core. The secondary winding usually consists of multiple turns wrapped around the magnetic core.

The accuracy of a current transformer is usually related to the coercive force of the magnetic core material (less is better), the cross sectional area of the magnetic core (bigger is better), the effective magnetic length of the magnetic core (shorter is better), any air gap in the magnetic core (less or none is better), and the "squareness" of the magnetic core material hysteresis curve (squarer is usually preferred if not operating near saturation, otherwise characteristics that are not square may be preferred). In the case of high-quality current transformers with very little air gap (usually tape-wound construction, not split-core construction), acceptable accuracy is often achieved as long as operation near saturation is avoided. Split-core current transformer cores generally have hysteresis curves that are less square than standard current transformer cores due to the small air gaps inherent in the design of split-core current transformers.

In order for the secondary current generated by a current transformer to be an accurate representation of the primary current, the impedance of the circuit connected to the secondary winding must be kept low so that current can flow freely. The impedance of the secondary circuit is often called the "burden." The burden generally includes all impedances in the loop through which the secondary current flows, including stray winding impedances, stray impedances of connecting conductors, and the impedances of any devices connected in the loop (such as current-sensing resistors and relay operating coils). In order for a current transformer to drive a secondary current through a non-zero burden, a voltage must be induced in the secondary winding. The induced voltage is proportional to secondary current and is proportional to the burden, in accordance with Ohm's law. The induced voltage is induced in the secondary winding by a fluctuating induction level in the magnetic core. The fluctuating induction level is associated with a magnetizing current in accordance with well-known electromagnetic principles. The magnetizing current accounts for most of the error in the secondary current. Generally speaking, the accuracy of a current transformer is inversely related to the burden of the secondary circuit. A higher burden causes the secondary current to be a less accurate representation of the primary current.

The accuracy of the secondary current may also be adversely affected by either of the following:

(a) A primary current that is not symmetrical. "Symmetrical" is intended to mean that the waveform has positive and negative half-cycles with the same waveform and magnitude. An alternating current that has a d-c (direct-current) component is a common example of a primary current that is not symmetrical. Also, transient a-c fault currents are often not symmetrical. D-c currents are, by definition, not symmetrical.

(b) A burden that is not a linear impedance. Nonlinear burdens are common in applications that derive power from the secondary current.

In either of these cases, the current transformer core may become magnetized. This magnetization may cause significant error in the secondary current. This error may include distortion of the secondary current, including the loss of any d-c component that is present in the primary current.

BRIEF SUMMARY OF THE INVENTION

In accordance with the present invention, a varying voltage is applied to a conductive winding that magnetically interacts with a magnetic body. The varying voltage controls the voltage induced in the winding in such a way that the integral over time of the induced voltage correlates to desired changes of the induction level (magnetization) of the magnetic body. The invention may be used to control the induction level of a magnetic body in several ways:

(a) The induction level of a magnetic body may be caused to transition from a known induction level to a preferred induction level. (A preferred induction level of zero may be chosen to demagnetize a magnetic body).

(b) When the induction level is not known, a preferred induction level may be established by changing the induction level of the magnetic body from an unknown induction level to a known induction level and then to the preferred induction level.

(c) A preferred induction level may be maintained by causing the induced voltage across the winding to have an average value near zero (or by causing the integral of induced voltage to not exceed a predetermined value).

(d) A preferred induction level may be more strictly maintained by causing the induced voltage across the winding to continuously be near zero volts, thereby reducing the amount that the induction level fluctuates.

(e) The induction level may be made to vary with time in a preferred manner, including matching a control signal that is proportional to a reference induction level.

The varying voltage may be generated directly by an active voltage source (or, more generally, a controllable electric energy source) or the varying voltage may be generated indirectly, such as by current transformer secondary current flowing through an adjustable impedance. The key elements are a magnetic body, a conductive winding that magnetically interacts with the magnetic body, and a means of causing the induced voltage to have the appropriate waveform and magnitude.

A conductive winding that is utilized for controlling induction level may be a permanent winding that is also used for other purposes, or it may be a dedicated winding (permanent or temporary) provided solely for the purpose of controlling induction level.

The invention is most readily applied to magnetic bodies that are configured to have a relatively uniform magnetic path, such as the magnetic cores of current transformers. The accuracy of a current transformer may be improved by the invention in three ways:

(a) By demagnetizing a current transformer, inaccuracies associated with core magnetization are removed. A demagnetized current transformer can accurately measure d-c current and a-c current that has a d-c component.

(b) By keeping the integral over time of induced voltage near zero, a current transformer is better able to measure unsymmetrical currents without quickly transitioning to saturation.

(c) By reducing the amount that the induction level in the core fluctuates, inaccuracies associated with magnetizing current may be greatly reduced and the accuracy of a current transformer may be greatly improved.

When utilized with an a-c power system, current transformers may be demagnetized while in service by utilizing an adjustable impedance connected in series with current transformer secondary current. The adjustable impedance causes an induced voltage across the secondary winding of the current transformer. By sequentially adjusting the adjustable impedance, the induced voltage is caused to vary in such a way that the magnetic core of the current transformer is demagnetized.

Current transformers may also be demagnetized using an active voltage source to generate the varying voltage, in which case the varying voltage may also be used to reduce induction level fluctuations required for operation, thereby improving the accuracy of the current transformer.

The invention is based on two principles of electromagnetism:

(1) the relationship of magnetomotive force to flux density as defined by hysteresis curves of magnetic bodies, and (2) Faraday's Law applied to magnetic bodies.

The second principle (Faraday's law applied to magnetic bodies) clarifies how a voltage induced in a winding is directly proportional to a changing induction level. While prior art shows how induced voltage can be used to measure changes in induction level, the present invention shows how induction level can be controlled by controlling induced voltage. The invention primarily utilizes this second principle relationship to control the induction level of a magnetic body.

To establish a preferred induction level in a magnetic body, the first principle may be used during a first phase to change the induction level of a magnetic body from an unknown induction level to a known induction level. Once the induction level is known, the second principle is used during a second phase to change the induction level from the known induction level to a preferred induction level. The second principle may also be used to maintain a preferred induction level, to reduce the amount that the induction level fluctuates, and to cause the induction level to vary with time in a preferred manner.

Since the initial motivation for developing the invention was to provide a way to demagnetize current transformers, much of the description is directed toward current transformer applications and demagnetizing issues. However, it should be clear that the invention may be applied to magnetic bodies in general, and that the invention may be used to magnetize a magnetic body to any preferred induction level, as well as to maintain a preferred induction level, reduce induction level fluctuations, and cause the induction level to vary with time in a preferred manner. It is not the intent of this disclosure to limit the invention to current transformer and demagnetizing applications.

Accordingly, some objects and advantages of the present invention are:

(a) To provide a way to cause the induction level of a magnetic body to vary with time in a preferred manner.

(b) To provide a way to transition from a known induction level to a preferred induction level.

(c) To provide a way to reduce the amount that the induction level of a magnetic body fluctuates.

(d) To provide a way to maintain a preferred induction level in a magnetic body.

(e) To provide a way to magnetize a magnetic body to a preferred induction level, utilizing a primary winding conducting an alternating current and a secondary winding connected to an adjustable impedance.

(f) To provide a way to demagnetize a magnetic body, utilizing a primary winding conducting an alternating current and a secondary winding connected to an adjustable impedance.

(g) To provide a new way to magnetize a magnetic body to a preferred induction level, utilizing a conductive winding and a controllable electric energy source.

(h) To provide a new way to demagnetize a magnetic body, utilizing a conductive winding and a controllable electric energy source.

(i) To provide a way to demagnetizing current transformers while in service, thereby improving the accuracy of current transformers.

(j) To provide a way to improve the accuracy of a current transformer by reducing the amount that the induction level fluctuates during current-sensing operation.

(k) To provide a way to maintain a current transformer in a demagnetized state once the current transformer has been demagnetized.

(l) To provide a way to utilize ordinary current transformers to measure d-c current.

Further objects and advantages will become apparent from a consideration of the drawings and the following detailed description.

BRIEF DESCRIPTION OF THE DRAWINGS

FIGS. 1 through 12 illustrate how the invention may be applied to magnetic bodies in general. FIGS. 1 and 2 illustrate typical components and connections, while FIGS. 3 through 12 illustrate how a varying voltage may be utilized to control the induction level of a magnetic body.

FIGS. 13 through 19 all illustrate how an adjustable impedance may be utilized in a current transformer secondary circuit to demagnetize a current transformer.

FIGS. 20 through 27 all illustrate how an active voltage source may be utilized in a current transformer secondary circuit to control induction level.

FIG. 1 illustrates the general concept by showing a magnetic body 60, a winding 61 wrapped around magnetic body 60, and a controllable voltage device 63 with a suitable control circuit 62. Magnetic body 60 and winding 61 are shown in a typical current transformer configuration with the magnetic core around an electric power system conductor 64. Controllable voltage device 63 may be an active electrical energy source or an adjustable impedance.

FIG. 2 illustrates an alternate configuration in which magnetic material 72 is used to provide a closed magnetic path for a magnetic body 70. A controllable electric energy source 73 is shown in place of the more general controllable voltage device 63 of FIG. 1.

FIG. 3 shows a hysteresis curve sequence that may be used to quickly change the induction level of a magnetic body from an unknown induction level to an induction level near zero.

FIGS. 4A to 4D show one method of controlling voltages and currents to demagnetize a magnetic body utilizing the hysteresis curve sequence shown in FIG. 3.

FIG. 5 shows a hysteresis curve sequence similar to FIG. 3, except now showing how the induction level of a magnetic body may be quickly changed from an unknown level to a preferred induction level (other than zero).

FIGS. 6A to 6D show one method of controlling voltages and currents to establish a preferred induction level in a magnetic body utilizing the hysteresis curve sequence shown in FIG. 5.

FIG. 7 shows a hysteresis curve sequence that may be used to automatically determine demagnetizing parameters and quickly demagnetize a magnetic body.

FIG. 9 shows a hysteresis curve sequence that illustrates how a magnetic body may be demagnetized when current is not adequate to drive the magnetic body into saturation.

FIG. 10 shows another hysteresis curve sequence that illustrates how a magnetic body may be demagnetized without driving the magnetic body into saturation.

FIG. 11 shows a very simple embodiment of a controllable electric energy source that can be used to carry out the hysteresis curve sequence shown in FIG. 10.

FIGS. 12A to 12C show one way that an alternating voltage and current may be utilized to implement the hysteresis curve sequence of FIG. 10 using the controllable electric energy source shown in FIG. 11.

FIG. 13 shows a functional schematic to illustrate how an adjustable impedance 2 may be used to demagnetize a current transformer while in service. An optional power supply circuit 4 is shown that can derive power from the current transformer secondary current to provide power for self-powered applications.

FIGS. 14A to 14E show typical operating waveforms and control signals associated with preferred operation of the functional schematic shown in FIG. 13.

FIGS. 15A to 15E show waveforms and control signals for an alternate method of operation for the functional schematic shown in FIG. 13. This method of operation does not require any feedback signal to the control circuit.

FIG. 16 shows one way that the functional schematic of FIG. 13 may be embodied. The power supply circuit for self-powered operation is optional.

FIGS. 17A to 17D show typical operating waveforms and control signals associated with the embodiment shown in FIG. 16.

FIG. 18 shows an alternate embodiment of a current transformer demagnetizing circuit utilizing only one MOSFET transistor for the adjustable impedance.

FIGS. 19A to 19E show typical operating waveforms and control signals associated with the embodiment shown in FIG. 18.

FIGS. 20A to 20D illustrate how the configuration of FIG. 1 may be operated to demagnetize a current transformer and measure d-c current.

FIG. 21 shows one way that control circuit 62 and voltage device 63 of FIG. 1 may be embodied to measure electric current, including d-c current.

FIGS. 22A to 22D illustrate four different ways that the configurations shown in FIGS. 1 or 21 may be operated during a current-sensing mode after a demagnetizing sequence is completed. Conceptually, FIGS. 22B, 22D and 22E may be thought of as a continuation in time of FIGS. 20A, 20C and 20D respectfully, with enlarged vertical scales.

FIG. 23 illustrates a variation of the configuration shown in FIG. 21 that may be used to improve the accuracy of a current transformer by reducing the amount that the induction level fluctuates, without provision for demagnetizing control.

FIG. 24 is a variation of FIG. 23 showing how a complex sensing impedance may be utilized to further reduce induction level fluctuations.

FIG. 25 shows a configuration that is similar to FIG. 21, but with a dedicated sensing winding providing a feedback signal that is proportional to induced voltage.

FIG. 26 shows a configuration similar to FIG. 23, but modified to include demagnetizing control.

FIG. 27 shows how a dedicated sensing winding may be configured to reduce induction level fluctuations, while including provision for demagnetizing control similar to FIG. 26.

Figure 1:
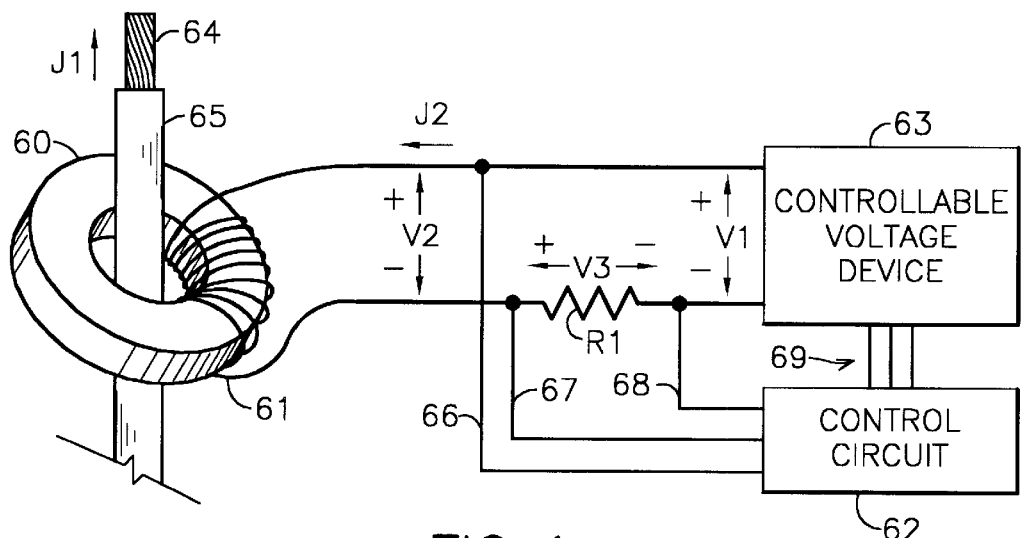

Items that are common to more than one figure are identified by the same reference characters. Sequence point identifiers A, B, C, D, E, F, and G (used in FIGS. 3, 5, 7, 9 and, 10) are intended to indicate sequential progress, rather than a functional state. Point A indicates the first point of a sequence, point B indicates the second point of a sequence, etc.

DETAILED DESCRIPTION OF THE INVENTION

Theory

The invention is based primarily on two principles of electromagnetism, herein referred to as the "first principle" and "second principle." These two principles may be stated briefly as follows:

(1) the relationship of magnetomotive force to flux density as defined by hysteresis curves of magnetic bodies, and (2) Faraday's Law applied to magnetic bodies.

The "first principle," the relationship of magnetomotive force (amp-turns) to flux density, is used by the invention to establish a known induction level in a magnetic body (when the initial magnitude of the induction level is not known). Hysteresis curves are commonly used to show the relationship of magnetic flux density (the y axis, also referred to as "induction level") to magnetic field intensity (the x axis) for a particular magnetic material. For a reasonably uniform magnetic core that magnetically interacts with a winding made with N turns of conductive material, the magnetic field intensity within the magnetic core is fairly uniform and is proportional to the magnetomotive force (current magnitude times the number of winding turns). Since the number of winding turns is usually constant, the x-axis of the hysteresis curve may be scaled to be proportional to the magnitude of current in the winding. With this understanding, a hysteresis curve may be utilized directly to find the induction level associated with a particular current magnitude. Alternatively, the same hysteresis curve could be used to find the magnitude of current (in a winding) that is necessary to drive the magnetic core to a specific induction level, and the minimum amount of current required to drive the magnetic body into saturation.

The "second principle," Faraday's Law applied to magnetic bodies, basically defines how a magnetic flux changing with time is associated with an electromotive force. In simple form, Faraday's Law is often stated as:

$$emf = -d\Phi/dt \qquad \text{(equation no. 1)}$$

where "emf" is the electromotive force (voltage caused by a changing magnetic flux) associated with a defined closed path, and $-d\Phi/dt$ is the time rate of change of magnetic flux ($\Phi$) within the closed path. The minus sign is usually included to show that the emf tends to generate a current that reduces the change in flux in accordance with Lenz's law. However, the minus sign will be dropped for the remainder of this description so that a positive change in flux will be associated with a positive induced voltage. A constant of proportionality may be required, depending on the system of units used.

As used herein, the term "induced voltage" is intended to refer to voltages generated by a changing flux in accordance with Faraday's Law.

When applied to a winding with N turns positioned around a magnetic body, Faraday's Law may be modified to yield (with the minus sign dropped):

$$V = N(d\Phi/dt) \qquad \text{(equation no. 2)}$$

where V is the induced voltage (time-varying or constant) across the winding. Now, with the assumption (and limitation) that the induction level (magnetic flux density) within a magnetic body is reasonably uniform, then induction level "B" and magnetic body cross-sectional area "A" are related to flux $\Phi$ by the simple equation:

$$\Phi = AB \qquad \text{(equation no. 3)}$$

Combining equation no. 2 with equation no. 3 yields:

$$V = NA(dB/dt) \qquad \text{(equation no. 4)}$$

Equation no. 4 shows that induced voltage V is proportional to the rate of change of induction level B. Taking the integral of both sides of equation no. 4 yields:

$$\int V dt = NA\Delta B \qquad \text{(equation no. 5)}$$

which shows how a change in induction level B is related to the integral over time of induced voltage V. The left side of equation no. 5 will be referred to herein as a "volt-time integral." Equation no. 5 clearly shows how the integral over time of induced voltage correlates to changes of induction level. The constant of proportionality (NA) will vary depending on the system of units utilized.

Equation no. 4 and equation no. 5 are two different ways of viewing the same relationship between induced voltage and a changing induction level. This disclosure will treat these two viewpoints as equivalent, and will reference whichever one is most readily applied in a given situation. Both equations show how induced voltage may be controlled to bring about desired changes of induction level.

The "volt-time integral" of the second principle leads to the concept that a particular "volt-time value" is associated with the change of induction level in a magnetic body from one induction level to another induction level. For example, the volt-time integral of voltage induced in a winding by a change of induction level from saturation to zero will always have the same value regardless of how many steps are involved or how long it takes. Likewise, a change between any other two levels of induction will also be associated with a volt-time value that is not dependent on the sequence used to cause the change. For the sake of this description, let "Q" designate the "volt-time value" associated with the volt-time integral calculated for a change in induction level from a first induction level $B_2$ to a second induction level $B_2$. Equation no. 5 may then be written as:

$$Q = \int V dt = NA(B_2 - B_1) \quad \text{(equation no. 6)}$$

The units of this "volt-time value" will usually be volt-seconds, though other units are possible, of course.

Of particular interest is the volt-time value associated with a change in induction level from a "known" induction level to an induction level near zero, as this is key to using the second principle to demagnetize a magnetic body. If the induction level is known, a volt-time value associated with a change to zero may be calculated. Alternatively, if a volt-time value associated with a change to zero is known, the actual induction level may be calculated. More specifically, let "$Q_0$" designate a volt-time value associated with a change from an induction level $B_1$ to an induction level of zero ($B_2=0$). Then the relationship between volt-time value $Q_0$ and induction level $B_1$ may be expressed mathematically as:

$$Q_0 = -NAB_1 \quad \text{(equation no. 7)}$$

or $$B_1 = -Q_0/(NA) \quad \text{(equation no. 8)}$$

If a volt-time value $Q_0$ is determined for a particular induction level, and if the cross-sectional area and number of winding turns are known, equation no. 8 may be used to determine the actual induction level in customary units. However, in many demagnetizing applications, it is often sufficient to merely quantify $Q_0$ in a general sense in order to facilitate a transition to an induction level of zero. For example, the induction level may be "known" only in a very general sense by knowing something about $Q_0$, such as knowing the time period associated with a repeatable voltage that causes a transition between two opposite induction levels (the specific volt-time value of the voltage wave not being necessary for operation). This situation is illustrated by FIGS. 8B and 12A and the description of those figures.

The magnitude of the volt-time value associated with a change of induction level from saturation to zero is normally constant for a particular magnetic body and winding combination. This constant value will be a positive number (the polarity of saturation is not included) designated "$Q_C$" and will be referred to herein as a magnetic body's "volt-time constant." This value may be calculated based on magnetic body and winding parameters, or may be determined by trial and adjustment. Alternatively, the "volt-time constant" may be determined automatically as described below under "Preferred Sequences."

In addition to utilizing the second principle to change between two induction levels as described above, the second principle also may be utilized to maintain a preferred induction level in a magnetic body. Considering equation no. 5, if the integral of induced voltage over a particular period of time is zero, the final induction level must be the same as the beginning induction level. Thus, even though an induction level may be fluctuating and causing a nonzero induced voltage, as long as the integral of induced voltage over time does not exceed a predetermined value, the preferred induction level will be maintained within acceptable limits.

A less stringent requirement (relating to maintaining a preferred induction level) would be to require the average value (rather than the integral) of induced voltage over time to be near zero. Since average value may be determined by calculating an integral over a time period and dividing by the time period, as the time period becomes large the average value may be near zero while the integral may deviate significantly from zero. Thus, by merely requiring that the average value of induced voltage be near zero, a preferred induction level is prevented from changing quickly, but given sufficient time the induction level may drift away from the preferred induction level.

Still referring to equation no. 5, it is clear that there can be no change in induction level without an induced voltage. Therefore, a preferred induction level may be more strictly maintained if the induced voltage is caused to be continuously very near zero volts, in which case the induction level can change only very slowly, and only if the integral of induced voltage increases over time. This concept can be utilized to strictly maintain a preferred induction level in a magnetic body. Since some applications of magnetic bodies are adversely affected by a fluctuating induction level, this concept may be used to advantage to reduce the amount that the induction level fluctuates. As already mentioned, current transformers are one such application. The accuracy of a current transformer may be improved by reducing induction level fluctuation and associated magnetizing current required for operation.

The second principle may also be used to cause the induction level of a magnetic body to vary in a preferred manner. Given a control signal that is proportional to a reference induction level that is a function of time, the induced voltage may be controlled so that the integral over time of induced voltage is proportional to control signal changes (per equation no. 5). Equivalently, the induced voltage may be controlled to be proportional to the derivative of the control signal (per equation no. 4). By selecting an appropriate constant of proportionality, the induction level may be controlled so as to match the reference induction level.

Feedback Control

Many applications will benefit from, some form of feedback control method. For these applications the control method utilized may include a form of Proportional plus Integral plus Derivative (P.I.D.) control, or other control scheme such as fuzzy logic. These feedback control schemes, and others, are well established in the prior art, so they will not be discussed in detail herein. The particular control parameters will depend on the specific application.

Figure 25:
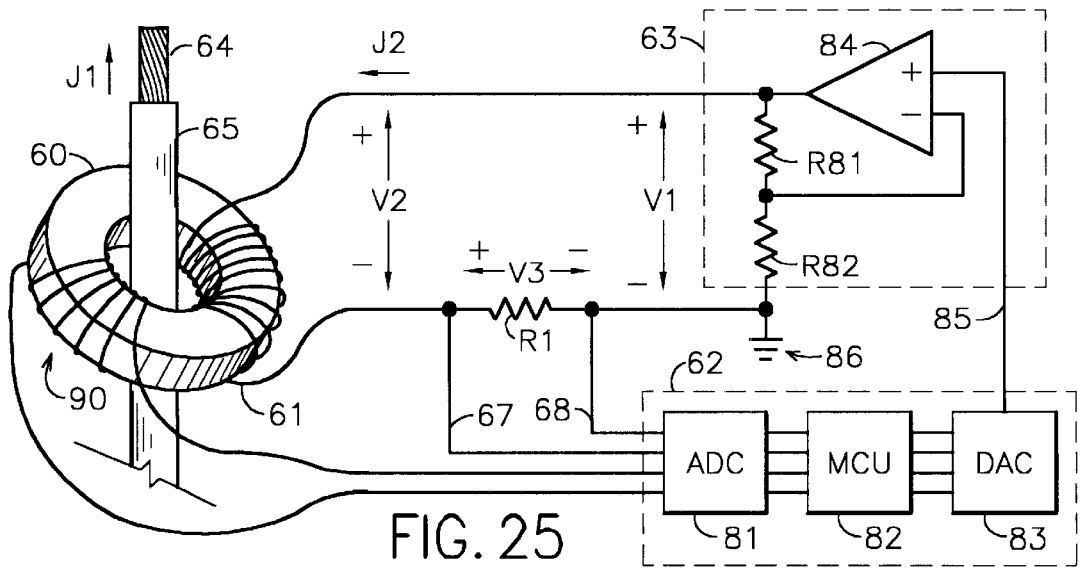

Since the voltage that is measurable across a winding may differ considerably from the induced voltage, other means of determining induced voltage are necessary for some feedback control applications. Induced voltage may be calculated or estimated from various types of information signals related to induced voltage. The voltage that is normally measurable across a winding is usually the sum of both induced voltage and a voltage drop caused by current flowing through stray impedances associated with the winding. The voltage drop may be determined utilizing known characteristics of stray impedances and characteristics of current flowing in the winding. In some cases only the voltage drop caused by the stray resistance of the winding may need to be considered, in which case the voltage drop is directly proportional to current. Some embodiments may utilize a dedicated sensing winding in which the current is kept very small, and the voltage measured across the winding is then almost precisely proportional to the induced voltage (such a dedicated sensing winding is illustrated in FIGS. 25 and 27). The following list summarizes some possible alternatives for generating an information signal related to induced voltage:

(a) Winding voltage may be measured directly and may be considered to be approximately the same as the induced voltage. This approach ignores the voltage drop associated with current flowing through stray winding impedances.

(b) A dedicated sensing winding may be utilized, in which current is very small. Induced voltage of the main winding is approximately equal to the voltage measured across the dedicated sensing winding multiplied by a constant.

(c) For current transformer applications (and other applications with similar winding and circuit configurations) in which the total burden of the secondary circuit is primarily resistive, the induced voltage magnitude is approximately equal to the current magnitude times the total loop resistance (total loop resistance is the sum of all resistances through which secondary current flows). Often, current is measured as a voltage across a current-sensing resistor, and the induced voltage may be calculated simply as the measured voltage multiplied by a constant. If an active voltage source is added in series with this resistive secondary circuit (in accordance with the present invention), then induced voltage may be calculated as the voltage generated by the active voltage source minus the measured voltage times a constant. (Using this approach, induced voltage may be reduced to near zero volts simply by causing an active voltage source to provide an output voltage that is approximately equal to the measured voltage times an appropriate constant, the constant required being approximately equal to the total loop resistance divided by the resistance of the current-sensing resistor; see FIG. 23).

Figure 28:
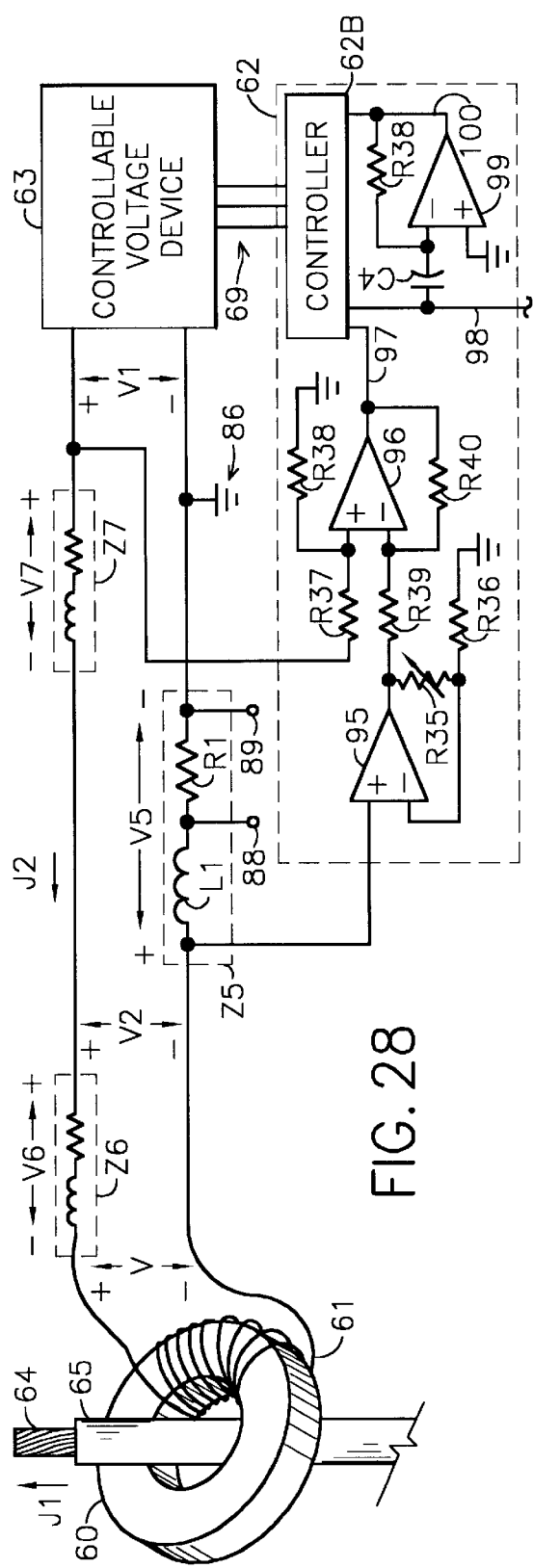
FIG. 28 shows an embodiment configured to accurately calculate induced voltage V using analog calculation means. The calculation method shown takes into account the effect of various circuit impedances and stray winding impedances. The calculated induced voltage is configured as a feedback signal, thereby enabling the induction level to be controlled to closely follow a variable control signal.

(d) Generalizing the previous approach, a complex sensing impedance (a current-sensing impedance comprising resistive and reactive components) may be used in place of a current-sensing resistor. Similar to a current-sensing resistor, winding current flows through the sensing impedance resulting in a voltage across the sensing impedance that is directly related to the current flowing in the winding. The voltage across the sensing impedance may be measured, and (for many circuit configurations) the induced voltage may be calculated from the measured voltage and known circuit parameters. For example, if the impedance angle of the sensing impedance (the ratio of the reactive component to the resistive component) is made approximately equal to the impedance angle of total loop impedance (total loop impedance includes stray impedances and all other impedance elements through which winding current flows), then the voltage measured across the sensing impedance is proportional to the voltage drop caused by current flowing through the total loop impedance. Then instantaneous induced voltage may be calculated as the instantaneous sum of any voltage sources in the loop minus the measured voltage times a constant. FIG. 28 illustrates one embodiment that uses this method to calculate induced voltage. (Using this approach, induced voltage may be reduced to near zero volts in some applications simply by causing an active voltage source to provide an output voltage that is approximately equal to the measured voltage times an appropriate constant, the constant required being approximately the magnitude of the total loop impedance divided by the magnitude of the sensing impedance; see FIG. 24).

Figure 29:
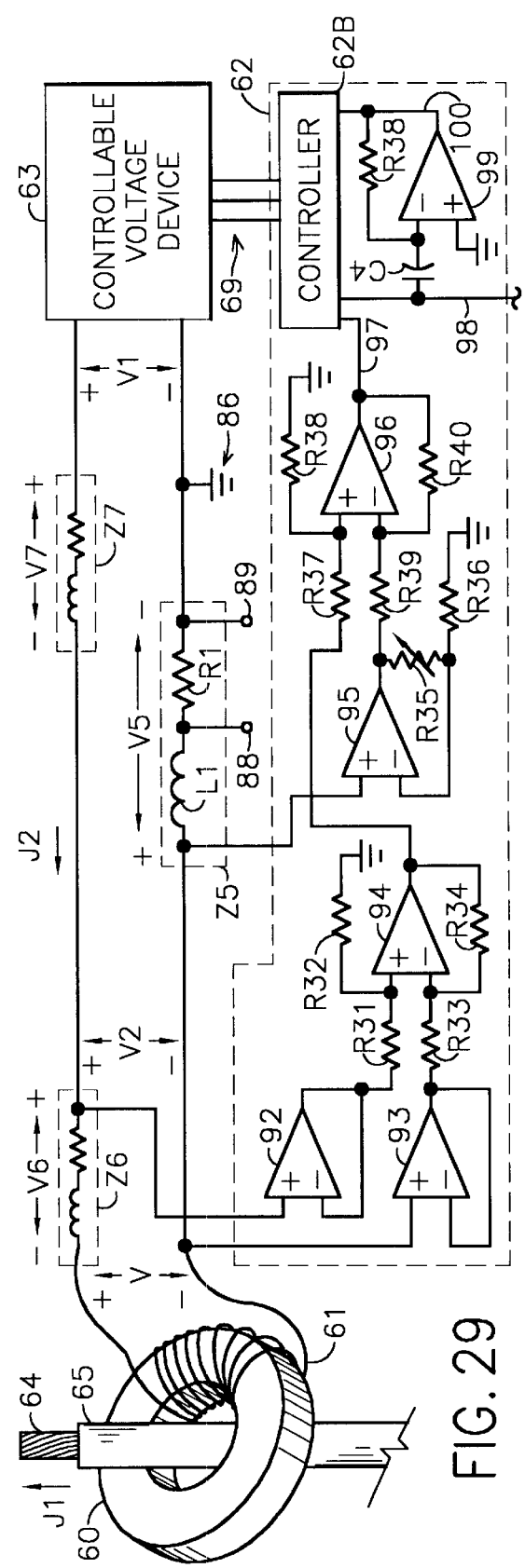
FIG. 29 is a variation of FIG. 28 showing one way that measured winding voltage may be utilized to calculate induced voltage.

(e) Building further on the previous approaches, in addition to measuring the voltage across a sensing impedance, the winding voltage may also be measured. The voltage across the impedance may be used to estimate the voltage drop associated with stray winding impedances. Then the induced voltage is simply the measured winding voltage minus the voltage drop so calculated. This approach is simplified by making the impedance angle of the sensing impedance approximately equal to the impedance angle of the stray winding impedances, in which case the instantaneous voltage across the sensing impedance is proportional to the instantaneous voltage drop associated with the stray winding impedances. This voltage drop is calculable as the instantaneous voltage measured across the sensing impedance multiplied by a constant. FIG. 29 illustrates one embodiment that uses this method to calculate induced voltage.

(f) Building still further on the previous approaches, current may be measured utilizing any prior art sensing means, and voltage drop across impedances may be calculated based on characteristics of current flowing in the winding and known characteristics of the impedances. Induced voltage may be calculated by subtracting the voltage drop associated with all loop impedances from the sum of any voltage sources in the loop. If a voltage in the loop is measured (such as the voltage across the winding), then only the voltage drop of impedances between the measured voltage and the induced voltage need to be accounted for (such as the voltage drop associated with stray winding impedances). If there are no voltage sources in the loop, then the characteristics of current flowing in the winding and known impedance characteristics are often sufficient to calculate induced voltage.

Generally speaking, approaches (c), (d), (e), and (f) all utilize a parameter related to current flowing in the winding to calculate induced voltage. This "parameter related to current" may be the current magnitude itself, or a parameter that is directly related to current, such as the voltage across a resistor (or, more generally, an impedance) through which the current flows. The parameter related to current is generally a function of time, since the current is a function of time. Induced voltage is calculable from the measured "parameter related to current" along with known impedance parameters and a known voltage related to winding voltage (when one or more voltage sources are in the loop). It should be noted that the voltage related to winding voltage does not necessarily need to be measured, as it may be a voltage that is known because it is a known output of a voltage device with known output characteristics. The term "voltage-determining means" is intended to cover both ways of determining the voltage, by measurement or by known output characteristics. If there is no voltage source in the loop, then a "voltage determining means" is not required, and induced voltage may be determined from only the measured "parameter related to current" and known impedance characteristics.

Feedback control systems generally require some form of calculating means in the feedback path. Common P.I.D. control methods may be implemented using analog or digital calculating means, or a combination of both. Fuzzy logic methods generally are more suited to digital methods. Analog and digital calculating means are well established in the prior art, so they will not be discussed in detail herein.

The above methods of determining a voltage induced in a winding are not limited to windings that are magnetically coupled to a magnetic body, but may be used with any winding that encloses a changing magnetic flux.

For simplicity of illustration, much of the description herein assumes that voltage drops associated with stray winding impedances are small enough to be ignored (this is usually the case when describing how the invention establishes a preferred induction level in a magnetic body, but is not usually the case when describing how the invention maintains a preferred induction level or reduces the amount that the induction level fluctuates).

The drawings and the accompanying description provide some examples of simple feedback control methods that may be utilized.

Clarifications

Throughout this disclosure, the term "magnetic body" is used in a general sense to refer to a mass of magnetic material. The term "magnetic material" refers to material that has a relative permeability significantly greater than a value of one. The term "magnetic core" or simply "core" is intended to refer to a magnetic body that is in a particular spatial relationship to one or more current-carrying conductors. The term "induction level" is intended to be synonymous with magnetic flux density.

While windings utilized throughout industry are most commonly made of copper or aluminum conductors, it should be understood that the present invention is not limited to standard types of windings. Windings of widely varying form made of almost any kind of conductive material may be utilized, including superconducting materials and semiconducting materials.

The term "impedance" is used in a general sense and includes devices or components having nonzero resistance or reactance (or a combination of the two), and includes devices with linear and nonlinear characteristics.

Unless winding current is kept very small, the voltage measurable across a winding differs from the induced voltage by an amount that depends on characteristics of winding current and characteristics of stray winding impedances. Strictly speaking, the voltage used in equations 2, 4, 5, 6, 9 and 10 is the induced voltage (rather than the measurable voltage across a winding) (equations 9 and 10 are below). However, for simplicity of illustration, much of the description herein assumes that voltage drops associated with stray winding impedances are negligible.

Stray impedances associated with a winding may be defined to include not only the effects of conductor resistance and stray inductance, but may also be defined to include the effects of eddy currents, core losses and other imperfections associated with a particular core/winding combination. Stated another way, the stray impedances of a winding may be defined in whatever way results in the most accurate control of induced voltage (induced voltage being understood to be approximately calculable as the voltage measurable across a winding minus a voltage drop associated with winding current flowing through stray winding impedances). This issue is most applicable to embodiments of the invention that utilize a feedback signal that is derived from winding current. Different applications of the invention may find it advantageous to define stray impedances differently in order to optimize each application. It is not the intention of this disclosure to restrict the term "stray impedances" to a firm definition.

The term "feedback signal" refers to an information signal that is part of a feedback control system.

The term "current-sensing" is used herein in a broad sense to refer not only to means of deriving information about a current, but also to refer to more direct uses, such as means of actuating a control mechanism based on current characteristics (such as a calibrated solenoid-type actuator that may be part of a protective relay).

As used herein, the phrase "known induction level" is intended to be synonymous with "determinate induction level." Both phrases are used in a broad sense of having some kind of data that quantifies the state of magnetic flux density (induction level) in any way that can be used to implement the "second principle" (Faraday's Law applied to magnetic bodies) to move the induction level to a preferred induction level. For example, the induction level is considered to be "known" (or "determinate") if the approximate volt-time value (equation no. 6) that is associated with a change of induction level to zero is known. In the case of repeatable voltages being utilized, the induction level is also considered to be "known" if the time period required to change the induction level to near zero is known.

A parameter that is said to be a "function of time" is a parameter that may vary with time, even though the parameter may be constant for a period of time. As used herein, the term "varying voltage" is intended to refer in general to a voltage that is a function of time. While relatively constant voltages are utilized at times in the preferred embodiments, it should be understood that non-constant voltages could also be used, and the term "varying voltage" is intended to include both possibilities. Also, the term "waveform" is intended to mean the geometrical shape of a quantity when displayed as a function of time. The term "alternating" (as applied to current or voltage) is intended to indicate that the polarity changes between positive and negative values, without necessarily implying a consistent repeating waveform. A "half-cycle" of an "alternating" waveform refers to a part of the waveform continuously having the same polarity.

Although some of the preferred embodiments of the invention utilize a controllable active "voltage source" to produce "varying voltages," in more general terms a controllable "electric energy source" may be utilized, meaning an active source that is able to generate suitable voltages and currents, while not necessarily being configured as a voltage source (the term "voltage source" usually indicates an electric energy source having output voltage that is relatively unaffected by current magnitude). However, from a practical point of view, since the invention primarily involves the control of induced voltage rather than current (in accordance with the second principle), a voltage source is usually the preferred form of electric energy source. Even so, the use of "voltage sources" in the preferred embodiments is not intended to restrict the invention from being embodied with other types of electric energy sources.

When utilizing an active voltage source, the output should be current-limited to an appropriate value to ensure safe current levels during brief time periods that the magnetic bodies may be saturated.

Preferred Sequences

When the initial magnitude of the induction level is not known, the preferred embodiment utilizes two sequential phases to establish a preferred induction level in a magnetic body. For purposes of this description these two phases will be called the "first phase" and the "second phase." The first phase primarily utilizes the "first principle" (the hysteresis-curve relationship of magnetomotive force to flux density) to establish a known induction level. The "second phase" utilizes the "second principle" (Faraday's Law applied to magnetic bodies) to change the induction level to a preferred induction level. Each of these two phases may involve several steps or just a single step, depending on the preferred operation for a particular application. For applications in which the initial magnitude of the induction level is known, only the second phase is required to establish a preferred induction level (though the first phase may still be utilized). Once a preferred induction level is established, a "third phase" may be applicable, during which the varying voltage may be turned off, or used to maintain the preferred induction level, or otherwise utilized depending on the particular application.

Establishing a known induction level during the first phase (utilizing the "first principle") may be done in several ways:

(a) Provide a current of sufficient magnitude to drive the magnetic body to saturation, in which case the induction level is known to be the saturation induction level of the magnetic body.

(b) Provide a current that is not sufficient to saturate the magnetic material, and utilize known hysteresis-curve characteristics to determine the induction level of the magnetic body. Accuracy may be improved by cycling the current between opposite polarities once to remove the effects of any initial magnetization.

(c) Provide a current that alternates between positive and negative values and determine a "volt-time value" from the resulting voltage waveform. This "volt-time value" may be combined with known geometries of the magnetic body and winding to determine the actual peak induction level (per equation no. 8 above), or it may be utilized directly by the second phase to reduce the induction level to zero. In the case that the current is sufficiently large to drive the magnetic body to saturation, the "volt-time value" determined in this way has the same magnitude as the "volt-time constant" previously defined. The first phase ends (and the second phase begins) with the induction level at a peak induction magnitude.

(d) Provide a declining alternating current (in accordance with prior art methods) to demagnetize the magnetic body.

These four methods will be referred to herein as "first-phase method a," "first-phase method b," "first-phase method c" and "first-phase method d."

"First-phase method c" (applying an alternating current and determining a volt-time value) may be utilized without having advance knowledge about the properties of the magnetic body.

After a known induction level is reached by the first phase, the second phase starts, changing the known induction level to the preferred induction level (utilizing the second principle). This also may be done in several ways. However, all of these ways are constrained by the second principle to provide a voltage for a period of time such that the volt-time integral of induced voltage corresponds to the volt-time value necessary to change the, induction level from the known induction level to the preferred induction level. Three ways to do this are:

(a) Provide voltage all of one polarity for a period of time such that the volt-time integral approximately equals the volt-time value.

(b) Provide a first voltage and a second voltage of opposite polarities; the first voltage having such magnitude, duration and polarity so as to cause the induction level of the magnetic body to transition to and pass the preferred induction level; the second voltage having such magnitude, duration and polarity so as to cause the induction level of the magnetic body to transition to the preferred induction level. (The first voltage and second voltage may be referred to herein as a "first-step voltage" and "second-step voltage" respectively).

(c) Provide a voltage made up of several sequential voltage pulses of varying form, magnitude, duration, and polarity; the integral of this induced voltage over the second-phase time period being approximately equal to the volt-time value.

These three methods will be referred to herein as "second-phase method a," "second-phase method b" and "second-phase method c."

"Second-phase method b" is an improvement over "second-phase method a" because the second voltage (with opposite polarity as the first voltage) can improve accuracy by eliminating a small d-c offset current that may be present after the first voltage. After a first voltage (of method a or b), there is a small current flowing that has a magnitude roughly corresponding to the coercive force of the magnetic body. This small current may adversely affect the magnetic state of the magnetic core at the end of the demagnetizing sequence. The second voltage used in method b is intended to eliminate this "coercive force error."

"Second-phase method c" is intended to cover all possibilities not covered by methods "a" and "b." This includes alternating voltage pulses with declining volt-time values, which may also be used to eliminate any "coercive force error" (similar to method "b," but with more than two pulses).

"First-phase method c" will now be described in more detail.

The "volt-time constant" for a particular magnetic body and winding may be automatically determined by first providing a current (or by providing a voltage that causes current to flow) that drives the magnetic body to saturation at one end of its hysteresis curve, and then transitioning to a current of opposite polarity that drives the magnetic body to saturation at the other end of its hysteresis curve. The induced voltage associated with the transition from the first saturation level to the second saturation level is integrated over the time period of the transition. The calculated result is then divided by two to obtain the "volt-time constant" (if the result is negative, the minus sign is dropped). For improved accuracy the effects of stray impedances may be taken into account, the induced voltage being calculable as the voltage across the winding minus a voltage drop associated with current flowing through stray winding impedances. However, the effect of stray impedances may often be neglected with suitable results. Alternatively, a separate dedicated sensing winding used just for measuring induced voltage may be utilized, with current in this second winding kept near zero to avoid the effects of stray impedances.

A simplified method may be used to determine the volt-time constant. As before, a current (or a voltage that causes current to flow) is first applied that drives the magnetic body to saturation at one end of its hysteresis curve. Then, during the transition to a current with opposite polarity, the voltage is held relatively constant. Then it is necessary only to determine the length of time required to go from the first saturation level to the opposite saturation level. The "volt-time constant" is then one half of the transition time period multiplied by the voltage applied. The onset of saturation may be determined by sensing a sudden change in current or voltage. This method is easily implemented by using a current-limited voltage source to provide the necessary currents and voltages. This method is described more fully in the description of FIGS. 7 and 8A to 8D.

An automatic sequence to determine the volt-time constant can be included at the beginning of a demagnetizing sequence. For permanently-installed equipment the automatic sequence can be done once or periodically as an automatic calibration sequence.

A similar automatic method may be utilized to determine a volt-time value and associated known induction level regardless of whether current magnitudes are adequate to drive a magnetic body to saturation. To do this, an alternating current may be provided (or an alternating voltage that causes an alternating current to flow), with positive and negative peak current magnitudes that are approximately equal. This alternating current is associated with an alternating induced voltage across the winding. The alternating current and alternating induced voltage are related by the properties of the magnetic core and winding. The alternating current causes the flux in the magnetic body to change direction once every cycle. The peak induction levels occur at the beginning and end of each positive and negative half-cycle of the alternating induced voltage. The magnitude of the peak induction level in the magnetic body may be determined by determining the volt-time integral of a positive or negative half-cycle of the alternating induced voltage. The result is a volt-time value associated with a change between the two opposite peak induction levels. By dividing this value by two, a volt-time value is obtained that corresponds to a change in induction level from an induction level of zero to the ending peak induction level. Adding a minus sign will change the result to the proper polarity for use by the second phase in returning the induction level to zero. Mathematically, this is, merely using equation no. 6, with the integral being taken over an entire single positive or negative half-cycle, and with the understanding that the beginning and ending induction levels are equal and opposite:

$$Q = \int V dt = NA(B_2 - B_1) \quad \text{(equation no. 9)}$$

Since $B_1$ is equal to $-B_2$, and since for the situation described $Q_0 = -\frac{1}{2}Q$, equation no. 9 may be reduced to:

$$Q_0 = -\frac{1}{2} \int V dt = -NAB_2 \quad \text{(equation no. 10)}$$

With the clarification again that the integral of equation no. 10 is taken over an entire positive or negative half-cycle of induced voltage, equation no. 10 shows how the peak induction level ($B_2$) caused by a steady-state alternating current is related to the associated alternating induced voltage. This relationship may be used as part of a first phase to establish a "known" induction level.

Equation no. 10 is also applicable to the second phase, showing that the volt-time value used by the second phase to establish an induction level of zero should equal half of the volt-time integral of a half-cycle of alternating induced voltage. Stated another way, it shows that the induction level may be reduced to near zero by allowing the alternating induced voltage to continue approximately half way into the next half-cycle (assuming the alternating induced voltage has a consistent repeating waveform).

In order to use "first-phase method c" with good accuracy, two conditions should be met. First, the peak magnitudes of the alternating current should be sufficiently large so that the flux in the magnetic body is caused to change direction once each cycle. This is another way of saying that the current must be sufficiently large to overcome the coercive force of the magnetic body so as to cause an alternating flux. Second, the positive and negative current peaks should cause opposite peak induction levels that are approximately equal (though of opposite direction). If positive and negative current peaks both have sufficient magnitude to drive the magnetic body to saturation, then the peak current magnitudes do not need to be equal. However, if positive and negative current peaks are not adequate to drive the magnetic body to saturation, then it is necessary that the magnitude of the positive and negative current peaks be approximately equal so that opposite peak induction levels are approximately equal.

If peak current levels are not sufficient to drive the magnetic body to saturation, it is helpful to cycle the current between opposite peak magnitudes once to eliminate the effect of any initial magnetization (before cycling the current between opposite current peaks to determine the volt-time integral of a transition between peak induction levels). In the case of a sinusoidal alternating voltage source being utilized to drive the required alternating current, with voltage magnitude and frequency such that the magnetic body is not driven to saturation at each end of its hysteresis curve, numerous cycles may be required after the voltage is applied to allow transient d-c current to decay so that opposite peak current magnitudes are approximately equal.

"First-phase method c" is described more in the later description of FIGS. 7, 8A to 8D, 10, 11, and 12A to 12C.

Current Transformer Considerations

Current monitoring devices that incorporate the demagnetizing aspect of the invention and use standard current transformers will usually utilize two modes of operation sequentially:

(1) A first mode (also called a "demagnetizing mode"), during which the current transformer is demagnetized (utilizing the first and second phases discussed previously).

(2) A second mode (also called a "current-sensing mode"), during which current transformer secondary current is proportional to primary current (this may be considered to be a "third phase").

Once demagnetized, the current transformer may become magnetized again due to the same problems that magnetized it in the first place. For this reason, preferred operation may sequence between the demagnetizing mode and the current-sensing mode. The demagnetizing aspect of the invention is best suited for applications that do not require strict continuous sensing of every cycle of current, so that brief time periods are available for use with the demagnetizing mode. (In applications in which it is desirable to sense current continuously without using demagnetizing control, current transformer accuracy may still be improved by reducing the amount that the induction level fluctuates during current-sensing operation).

In a-c power system applications that derive operating power from the current transformer secondary current, three modes of operation may function sequentially (rather than just two modes as previously discussed):

(1) A power supply charging mode, during which the current transformer may become magnetized.

(2) A demagnetizing mode, during which the current transformer is demagnetized.

(3) A current-sensing mode, during which current transformer secondary current is accurately proportional to primary current.

In some applications it may be advantageous for secondary current to be sensed during the first two modes, even though current transformer accuracy is not as good during these modes.

In implementing the "first principle" with a current transformer that is in service, it should be kept in mind that the magnetomotive force (mmf) applied to the magnetic core is the sum of the mmf of the primary current and the secondary current. These two mmfts are usually of opposite polarity and largely cancel each other during normal current transformer operation. These two mmf s do not normally cancel each other during the demagnetizing mode of the invention. (For example, when utilizing an adjustable impedance, the "first phase" may force the secondary current to zero so that the magnetomotive force of the entire primary current is available to force the magnetic core into saturation).

When used with a-c power systems, the demagnetizing mode may utilize an adjustable impedance, connected to the current transformer secondary winding and in series with current transformer secondary current. A suitable control circuit sets the adjustable impedance to control the induced voltage of the secondary winding. This secondary winding voltage influences the magnetic induction level of the current transformer core in accordance with the "first principle" and "second principle" previously discussed. The induced voltage of the secondary winding is a function of the secondary current and the impedance of the secondary circuit in accordance with Ohm's law. The adjustable impedance may have linear or nonlinear characteristics. The preferred embodiment of the adjustable impedance utilizes zener diodes to yield strongly nonlinear characteristics. These strongly nonlinear characteristics facilitate operation by providing relatively constant secondary winding voltage levels that are largely independent of secondary current magnitudes.

A controllable electric energy source may also be utilized to demagnetize a current transformer, in which case a standard current transformer may be used to sense d-c current (with or without an a-c component). The secondary current flowing after a demagnetizing cycle will be an accurate reproduction of the d-c primary current for a limited time period following each demagnetization cycle. The duration of this time period is dependent on current transformer parameters and the magnitude and waveform of induced voltage during the current-sensing cycle.

During the current-sensing mode, the induced voltage of the secondary winding should be kept as small as practical for best accuracy and to help prevent the current transformer from becoming magnetized again. To better understand operation in current-sensing mode, it should be kept in mind that induced voltage in a current transformer secondary winding is proportional to the rate of change of the induction level in the magnetic core. The fluctuating induction level is generally associated with a fluctuating magnetizing current. The magnetizing current is a primary source of error in the secondary current. If the induced voltage is reduced, then fluctuations in induction level and magnetizing current will be reduced, and accuracy will be improved. FIGS. 20 to 29 illustrate the principles involved in maintaining a current transformer at an induction level near zero and reducing induction level fluctuations. Of course, these methods are not limited to current transformer applications, and similar methods may be utilized to maintain a preferred induction level other than zero.

Figure 15:
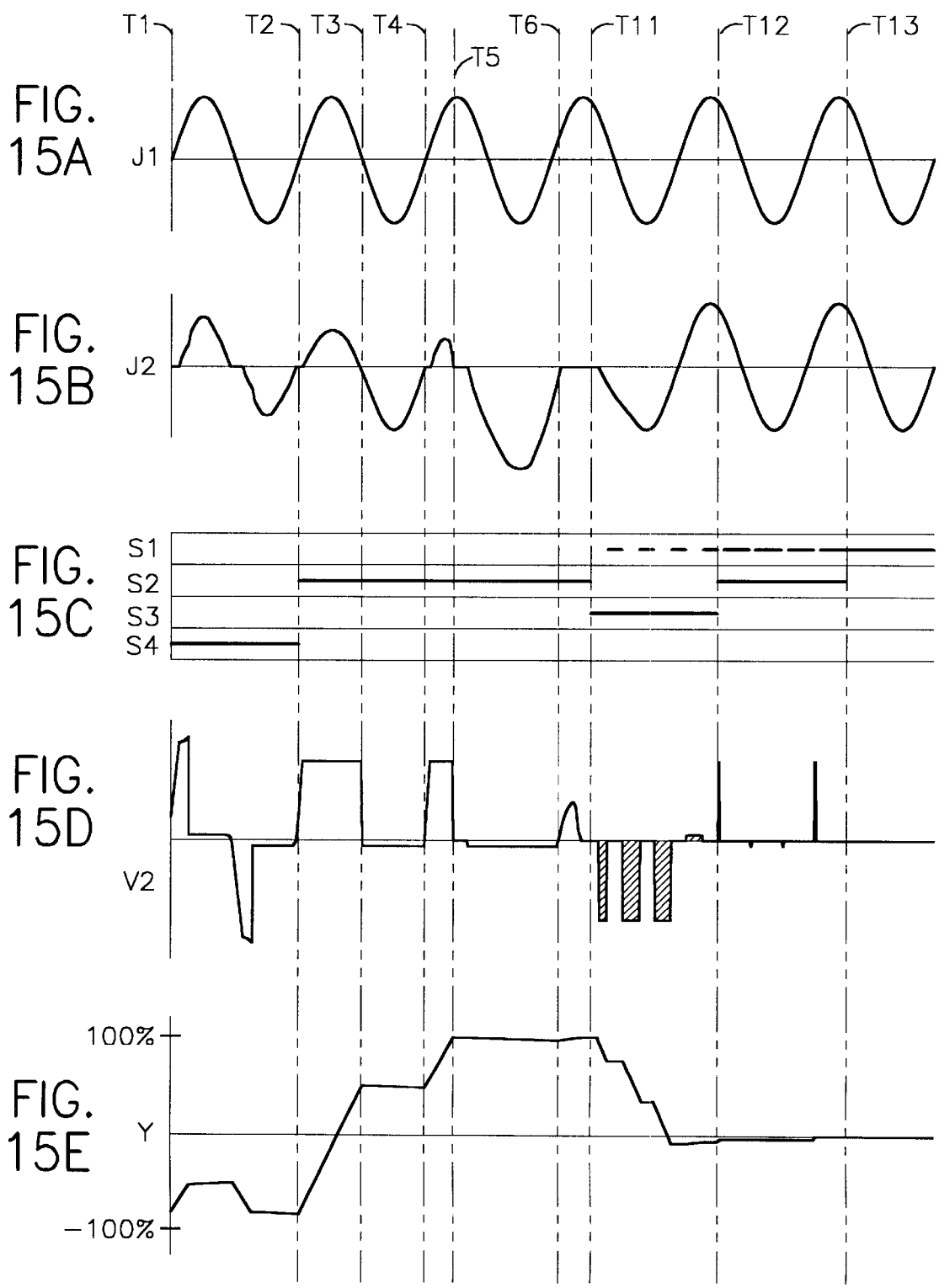

In the case of unsymmetrical primary currents, the induction level of the current transformer will drift toward saturation if the induced voltage of the secondary winding is not somehow made to have an average value of zero (during the current-sensing mode). When an adjustable impedance is utilized with unsymmetrical currents, the induced voltage may be made to have an average value close to zero by causing the adjustable impedance to vary in such a way as to balance average magnitudes of positive and negative half-cycles of induced voltage. This will extend the length of time that secondary current is an accurate representation of primary current before another demagnetizing sequence is required. This may be done by causing the adjustable impedance to have an average value that is greater for current flowing in one direction than the other. The half-cycle of current with lowest average value should pass through an impedance that has a higher average value in order to produce an induced voltage with an average value that matches the average value of induced voltage caused by current with opposite polarity. Pulse-width modulating techniques may be used to adjust the average value of a fixed switchable impedance element (similar to the control method described later for FIGS. 15C and 15D between times T11 and T13). When an active energy source is used to generate varying voltages, the voltage generated during the current-sensing mode may be controlled in a similar way so that the induced voltage of the secondary winding has an average value near zero.

DETAILED DESCRIPTION OF THE DRAWINGS

FIG. 1 illustrates the general concept by showing a magnetic body 60, a winding 61 wrapped around the magnetic body, and a controllable voltage device 63 with a suitable control circuit 62. Magnetic body 60 and winding 61 are shown in a typical current transformer configuration with the magnetic body around an electric power system conductor 64 with an insulating covering 65. Power system conductor 64 functions as a primary winding with only one turn, with a primary current J1 flowing. Though shown with one end disconnected, power system conductor 64 is normally connected as part of an electric power system.

Controllable voltage device 63 may be an active voltage source (or, more generally, a controllable electric energy source), in which case a primary winding is not required. In this case, power system conductor 64 (acting as a primary winding) may be omitted. Resistor R1 may be a current-sensing resistor, or it may represent the internal resistance of voltage device 63, or it may be a current-limiting resistor. Some applications may find it advantageous to replace resistor R1 with a complex impedance. Resistor R1 may be omitted for many applications.

As shown in FIG. 1, winding 61, voltage device 63, and resistor R1 are connected in series, so that current J2 flows through each of them.

If another source of magnetic excitation is available (such as current flowing in a primary winding), then controllable voltage device 63 may be an adjustable impedance. In the case of a current transformer in service, resistor R is usually included as a current-sensing resistor with a low value of resistance, and controllable voltage device 63 may be an adjustable impedance rather than an active voltage source. Often, current is sensed by a larger monitoring system as voltage V3 across resistor R1, since this voltage is proportional to current J2.

Winding 61 is shown with ten turns around magnetic body 60. The actual number of turns may vary widely depending on the application. Magnetic body 60 is shown as a toroid, though wide variation in magnetic body configurations is possible and the illustration is not intended to limit the breadth of application of the invention.

Control circuit 62 is shown with three high-impedance voltage-sensing inputs (connected to conductors 66, 67, and 68) to enable sensing of voltage V1, voltage V2, and voltage V3. Voltage V3 across resistor R1 is proportional to current J2. Voltage V2 is the voltage across winding 61, which is the induced voltage generated by changing flux in magnetic body 60 plus any voltage drop associated with current J2 flowing through stray winding impedances. Often, the voltage drop associated with current J2 flowing through stray winding impedances is small compared to the induced voltage and may be ignored in some applications. Voltage V1 is the output voltage of controllable voltage device 63.

Voltage-sensing conductors 66, 67 and 68 are not required for the simplest embodiments of the invention, but are included to clarify the general concept. Alternatively, other means of sensing current and/or voltages may be utilized, as may be preferred for different embodiments.

Several control conductors 69 act as an interface between control circuit 62 and controllable voltage device 63. The actual interface between control circuit 62 and controllable voltage device 63 may vary widely depending on the particular design. Control circuit 62 may be constructed utilizing prior art, with the control sequences being in accordance with the present invention. In the case that controllable voltage device 63 is an active voltage source, it also may be constructed utilizing prior art, with the control sequences being in accordance with the present invention.

In the example of FIG. 1, magnetic body 60 provides a closed magnetic path with no need for other magnetic components.

Figure 2:
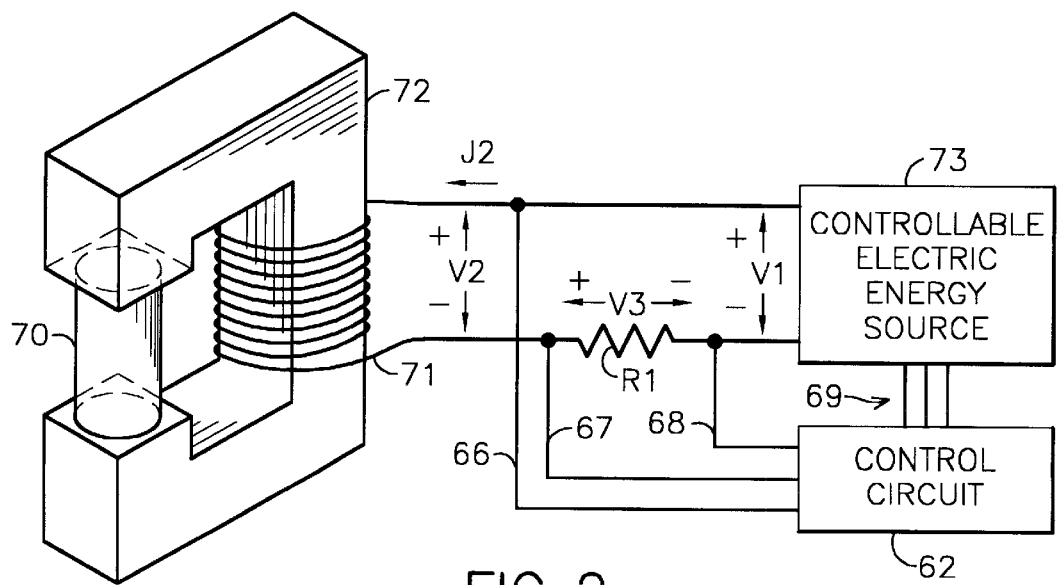

FIG. 2 shows an alternate configuration, in which a cylindrical magnetic body 70 does not provide a closed magnetic path by itself. Instead, a closed magnetic path is provided by additional magnetic material 72. For best operation, magnetic material 72 should be configured to have greater saturation flux capacity than magnetic body 70, so that the saturation characteristics of magnetic body 70 dominate the resulting magnetic circuit characteristics. One way this may be done is by configuring magnetic material 72 to have a greater cross-sectional area than magnetic body 70.

Since the configuration shown in FIG. 2 does not have a primary winding (or other source of magnetic excitation), controllable voltage device 63 (shown in FIG. 1) is now shown as a controllable electric energy source 73. A winding 71 is wrapped around magnetic material 72. As in FIG. 1, resistor R1 may be a current-sensing resistor, or it may represent the internal resistance of electric energy source 73, or it may be a current-limiting resistor. Some applications may find it advantageous to replace resistor R1 with a complex impedance. Resistor R1 may be omitted for many applications.

It should be noted that an additional winding (connected to a power source able to provide a suitable alternating current) could be added to either magnetic material 72 or magnetic body 70, in which case an adjustable impedance could be substituted for energy source 73, similar to the configuration of FIG. 1.

FIGS. 3 and 4A to 4D illustrate how a magnetic body may be demagnetized utilizing "first-phase method a" and "second-phase method b" previously discussed.

FIG. 3 is a hysteresis curve that clarifies one way that the induction level of a magnetic body is controlled by the invention. These changes correlate to the waveforms shown in FIGS. 4A to 4D. The horizontal axis X of FIG. 3 is proportional to magnetomotive force (ampere-turns), and the vertical axis Y is proportional to the induction level (magnetic flux density) of the magnetic body. Magnetization of the magnetic body increases as the operating point moves away from axis X. A magnetic material with a relatively square hysteresis curve has purposely been chosen, as this simplifies the demagnetizing operation.

The induction level of a magnetic body begins at a random magnetized state shown as point A of FIG. 3. The "first phase" moves the induction level to saturation near point B. The "second phase" shown includes two steps. A "first step" moves the induction-level somewhat passed an induction level of zero to point C. A "second step" moves the induction level to near zero at point D.

FIGS. 4A to 4D show one method of controlling voltages and currents to demagnetize a magnetic body by using the sequence shown in FIG. 3. The waveforms shown in FIGS. 4A to 4D are applicable to the configuration shown in FIG. 2, or to FIG. 1 when controllable voltage device 63 is an active voltage source and primary conductor 64 is either disconnected or omitted. The waveforms shown in FIGS. 4A to 4D correlate to the sequential changes of induction level shown in FIG. 3. Voltage V2 shown in FIG. 4B is the induced voltage across the winding, with any voltage drop associated with current flowing through stray winding impedances assumed to be negligible for the present discussion.

FIG. 4D shows how the induction level varies with time. The vertical axis represents induction level, and is scaled similar to the vertical axis of the hysteresis curve of FIG. 3.

Referring to FIGS. 1, 3 and 4A to 4D, at time T41 the "first phase" of the demagnetizing cycle begins when voltage V1 is driven from zero volts to a positive value by controllable voltage device 63 as controlled by control circuit 62. This positive voltage causes the induction level of magnetic body 60 to transition from point A of FIG. 3 to saturation at point B. Saturation begins at about time T42 when current J2 suddenly increases as shown in FIG. 4C. The transition point is also marked by voltage V2 suddenly decreasing, as shown by FIG. 4B. At time T43 the "first step" of the second phase begins when the polarity of voltage V1 is reversed and the induction level of magnetic body 60 begins a transition from point B of FIG. 3 to point C. In the example shown, control circuit 62 controls the time period of the first step in order to change the induction level by an amount somewhat greater than change Y1, stopping at point C at time T44. At time T44 an optional "second step" begins when the polarity of voltage V1 is reversed again and the induction level of magnetic body 60 begins a transition from point C of FIG. 3 to point D. At time T45 the second step ends when voltage V1 is changed to zero volts, and magnetic body 60 is left in a demagnetized state at point D (at an induction level near zero). Change Y1 correlates to the "volt-time constant" previously discussed.

If the optional "second step" of the second phase was not included between times T44 and T45 of FIGS. 4A to 4D, then a small d-c current would continue flowing after time T44, with a natural decay rate determined mostly by inductance associated with magnetic body 60 and the resistance of winding 61 and resistor R1. The final state of magnetic body 60 after this decay will also be an induction level near zero (at or near point D) as long as point C is close to an induction level of zero. Ideally, with or without the second step, point C of FIG. 3 should be at a point from which the natural decay of d-c current (without the second-step voltage) will leave the magnetic body at an induction level of zero. This naturally decaying d-c current flowing through resistance provides an uncontrolled second-step voltage that should be considered in volt-time calculations for the first step.

As indicated previously regarding the second phase, the voltage and time periods associated with the first step and second step should be controlled such that the volt-time integral of voltage V2 is the same as the "volt-time constant"

of magnetic body 60 and winding 61. Referring to FIG. 4B, the volt-time constant (of magnetic body 60 and winding 61) is related to areas A1 and A2 (with the hatched areas calculated in units of volt-time). More specifically, area A1 minus area A2 should be the same as the volt-time constant. For the sequence shown in FIG. 3 and FIGS. 4A to 4D, the appropriate value of the volt-time constant is predetermined, and control circuit 62 is configured beforehand to control voltage device 63 in the manner illustrated to effectively demagnetize magnetic body 60.

FIG. 5 and FIGS. 6A to 6D illustrate the same sequence as FIG. 3 and FIGS. 4A to 4D, except that the preferred induction level is not zero. In the example shown in FIG. 5 and FIGS. 6A to 6D the preferred induction level is 50% of saturation on the positive side of the hysteresis curve. In this case, the invention functions as a means to magnetize a magnetic body to a preferred induction level (rather than as a demagnetizing means). The waveforms shown in FIGS. 6A to 6D are applicable to the configuration shown in FIG. 2, or to FIG. 1 when controllable voltage device 63 is an active voltage source and primary conductor 64 is either disconnected or omitted. The waveforms shown in FIGS. 6A to 6D correlate to the sequential changes of induction level shown in FIG. 5.

The sequence shown in FIG. 5 is the same as FIG. 3, except that in FIG. 5 the transition to sequence step C only changes the induction level by an amount slightly greater than change Y2. This change moves the induction level somewhat past +50%, and the transition to sequence step D then leaves the final induction level at about 50% of saturation. The smaller change in FIG. 5 corresponds to a smaller area A4 in FIG. 6B (compared to area A1 of FIG. 4B). Change Y2 corresponds to the volt-time value of a change in induction level from +100% to +50%, which correlates to the volt-time value of area A4 minus area A5 of FIG. 6B. Times T46 and T47 are included for ease of reference, and indicate the end of the first and second steps of the second phase.

While the subsequent figures and description focus mostly on the demagnetizing function of the invention, it should be noted that the sequences required to establish a non-zero so preferred induction level are almost the same as the sequences utilized to establish an induction level near zero. The principles and embodiments discussed below are not intended to be limited only to the demagnetizing function of the invention.

Simple embodiments of control circuit 62 (FIGS. 1 and 2) can be configured to apply predetermined voltages for predetermined time periods without provision to monitor voltages or current (in this case voltage-sensing conductors 66, 67, and 68 are not used). The control sequence shown in FIGS. 4A to 4D and FIGS. 6A to 6D may be easily implemented in this manner. In more complex embodiments of control circuit 62, voltages and currents may be sensed to verify proper operation and determine optimum voltage and timing parameters. For example, voltage V2 may be numerically integrated over time to determine optimum transitional times. FIG. 7 and FIGS. 8A to 8D illustrate one way of utilizing voltage-sensing or current-sensing to automatically determine the "volt-time constant" of a particular magnetic body and winding at the beginning of a demagnetizing sequence.

FIGS. 7 and 8A to 8D illustrate "first-phase method c" and "second-phase method b" previously discussed. The waveforms shown in FIGS. 8A to 8D are applicable to the configuration shown in FIG. 2, or to FIG. 1 when controllable voltage device 63 is an active voltage source and primary conductor 64 is either disconnected or omitted. The waveforms shown in FIGS. 8A to 8D correlate to the sequential changes of induction level shown in FIG. 7.

Figure 7:
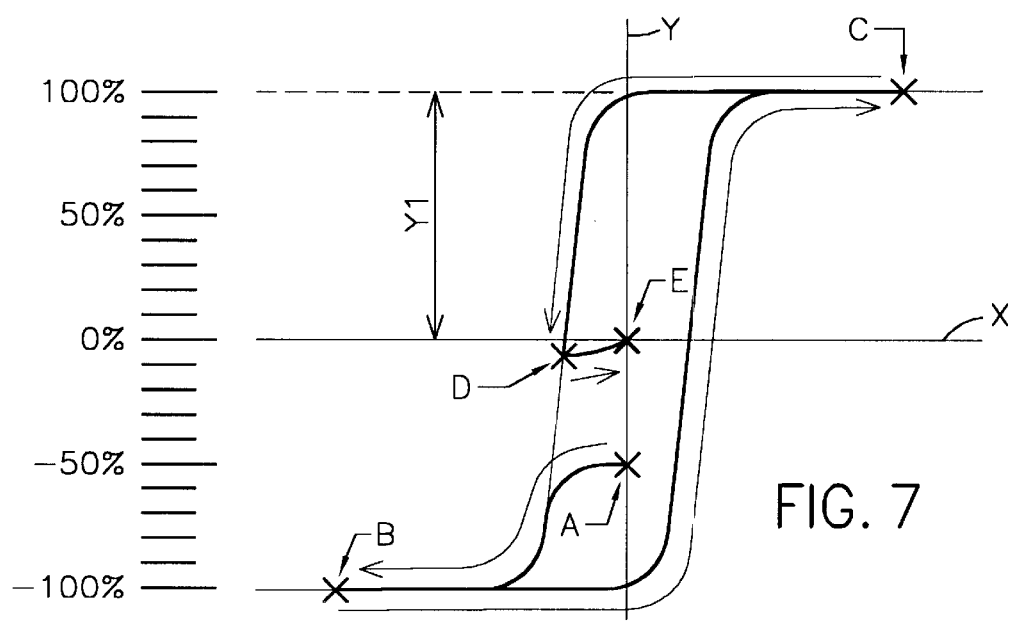

FIG. 7 shows a hysteresis curve sequence that can be used to automatically determine the volt-time constant of a magnetic body and winding and then demagnetize the magnetic body. FIGS. 8A to 8D show how an alternating voltage and current may be used to implement the sequence shown in FIG. 7.

Figure 8A:
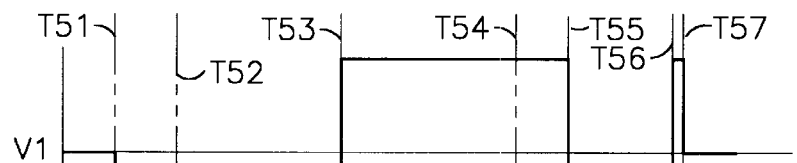
FIGS. 8A to 8D show one method of controlling voltages and currents to automatically determine demagnetizing parameters and demagnetize a magnetic body utilizing the hysteresis curve sequence shown in FIG. 7.
Figure 8B:
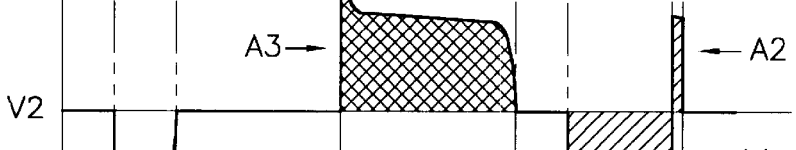
Figure 8C:
Figure 8D:
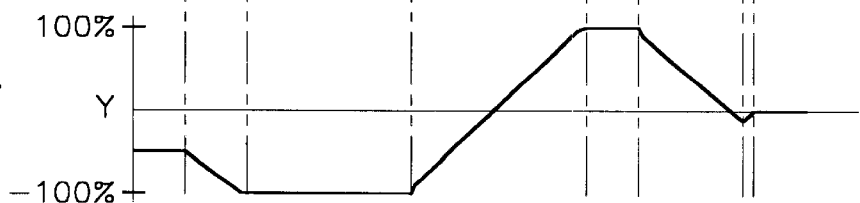

In FIG. 8A, voltage V1 (the output voltage of voltage device 63) between times T53 and T57 is the same as in FIG. 4A between times T41 and T45. In FIG. 8A, however, voltage V1 begins the demagnetizing cycle with a negative polarity between times T51 and T53. This initial negative voltage moves the induction level from an unknown level shown as point A on the hysteresis curve of FIG. 7 to saturation at point B of FIG. 7. Saturation near point B is reached at about time T52. At time T53 of FIG. 8A voltage V1 changes to positive polarity and drives the induction level toward point C of FIG. 7. Starting at time T53, control circuit 62 monitors either voltage V2 or current J2 to determine when saturation is reached. Saturation is reached at time T54, which corresponds to saturation near point C of FIG. 7. The volt-time constant of the magnetic body may be determined by calculating the volt-time integral of voltage V2 between times T53 and T54 (this calculation determines the volt-time area shown as crosshatched area A3) and dividing the result by two. During the second phase (the transition from point C to point D and point E of FIG. 7) voltage V2 is then controlled so that the volt-time integral from time T55 to time T57 has the same magnitude as the calculated volt-time constant. Another way of saying this is that voltage V2 is controlled during the second phase so that area A1 minus area A2 is half of area A3. Time T56 indicates the transition point between the first and second step of the second phase.

For improved accuracy, the effect of winding resistance and current on voltage V2 may be automatically compensated for by the control circuit automatically determining winding resistance and calculating the volt-time integrals using corrected voltage. The winding resistance may be calculated as voltage V2 divided by current J2 between times T52 and T53 while the magnetic body is in saturation. Corrected voltage (induced voltage) is then calculated as voltage V2 minus (current J2 multiplied by winding resistance). Alternatively, total loop resistance may be calculated as voltage V1 divided by current J2 (between times T52 and T53), and induced voltage may then be calculated as voltage V1 minus current J2 multiplied by total loop resistance.

Still referring to FIGS. 8A to 8D, a simplified approach would be to consider voltage V2 to be relatively constant between time T53 and T54 (roughly equal to voltage V1). Let the elapsed time between time T53 and time T54 be called "delta time." Then the volt-time constant can be calculated approximately as the magnitude of voltage V1 multiplied by "delta time" and divided by two. If the first-phase voltage is relatively constant, and the second-phase voltages are relatively constant and have the same magnitude as the first-phase voltage. (but not necessarily the same polarity), then the volt-time constant does not need to be calculated directly. Since voltage magnitudes are the same, only the time periods of the second-phase first and second steps need to be calculated. In this case, the first-step voltage (between times T55 and T56) should be applied for a time period that is slightly more than half of "delta time"

(for example: 53% as long as "delta time"). The second-step voltage (between times T56 and T57) should last for a relatively short period of time as required to compensate for the time period of the first-step voltage that was in excess of half of "delta time" (for example: 53%−50%=3% as long as "delta time").

FIGS. 8A to 8D illustrate one way that an alternating current and an associated alternating voltage can be used to determine induction level and related demagnetizing parameters. The sequence shown utilizes a current sufficiently large to drive the magnetic body to saturation, so only one cycle of alternating current is required. The first half-cycle of current (time T51 to T53) takes the magnetic body to saturation, and then the volt-time integral of one half-cycle of alternating voltage is calculated (from time T53 to time T54 or T55) as the current transitions from the first peak to a peak of opposite polarity. The volt-time constant is determined by dividing the value of this volt-time integral by two. Peak induction level may then be calculated using equation no. 8 (above).

As previously discussed under "Preferred Sequences," A similar alternating-current and alternating-voltage method may be used in the event that peak current magnitudes are not sufficient to drive the magnetic body to saturation. However, instead of calculating the "volt-time constant," a "volt-time value" is calculated that is related to peak induction level by equation no. 8. See the description for FIGS. 10, 11 and 12 for an example.

Figure 9:
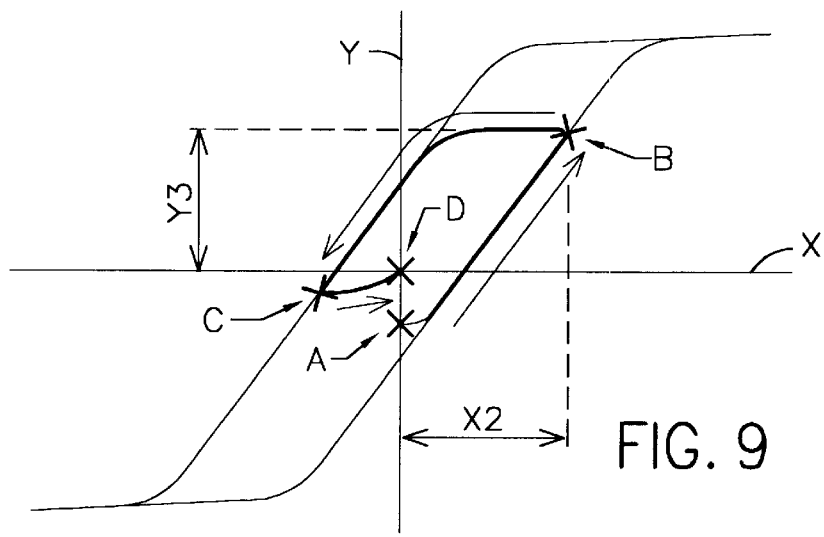

FIG. 9 illustrates how a magnetic body may be demagnetized utilizing "first-phase method b" and "second-phase method b" previously discussed.

FIG. 9 shows operation with a not-so-square hysteresis curve assumed for a magnetic body. Operation shown is similar to that described for FIG. 3 except that now current may not be large enough to drive the magnetic body to saturation. Similar to FIG. 3, horizontal axis X is proportional to magnetomotive force (ampere-turns), and vertical axis Y is proportional to the induction level (magnetic flux density) of the magnetic body. Magnetization of the magnetic body increases as the operating point moves away from axis X.

Referring to FIG. 9, when the demagnetizing mode begins, the induction level of a magnetic body generally is not known. This corresponds to a randomly chosen point A on the hysteresis curve of FIG. 9. The "first phase" of the demagnetizing cycle causes a current to flow with peak magnitude corresponding to magnetomotive force X2. This causes a transition to point B, with an induction level of Y3 (which is not at saturation). Induction level Y3 may be calculated based on peak current and known characteristics of the magnetic body (in accordance with the "first principle"). The degree of accuracy obtainable in determining induction level Y3 is somewhat dependent on the initial induction level, the magnitude of magnetomotive force X2, and the actual hysteresis characteristics of the magnetic body. Accuracy may be improved by cycling the current between opposite polarities once to remove the effects of an initial magnetization. During the "second phase," a first voltage is applied to the winding for a time period such that the induction level of the magnetic body transitions from point B to point C (in accordance with the "second principle"). A second voltage of the opposite polarity is then applied for a time period such that the induction level of the magnetic body transitions to point D. At point D, the magnetic body is demagnetized.

FIGS. 10, 11 and 12A to 12C illustrate "first-phase method c" and "second-phase method b" previously discussed.

Figure 10:
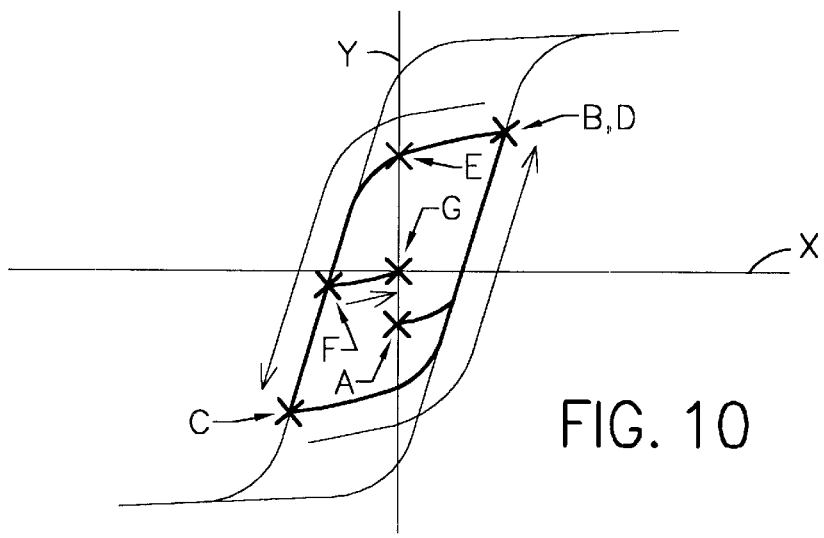

FIG. 10 shows a method to demagnetize a magnetic body regardless of whether current is adequate to drive the magnetic body to saturation. Again, sequence point A is assumed for a starting point. In order to be certain that the magnetic core is not originally magnetized to a level higher than the induction level attainable during the "first phase," at least one cycle of an alternating current is first applied. This forces the magnetic core first to point B, then down to point C, cycling (almost) once around its hysteresis loop, thereby removing the effects of the initial induction level. Then, the current is made to alternate again to drive the induction level back to point D, but this time the induced voltage of the winding is integrated over the time required for the transition, and a "volt-time value" is calculated from this to determine the magnitude and duration of a voltage pulse that will move the induction level from point D to point F. The following "second phase" uses the "volt-time value" just calculated to move the induction level from point D (through point E) to point F and then to point G, which is close to an induction level of zero. Point E is the zero-crossing point of current.

Figure 11:
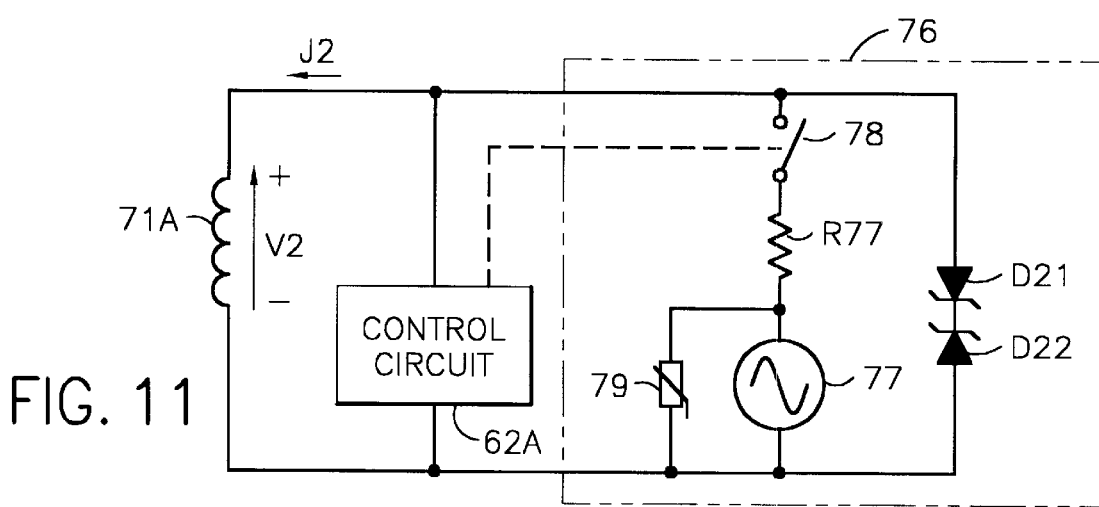
Figure 14:
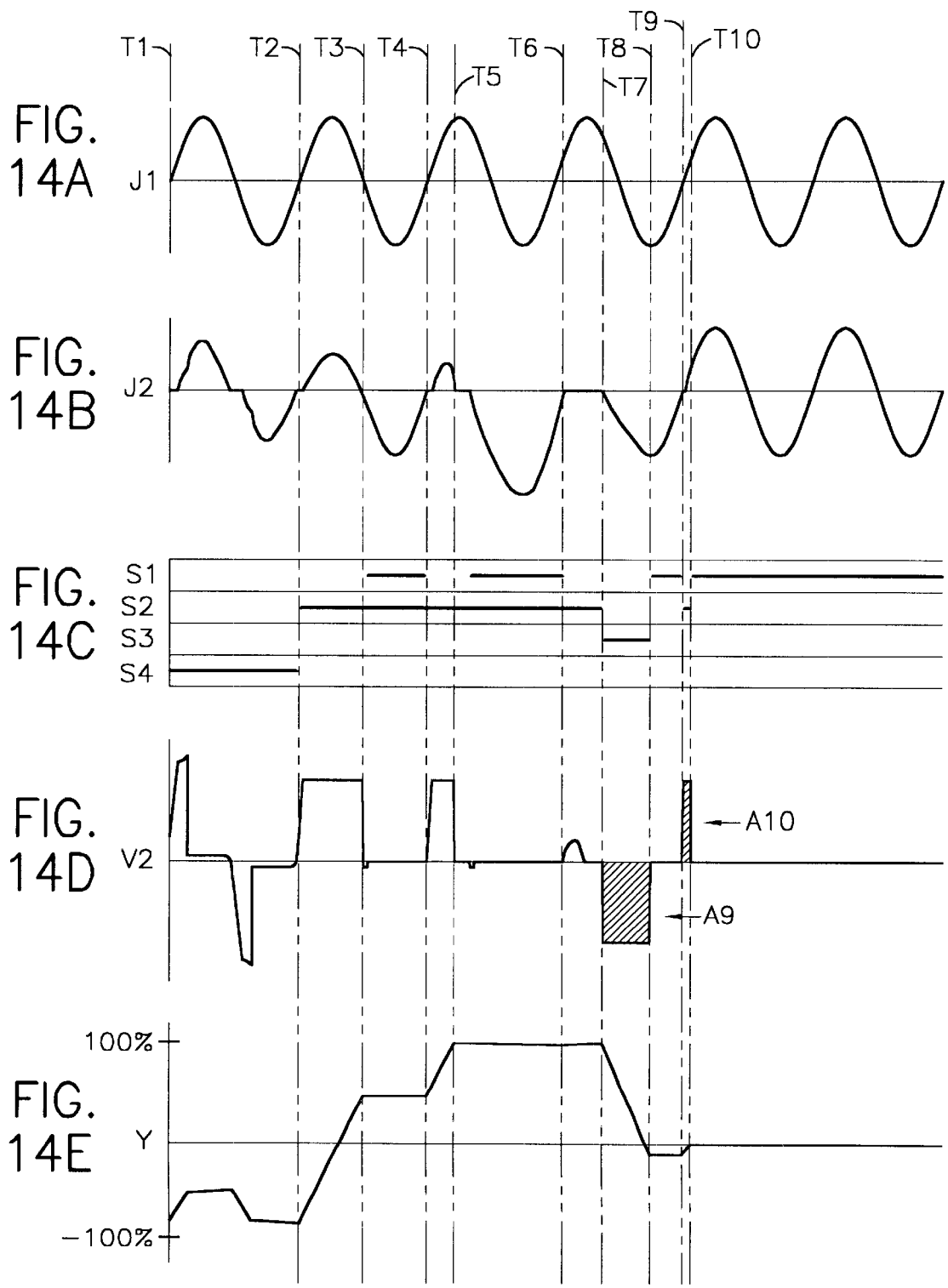

FIG. 11 shows a relatively simple embodiment of the invention utilizing a controllable electric energy source 76. A winding 71A conducts current J2 and interacts with a magnetic body (not shown). The winding may be similar to windings 61 and 71 of FIGS. 1 and 2. The magnetic body (not shown) may be similar to either magnetic body 60 or 70 of FIGS. 1 and 2. A switch 78 is used to connect and disconnect an alternating voltage source 77 to winding 71A. Switch 78 will preferably be a solid-state electronic switch able to stop current flow mid-cycle. Alternating voltage source 77 may simply be a source of 50 Hertz or 60 Hertz electric power with suitable voltage magnitude, providing a consistent repeating waveform that causes induced voltage V2 to have a consistent repeating waveform. An optional resistor R77 may be included to limit peak current levels. An optional varistor 79, or other transient voltage suppression device may be included to limit transient voltages when switch 78 is opened. A control circuit 62A senses voltage V2 and controls switch 78. Zener diodes D21 and D22 have breakover voltages somewhat higher than the peak voltage of alternating voltage source 77, and are configured to limit transient voltages when switch 78 is opened. Zener diodes D21 and D22 may be omitted, in which case switch 78 should be configured to be to able to absorb the high momentary voltage associated with stopping current J2 very quickly. Alternatively, almost any kind of surge suppressor or impedance could be used in place of the zener diodes, but zener diodes are shown for ease of illustration and explanation. One simple method of operation is illustrated by FIGS. 12A to 12C.

FIGS. 12A to 12C show one way that the configuration shown in FIG. 11 may utilize an alternating voltage and current to implement a sequence similar to the hysteresis curve sequence of FIG. 10. FIG. 12A shows voltage V2, which (prior to time T74) is merely the sinusoidal voltage generated by alternating voltage source 77 (less any voltage drop across resistor R77). FIG. 12B shows current J2, which is not quite sinusoidal due to hysteresis characteristics of the magnetic body. FIG. 12C shows induction level. Switch 78 (FIG. 11) is closed prior to time T71, and any transient d-c offset currents that may be associated with closing switch 78 have already decayed prior to time T71.

Refer now to FIGS. 10, 11, and 12A to 12C. Between times T71 and T72 the operation is in a steady-state alternating cycle. At time T72 the induction level is at a positive peak (FIG. 12C), corresponding to sequence point D of FIG.

10. The induction level then declines to an induction level corresponding to point F at time T74, at which time switch 78 is opened by control circuit 62A. A negative current is flowing at time T74, and this. current is forced to flow through zener diodes D21 and D22 after switch 78 opens (the current keeps flowing due to the inductive nature of winding 71A). This causes a positive voltage pulse between times T74 and T75 with area A8 (FIG. 12A), which is associated with a transition from point F to point G of FIG. 10, at which point current J2 has declined to zero and the induction level is near zero.

Similar to area A3 of FIG. 8B being twice the volt-time constant, area A6 of FIG. 12A is twice the volt-time value associated with a change in induction level from the peak induction level to an induction level near zero. The actual peak induction level may be calculated from the volt-time value using equation no. 8 (above). For optimum demagnetizing operation, the timing of the opening of switch 78 should be such that area A7 minus area A8 equals half of area A6.

Referring to FIG. 12A, time T74 (the point of time that switch 78 is opened) should be somewhat past the geometric middle of the half-cycle for best results. However, the demagnetizing operation will be satisfactory for many applications if the switch is simply opened near the geometric middle of the half-cycle. "Geometric middle of the half-cycle" is intended to mean the point of time at which the volt-time integral of the half-cycle would be divided into two equal parts (visually this would be the time at which area A7 would be exactly half of area A6).

Referring still to FIGS. 10 through 12C, preferred induction levels other than zero may be established by opening switch 78 at other points of time during the same half-cycle. Equation no. 6 shows how a volt-time value may be calculated which may be used to determine the optimum point of time to open switch 78 to establish a preferred induction level. Opening switch 78 between times T73 and T74 will result in induction levels between point E and an induction level of zero, depending on the specific point of time that switch 78 is opened. Opening switch 78 after T74, but still during the same half-cycle, will result in induction levels with opposite polarity.

The waveforms shown in FIGS. 12A to 12C are waveforms typically associated with peak induction levels being less than saturation induction levels. In the case that the voltage magnitude of alternating voltage source 77 is sufficient to drive the magnetic body to saturation, the alternating waveforms shown prior to T74 may be considerably different than those shown, but the principles of operation are similar.

FIGS. 13 to 29 all illustrate how the invention may be applied to current transformers that are in service. The principles utilized, however, are applicable to other types of magnetic bodies as well. FIGS. 13 through 19 illustrate how an adjustable impedance may be utilized in a current transformer secondary circuit to demagnetize a current transformer. FIGS. 20 through 27 illustrate how an active voltage source may be utilized in a current transformer secondary circuit.

FIG. 13 shows a functional schematic illustrating how voltage device 63 of FIG. 1 may be embodied by an adjustable impedance, which is part of a current transformer demagnetizing circuit 1. Demagnetizing circuit 1 includes a control circuit 3 and an adjustable impedance 2 comprising electronic switches S1, S2 and S3 and zener diodes D1 and D2. Electronic switches S1, S2 and S3 are controlled by control circuit 3 as indicated by the dashed lines between switches S1, S2 and S3 and control circuit 3.

The configuration shown for adjustable impedance 2 is for illustration purposes only, and is not intended to define all possible configurations of the present invention. It may be noted that switch S1 is optional, since closing switches S2 and S3 at the same time approximates the effect of closing switch S1.

FIG. 13 shows a current transformer CT1 which may have a magnetic core similar to magnetic body 60 of FIG. 1 and a secondary winding similar to winding 61 of FIG. 1. Conductor 64 is a primary conductor conducting a primary current J1, also similar to FIG. 1. Current J1 is an alternating electric current flowing as part of a larger system. Current J1 causes secondary current J2 to flow by the transformer action of current transformer CT1. Current J2 is normally proportionally smaller than current J1 by the turns ratio of current transformer CT1. Under ideal conditions, the waveform of current J2 is virtually the same as the waveform of current J1.

Resistor R1 is a current-sensing resistor, connected in series with current J2, thereby producing a voltage signal across resistor R1 that is proportional to current J2. This voltage signal, conducted by conductor 15, is usually used as an input to some kind of current monitoring system as provided for by terminal 16. This voltage signal may also be used as an input to control circuit 3 as is presently shown. Other kinds of current-sensing means may be used in place of resistor R1.

A power supply 4 is configured to derive power from input current J2 whenever switch S4 is closed and switches S1, S2 and S3 are open. Power supply 4 and switch S4 are optional (switch S4 may be optional even if power supply 4 is included, depending on the configuration of power supply 4). If power is not derived from current J2, a separate source of power will usually be required to provide operating power to control circuit 3. Power is supplied to control circuit 3 via one or more conductors 13 and common conductor 11, the total number of power conductors being dependent on the specific design of control circuit 3 and power supply 4. Terminals 12 and 14 are included to provide for the possibility of power being transferred to or from other circuits.

Conductor 17 and terminal 18 provide for a control signal to or from a larger system to coordinate current-sensing and demagnetizing modes. A demagnetizing mode may be initiated by either control circuit 3 or the larger system. The specific function of this control interface will depend on the specific design of the overall system. It may be practical to omit this control interface in some applications. If power supply circuit 4 is included, the control interface may additionally provide for coordination of the power supply charging mode. More conductors and terminals may be provided for additional control signals depending on the specific design.

Voltage V2 is now the voltage across the secondary winding of current transformer CT1. This voltage is shown connected as an input to control circuit 3 via conductor 15 and conductor 19. For the present discussion, voltage V2 will be considered to be the induced voltage (the voltage drop associated with current flowing through stray winding impedances will be considered negligible).

Optional ground connection 10 provides a stable signal reference potential for common conductor 11.

FIGS. 14A to 14E illustrate the preferred operation of FIG. 13. The magnetic sequence utilized is similar to the sequence shown by the hysteresis curve of FIG. 3, utilizing "first-phase method a" and "second-phase method b" previously discussed. Three different operating modes are shown. First, from time T1 to time T2 the power supply charging mode is active. Second, from time T2 to time T10 the demagnetizing mode is active. Third, after time T10 the current-sensing mode is active. Actual test waveforms may vary somewhat from those shown depending on the specific power supply configuration, current transformer characteristics, and current magnitudes.

FIG. 14A shows current transformer CT1 primary current J1 as a simple sine wave for simplicity of illustration, though in many applications it may be considerably distorted. FIG. 14B shows secondary current J2. Current magnitudes have been normalized for simplicity of illustration. Current J2 is normally many times smaller than current J1, as influenced by the turns ratio of current transformer CT1. FIG. 14C shows operation of electronic switches S1, S2, S3 and S4 as controlled by control circuit 3. Dark lines indicate time periods during which each switch is closed. Blank spaces indicate time periods during which each switch is open. FIG. 14D shows secondary voltage V2. The voltage across resistor R1 is normally small compared to voltage V2, and no attempt has been made to show its minor influence on V2. FIG. 14E shows induction level with a scale similar to the hysteresis curve shown in FIG. 3.

The operating cycle illustrated in FIGS. 14A to 14E begins with the functional schematic of FIG. 13 being in the power supply charging mode. Between times T1 and T2, only switch S4 is closed, and power supply 4 is charging. The waveforms shown between time T1 and T2 are based on the assumption that power supply 4 has some kind of full-wave rectifier, a charging capacitor, and a voltage-limiting means. Actual test waveforms may vary depending on the power supply configuration, current transformer characteristics, and current magnitudes. The waveforms shown in FIGS. 14B and 14D between times T1 and T2 are discussed in detail in U.S. Pat. No. 6,018,700 for a "Self-Powered Current Monitor" to Thomas G. Edel, issued Jan. 25, 2000.

The first phase of the demagnetizing mode begins at time T2, a somewhat random point of time. The duration of the first phase lasts a predetermined time period that is adequate to drive the magnetic core to saturation as indicated by point B of FIG. 3. At time T2, switch S2 closes and switch S4 opens to set adjustable impedance 2 to the nonlinear characteristics of zener diode D1. This causes voltage V2 to be large and positive for current J2 with positive polarity, and small and negative for current J2 with negative polarity. The large positive voltage causes the induction level to transition to saturation. During this first phase, switch S1 is optionally closed between times T3 and T4 and between times T5 and T6 to minimize the magnitude of negative voltages that occur during negative half-cycles of current J2. Switch S1 is controlled during the first phase based on the polarity of current J2.

The predetermined minimum time required for the first phase ends sometime between times T5 and T7. After this time period ends, control circuit 3 looks for the beginning of a negative half-cycle of current J2 to begin the second phase.

The second phase of the demagnetizing mode begins at time T7 when control circuit 3 senses current J2 going negative. At time T7, switch S3 closes and switch S2 opens. This sets adjustable impedance 2 to the nonlinear characteristics of zener diode D2. This causes voltage V2 to be large and negative for current J2 with negative polarity, and small and positive for current J2 with positive polarity. At time T7 a first-step voltage pulse begins, the magnitude of which is the breakover voltage of zener diode D2. Control circuit 3 keeps switch S3 closed for a predetermined time period (until time T8) that correlates with the volt-time value associated with a transition from point B to point C of FIG. 3.

An optional second step voltage is implemented between times T9 and T10 by closing only switch S2, thereby causing the transition from point C to point D of FIG. 3.

The current-sensing mode begins at time T10 when switch S1 is closed, thereby allowing current to flow freely.

Operation without power supply 4 is similar, except that the initial power supply charging cycle will not be part of the sequence.

In FIG. 14D, voltage pulses between times T7 and T8 and between times T9 and T10 cause the induction level to transition from saturation to an induction level near zero. Area A9 minus area A10 should correspond to the volt-time constant of current transformer CT1. It is important that control circuit 3 be able to control adjustable impedance 2 so that the integral of voltage over time for each second-phase voltage pulse is a particular value for each particular type of current transformer. To facilitate this, it may be preferable to configure control circuit 3 to directly monitor voltage V2 via conductors 15 and 19 (as shown in FIG. 13). However, it will usually suffice to monitor only current J2 (via the voltage signal on conductor 15, the voltage across resistor R1), with the magnitude of voltage V2 known to be the applicable zener diode voltage drop, as determined by the status of the electronic switches (S1, S2, S3, S4) and the direction (polarity) of current J2. With this type of operation, the conductor 19 input connection to control circuit 3 may be eliminated, and voltage V2 is not an input to control circuit 3. Current J2 is then the only feedback signal to control circuit 3 used to accurately time voltage V2 reset pulses within particular half-cycles.

While it is preferable for control circuit 3 to have current J2 and/or voltage V2 as a feedback signal, it is possible for control circuit 3 to operate without any feedback signal. This could be accomplished by modifying the first-step voltage pulse of the second phase (between times T7 and T8 of FIG. 14D) in either of the following ways:

(a) The time period that zener diode D2 is active could be extended to one or more complete cycles, with the zener diode breakover voltage adjusted so that the net integral of voltage over time is the same as the previous value. Lengthening duration to one or more complete cycles in this way allows the switching to occur without regard to actual half-cycle time intervals. This method has the drawback that each kind of current transformer utilized may require different voltage magnitudes for the reset pulses.

(b) The negative voltage pulse could be split into several shorter intervals divided over one or more complete cycles. Spreading out the time that zener diode D2 is active over one or more complete cycles in this way allows the switching to occur without regard to actual half-cycle time intervals. This method of operation is illustrated by FIGS. 15A to 15E.

In both cases (a) and (b), control circuit 3 may operate without feedback signals related to secondary voltage V2 or secondary current J2.

FIGS. 15A to 15E illustrate how the functional schematic of FIG. 13 may be operated without a feedback signal.

From time T1 to T6, operation is similar to FIGS. 14A to 14E. At time T11, the second phase begins at a random time in the middle of a half-cycle when the first phase times out. Zener diode D2 is activated briefly several times over a time period one cycle in length (between times T11 and T12) to generate a voltage V2 waveform (FIG. 15D) such that the integral of the voltage over the time period between times T11 and T12 is approximately equal to that of FIG. 14D between times T7 and T8. Stated another way, zener diode D2 is made active with a pulse-width-modulated type of control (controlling switches S1 and S3) to cause voltage V2 to have an average negative value suitable for the first step of the second phase (between times T11 and T12). The demagnetizing effect of the multiple pulses shown in FIG. 15D (between times T11 and. T12) is similar to the single voltage pulse shown in FIG. 14D (between times T7 and T8).

At time T12 of FIGS. 15A to 15E, the optional second-step voltage begins. Similar to the first-step voltage between times T11 and T12, zener diode D1 is made active with a pulse-width-modulated type of control (controlling switches S1 and S2) to cause voltage V2 to have an average positive value suitable for the second step (between times T12 and T13). The effect of the multiple pulses shown in FIG. 15D (between times T12 and T13) is similar to the single voltage pulse shown in FIG. 14D (between times T9 and T10).

At time T13 of FIGS. 15A to 15E, the current-sensing mode begins.

FIG. 16 shows one possible embodiment of a current transformer demagnetizing circuit based on the functional schematic of FIG. 13. Components that are common to FIG. 13 function in the manner previously described. The demagnetizing circuit shown is incorporated into a current monitoring circuit that derives operating power from current transformer CT1 secondary current J2. The electronic switches previously shown in the functional schematic of FIG. 13 are now implemented with field-effect transistors. The preferred embodiment utilizes N-channel enhancement mode devices with low drain-source on resistance and sensitive gates for operation at logic voltage levels.

The power supply circuit includes a full wave bridge rectifier circuit consisting of diodes D5 and D6 and the drain-source diodes within field-effect transistors Q5 and Q6. The rectified current charges capacitor C1, which provides an unregulated voltage for use by a d-c to d-c converter circuit 23. Voltage across capacitor C1 is limited by the breakover voltage of zener diodes D11 and D12.

Resistor R1 is still a current-sensing resistor, but in this configuration current J2 flows through resistor R1 only when field-effect transistors Q5 and Q6 are actuated. Since the current through resistor R1 is not always the same as current J2, it is shown as current J3. Conductor 29 conducts a voltage signal that is proportional to the current through resistor R1. Resistor R2 and zener diodes D7 and D8 form an optional surge suppression network to protect an analog-to-digital converter circuit 22. The resistance of resistor R2 must be small compared to the input resistance of analog-to-digital converter circuit 22 so that accuracy of the voltage signal will not be adversely affected. Analog-to-digital converter circuit 22 and a microcontroller 21 function in a manner similar to control circuit 3 of FIG. 13. Data is communicated between analog-to-digital converter circuit 22 and microcontroller 21 via serial or parallel communication utilizing several conductors 35.

Zener diodes D11 and D12 function in a manner similar to zener diodes D1 and D2 of FIG. 13. Zener diodes D11 and D12 also act as voltage-limiting devices to limit the charge on power supply capacitor C1.

Field-effect transistors Q5 and Q6 perform the switching functions of switches S1, S2, and S3 of FIG. 13. Field-effect transistors Q5 and Q6 are individually controlled, with resistors R8 and R9 providing a discharge path for gate charge (these resistors may be optional depending on the configuration of microcontroller 21). Activating field-effect transistor Q6 is similar to closing switch S2 of FIG. 13. Activating field-effect transistor Q5 is similar to closing switch S3 of FIG. 13. Activating both field-effect transistors Q5 and Q6 is similar to closing switch S1 of FIG. 13. When both field-effect transistors Q5 and Q6 are deactivated the system is in the power supply charging mode and zener diodes D11 and D12 limit the voltage on capacitor C1.

The function of switch S4 in FIG. 13 is not required in the embodiment of FIG. 16, since the power supply is configured to automatically charge whenever the current-sensing mode and demagnetizing mode are not active.

The power supply may be eliminated if an alternate power source is available for control power. This may be done by removing diodes D5 and D6, Capacitor C1, and d-c to d-c converter circuit 23.

More than one current transformer (each normally having a unique primary current) may be connected to the configuration of FIG. 16 by duplicating the components within box 41 for each current transformer. These components may be connected to conductors 11A and 42, similar to the-configuration shown for current transformer CT1. Additional connections to analog-to-digital converter circuit 22 and microcontroller 21 will also be needed for each current transformer, similar to conductors 29, 43, and 44 for current transformer CT1. With additional current transformers configured similar to current transformer CT1, each current transformer may contribute power to the power supply. More than one current transformer may be demagnetized at a time, assuming analog-to-digital converter circuit 22 and microcontroller 21 are capable of the faster processing and communication required for this (unique control signals are preferred for each current transformer in order to implement feedback control similar to FIGS. 14A to 14D). If a non-feedback type of control is utilized (similar to FIGS. 15A to 15E), then only two control conductors (43 and 44) may be used to simultaneously demagnetize all current transformers at once with little demand on the microcontroller.

FIGS. 17A to 17D illustrate the operation of the embodiment shown in FIG. 16. The operation shown is similar to the operation described in FIGS. 14A to 14E. The embodiment shown in FIG. 16 may also be operated in a manner similar to that described for FIGS. 15A to 15E.

FIG. 17A shows alternating electric current J1, similar to FIG. 14A.

FIG. 17B shows secondary current J2, similar to FIG. 14B.

FIG. 17C shows the time periods that the field-effect transistors are actuated. A solid line indicates a high gate voltage, whereas a blank space indicates a low gate voltage. The switching sequence shown is functionally similar to FIG. 14C.

FIG. 17D shows secondary voltage V2, similar to FIG. 14D. However, now the voltage-limiting circuit is comprised of zener diodes D11 and D12, so the waveforms associated with the power supply charging cycle (between times T1 and T2) are different than in FIG. 14D. Also, the effect of capacitor C1 charging is evident at the beginning of each voltage pulse.

FIG. 18 shows a very simple embodiment of a current transformer demagnetizing circuit, utilizing only one field-effect transistor for an adjustable impedance. All components required only for self-powered applications have been removed, so a separate source of operating power is required. A power supply 23A is now included, which provides regulated d-c operating power from a separate power source. To emphasize the simplicity of the present invention, surge suppression devices have been removed as well as gate resistors (all of which may be considered optional, depending of the particular application and microcontroller configuration). Operation is similar to FIG. 16, but now the breakover voltage of the internal body diode of transistor Q5 is utilized for voltage control during the first phase, and the forward voltage drop of the body diode is used for the voltage required by the second phase. This configuration also has the advantage of the current transformer being directly connected to grounded conductor 11, which is a requirement of some'safety codes for some applications.

Though somewhat limited by the low voltage available for implementing the second phase (only about one volt), FIG. 18 illustrates a very simple method of implementing an adjustable impedance, and illustrates the use of a single three-terminal device as an adjustable impedance.

The main drawback to the configuration shown in FIG. 18 is that the low voltage available for the second phase will often require that the second phase be spread over several cycles. One way of increasing this voltage (and thereby reducing the time required) is to use two transistors in series with a common gate connection. This will double the second phase voltage to about 2 volts (the forward voltage drop of two diodes). Of course additional transistors could be added in series to increase the voltage still further. It should be noted from this that it is possible to make a single three-terminal semiconductor device (utilizing prior-art MOSFET technology) that has on/off parameters well suited for use as an adjustable impedance in this type of circuit.

FIGS. 19A to 19E show typical operating waveforms and control signals associated with the embodiment shown in FIG. 18. The sequence shown utilizes "first-phase method a" and "second-phase method c" previously discussed.

Referring to FIGS. 18 and 19A to 19E, operation is similar to that just described for FIGS. 16 and 17A to 17D, with the clarification that second phase voltage is merely the forward voltage drop of the body diode of transistor Q5. The first phase voltage is the breakover voltage of the internal body diode of transistor Q5, and this voltage is sufficient to drive the induction level to saturation in less than one half-cycle of current J2. However, the second phase voltage is not sufficient to complete the second phase transition (from saturation to an induction level near zero) in a single half-cycle of current J2. For this reason transistor Q5 must be turned on during the following positive half-cycle (from time T66 to time T67, to avoid going back to saturation), and turned off again at the beginning of the next negative half-cycle to continue moving the induction level toward zero. This type of cycling continues until time T68, at which time the induction level is near zero. The combined area of area A12, area A13, and area A14 should equal the volt-time constant of the current transformer.

FIGS. 20 through 27 all illustrate how an active voltage source may be utilized in a current transformer secondary circuit to demagnetize a current transformer and also improve the accuracy of a current transformer by reducing the amount that the induction level fluctuates during current-sensing operation. These figures also show how a preferred induction level may be maintained by causing the average value of the induced voltage over time to have a value near zero. The principles illustrated are applicable to other magnetic bodies in addition to current transformers.

FIGS. 20A to 20D show how the configuration of FIG. 1 may be used to demagnetize a current transformer using an active voltage source, thereby improving current transformer accuracy and enabling measurement of d-c current. To demagnetize magnetic core 60, the sequence shown utilizes "first-phase method a" and "second-phase method b," similar to the hysteresis curve of FIG. 3 and waveforms of FIGS. 4A to 4D (one difference being that the initial induction level of the present example is at −100% saturation instead of −50%). FIGS. 20A to 20D assume a varying d-c current for primary current J1, though the sequence shown is equally applicable to a-c current. The waveforms shown are based on controllable voltage device 63 being a controllable voltage source. Resistor R1 is a current-sensing resistor with low resistance. After a demagnetizing cycle, the current through resistor R1 is proportional to the d-c primary current. As with previous examples, voltage V2 is considered to be the. induced voltage.

At time T81 of FIGS. 20A to 20D the magnetic core is saturated due to primary current J1 being a d-c current, with no recent demagnetizing cycle to prevent the magnetic core from being saturated. Current J2 is zero, since the magnetic core is unable to generate any voltage to drive a current of the same polarity as current J1. Though the induction level at time T81 may be considered "known" from the perspective of this description, it is not known from the perspective of a current monitoring device. The present example will drive the induction level to a "known" induction level of +100% during the first phase, since this will be more informative than driving it to −100% (the induction level it is already at).

The first-phase of a demagnetizing cycle begins at time T82 when control circuit 62 controls voltage device 63 to produce a large positive voltage. This voltage causes a transition from saturation at −100% to saturation at +100%. Saturation at +100% is reached at about time T83. During the transition, while the core is not in saturation between times T82 and T83, current J2 becomes somewhat proportional to current J1, with an error related to hysteresis curve properties.

A second phase begins at time T84, when control circuit 62 causes voltage device 63 to produce a large negative first-step voltage, followed by a shorter positive second-step voltage beginning at time T85. At time T86 the second-step voltage is done, and control circuit 62 causes voltage device 63 to produce an output voltage near zero volts to allow secondary current to flow freely. As with previous examples, control circuit 62 controls the first-step and second-step voltages so that the magnitude of the volt-time integral of voltage V2 during the second phase equals the volt-time constant of the current transformer (area A19 minus area A20 should equal the volt-time constant).

At time T86 the current transformer is demagnetized, and secondary current J2 is proportional to primary current J1. However, since the current transformer must generate a small induced voltage to keep current J2 flowing through the loop resistance (resistor R1 plus winding resistance plus other stray resistances), the induction level starts to drift back toward saturation after time T86 (see FIG. 20D). This transition toward saturation will cause an increasing error in current J2 until saturation is reached, at which point current J2 will cease to flow (as at time T81). To maintain accuracy, the demagnetizing cycle must be repeated periodically (usually well before saturation is reached). For applications in which current flow is consistently one direction, it may be beneficial to move the initial operating point to an induction level other than zero to lengthen the time period between demagnetizing cycles. For example, in the example of FIGS. 20A to 20D, it may be preferable to shorten the first-step voltage (between times T84 and T85) so that the induction level is left initially at a positive level, say +25%. The magnetic core will still drift toward saturation at −100%, but it will take more time.

FIG. 21 shows one way that control circuit 62 and voltage device 63 of FIG. 1 may be embodied. The configuration shown is particularly suitable for measuring electric current, including d-c current. This configuration may be operated in a manner similar to the manner described for FIGS. 20A to 20D. Many components are the same as FIG. 1, and these components function in the manner previously described. Since voltage device 63 of FIG. 21 is a controllable electric energy source, the same embodiment may be utilized for electric energy source 73 of FIG. 2. Of course, control circuit 62 of FIG. 2 may also be embodied the same way as shown in FIG. 21.

Still referring to FIG. 21, resistor. R1 is a current-sensing resistor with low resistance. Control circuit 62 has an analog-to-digital converter circuit 81 to sense current J2 (as voltage V3 across resistor R1), a microcontroller 82 for data processing and control functions, and a digital-to-analog converter circuit 83. Digital-to-analog converter circuit 83 provides an analog voltage signal on conductor 85 that controls the voltage output of voltage device 63. Analog-to-digital converter circuit 81 and microcontroller 82 communicate via an interface shown as four conductors, and this interface may vary considerably depending on the particular design. Likewise microcontroller 82 communicates with digital-to-analog converter circuit 83 via an interface that may vary considerably depending on the particular design. Voltage device 63 has an operational amplifier 84, with resistors R81 and R82 configured to set the gain of operational amplifier 84. A separate power source (not shown) provides operating power for analog-to-digital converter circuit 81, microcontroller 82, digital-to-analog converter circuit 83, and operational amplifier 84.

Ground connection 86 provides a common reference potential for the various circuits and power supply. If a particular application requires that winding 61 be directly grounded on one side, then resistor R1 may be relocated and connected in series with the opposite side of winding 61. This complicates the measurement of voltage V3 across resistor R1 somewhat, but prior-art differential voltage measurement methods are adequate.

Operational amplifier 84 must be able to produce voltage in a circuit with relatively large current driven by a current source (a current transformer acts like a current source). A "power operational amplifier" will usually be required, such as model OPA548 made by Burr-Brown Corporation. This device has an adjustable current-limit feature and is rated for up to 3 amps of continuous current (other models are available with higher ratings). Tests found that these devices worked very well in a current transformer secondary circuit, as long as a "snubber circuit" was connected to the output to improve stability. The "snubber circuit" that was successfully utilized was a ten Ohm resistor in series with a 0.1 microfarad capacitor, connected between the operational amplifier output and the grounded conductor (as recommended by the device's data sheet). The OPA548 operational amplifier also has provision for adjustable current limit, which is beneficial for this application.

The type of control configuration shown in FIG. 21 (utilizing an analog-to-digital converter circuit to sense an input signal, a microcontroller to implement a control function based on the input signal, a digital-to-analog converter to produce an analog control signal, and an operational amplifier to produce a voltage proportional to the analog control signal) is well established in the prior art, so additional configuration details will not be described herein. Microcontroller 82 may be configured to implement the control sequence illustrated by FIGS. 20A to 20D.

FIGS. 22A to 22E illustrate four different ways that the configurations of FIG. 1 or FIG. 21 may be operated during a current-sensing mode after a demagnetizing sequence is completed. Conceptually, FIGS. 22B, 22D and 22E may be thought of as a continuation in time of FIGS. 20A, 20C and 20D respectfully. Time T86 is common to both sets of figures. However, the vertical scales of FIGS. 22B, 22D, and 22E are magnified by factors of about 4, 4, and 8 respectively to facilitate display of waveforms with relatively small magnitude. Voltage V2 is now considered to differ from the induced voltage V (see FIGS. 22B and 22C) by an amount that depends on current J2 and stray winding impedances.

Referring to FIG. 21, current J2 flows through winding 61, resistor R1, voltage device 63, and various conductors that connect these different components. The "loop resistance" associated with current J2 is the sum of the resistances of all the components that current J2 flows through. With the assumption that operational amplifier 84 has near ideal properties, the resistance of voltage device 63 will be considered negligible. Then the loop resistance for current J2 of FIG. 21 is the sum of the resistances of winding 61, resistor R1 and various conductors that connect these different components. In the present example the total loop resistance will be assumed to be about twice the resistance of resistor R1. For the present discussion, reactive impedances in the loop are considered negligible (see FIGS. 24, 28 and 29 for how reactive impedances may be accounted for).

Referring now to FIGS. 21 and 22A to 22E, from time T86 to time T87 voltage device 63 is controlled by control circuit 62 to produce an output voltage of zero volts. This allows current J2 to flow freely, but since current J2 is not symmetrical, induced voltage V has an average negative value to keep current J2 flowing. Induced voltage V is equal and opposite to the voltage drop of current J2 around the loop, which is approximately equal to the magnitude of current J2 multiplied by the loop resistance (neglecting stray inductances and capacitances of loop components). This induced voltage, with an average negative value, correlates with the induction level of magnetic core 60 drifting toward saturation as shown in FIG. 22E. To compensate for this drift toward saturation, voltage device 63 may be controlled to produce a voltage with an average value equal to voltage V3 across resistor R1. This is the case shown in FIGS. 22A to 22E between times T87 and T88. However, this is not enough voltage to counteract the voltage drop across the stray resistance in the loop (winding and conductor resistances), and the drift toward saturation continues at a slower rate (as shown by FIG. 22E). Between times T88 and T89 voltage device 63 is controlled to produce a voltage equal to twice the average value of voltage V3 (since the total loop resistance is twice the resistance of resistor R1), and this voltage causes induced voltage V to have an average value near zero, stopping the drift toward saturation (a larger voltage would cause induced voltage V to have an average positive value and cause the induction level to drift toward a positive direction). Between times T89 and T90 voltage device 63 is controlled to produce a voltage equal to twice the instantaneous value of voltage V3, and this voltage also stops the drift toward saturation while causing induced voltage V to continuously be very near zero volts and greatly reducing induction level fluctuations.

Either control method utilized between times T88 and T90 in FIGS. 22A to 22E may be used to maintain a preferred induction level. The control method shown between times T89 and T90 has the added advantage of reducing the magnitude of the induced voltage to near zero (induction level fluctuations and magnetizing current are also reduced to near zero). For current transformer applications, one could say that the effective burden of the entire secondary circuit is reduced to near zero Ohms. A secondary circuit with a total effective burden near zero Ohms can significantly increase the accuracy of a current transformer as well as reduce the size of the magnetic core required to attain a particular level of accuracy.

This is an improvement over the active load termination described in Reissued U.S. Pat. No. Re. 28,851 (to Milkovic, reissued 1976, for a "Current Transformer with Active Load Termination"), since the configuration disclosed in that patent only reduces the burden of the sensing device to near zero (rather than the burden of the whole secondary circuit).

In order to operate the configuration of FIG. 21 in either manner illustrated between times T88 and T90 of FIGS. 22A to 22E, it is necessary to determine the loop resistance for current J2. The loop resistance may be predetermined and microcontroller 82 may be preconfigured with the proper operating parameters. Alternatively, the loop resistance may be determined automatically by microcontroller 82 operating to drive the magnetic core to saturation with a known voltage V1 and then measuring current J2 after the magnetic core is saturated. The loop resistance is then simply the magnitude of voltage V1 divided by current J2.

Figure 23:
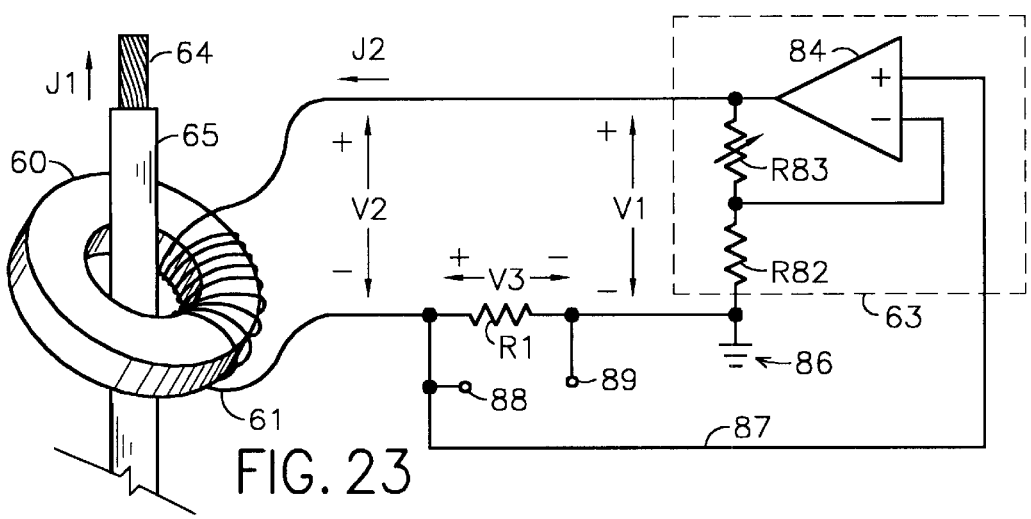

The control method utilized between times T89 and T90 in FIGS. 22A to 22E may be used in a-c current-sensing systems to virtually eliminate the burden of current transformer secondary circuits (without necessarily utilizing the demagnetizing sequence shown in FIGS. 20A to 20D). A simple embodiment just for this purpose is illustrated in FIG. 23. The configuration of FIG. 23 is similar to FIG. 21 except that voltage device 63 is now controlled so that voltage V1 is always proportional to voltage V3. The control means is now integral to voltage device 63 (adjustable resistor R83 and resistor R82 control the gain of operational amplifier 84). Conductor 87 conducts a voltage signal (voltage V3) which is proportional to current. Voltage V3 may also be-communicated to a larger current-sensing system via terminals 88 and 89.

Still referring to FIG. 23, if adjustable resistor R83 is set to zero ohms, the voltage gain of voltage device 63 is one, and the circuit has a similar effect as the active load disclosed in Reissued U.S. Pat. No. Re. 28,851. With a gain of one, voltage V1 is equal to voltage V3, so that the combination of resistor R1 and voltage device 63 has a combined voltage near zero volts and therefore has a combined effective burden near zero ohms.

Similar to the discussion for FIGS. 22A to 22E, if the total loop resistance for current J2 is twice the resistance of resistor R1, and if voltage device 63 is controlled so that voltage V1 is twice as large as voltage V3, the voltage drop of the entire loop would be compensated for. This can be done by making the resistance of adjustable resistor R83 in FIG. 23 equal to the resistance of resistor R82. This causes the induced voltage of winding 61 to be very small, and the effective burden of the entire secondary circuit is reduced to almost zero ohms.

Adjustable resistor R83 may be adjusted to obtain any reasonable gain greater than one, in accordance with well-known design principles of operational amplifiers. By adjusting resistor R83 the gain is adjustable to match secondary circuit parameters for most secondary circuit configurations. Of course, resistor R83 may be a fixed resistor if the appropriate gain is predetermined. Care must be exercised, however, because if the gain is set to compensate for more than the total secondary circuit impedance, then the system becomes unstable and current will increase to the limit of the amplifier output circuit.

For secondary circuits with non-negligible inductance or capacitance, resistors R82 and R83 may be replaced with complex impedances to better match secondary circuit parameters, thereby facilitating a total secondary circuit burden near zero ohms. In addition to compensating for the effects of secondary circuit loop impedances, complex impedance parameters may be configured to compensate also for current transformer imperfections (such as hysteresis effects and eddy currents).

Figure 24:
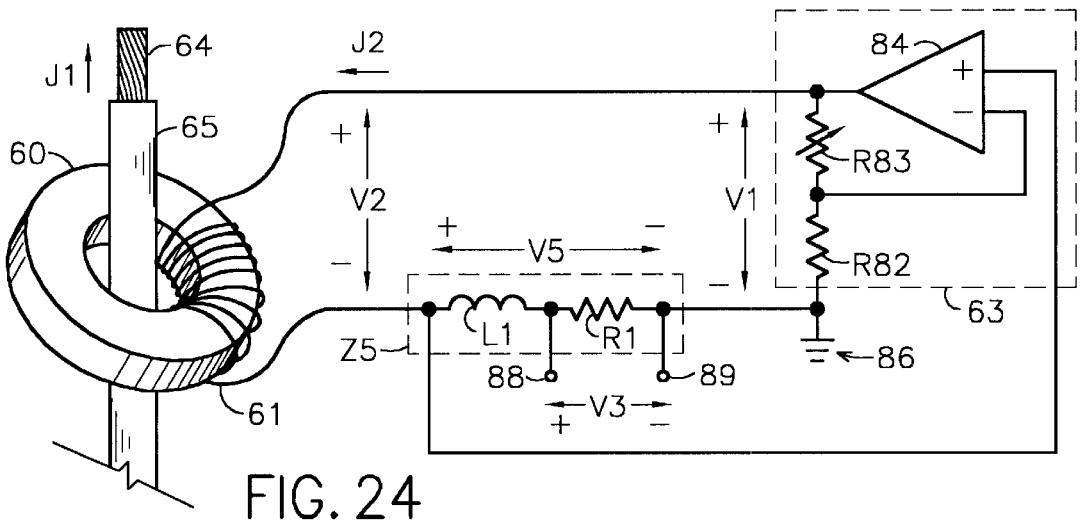

An alternative to changing resistors R82 and/or R83 to complex impedances would be to utilize a complex sensing impedance (a current-sensing impedance comprising resistive and reactive components). FIG. 24 shows one way that a complex sensing impedance may be utilized to provide a feedback signal that is proportional to the voltage drop caused by current J2 flowing through all loop impedances, including complex stray impedances. Complex sensing impedance Z5 is formed by adding inductive reactance L1 in series with resistor R1. In the configuration shown in FIG. 24, reactive loop impedances may include stray reactances of winding 61 and connecting conductors (stray impedances aren't shown in FIG. 24, but are shown in FIG. 28). The reactance value of inductive reactance L1 should be chosen so that the impedance angle (the ratio of the reactive component to the resistive component) of impedance Z5 is approximately the same as the impedance angle of the sum of the other loop impedances. Then feedback voltage V5 is approximately proportional to the voltage drop caused by current flowing through all loop impedances. As in FIG. 23, resistor R83 should be adjusted so that voltage V1 (the output voltage of voltage device 63) approximately counteracts the voltage drop associated with current J2 flowing through all loop impedances. In this way, induced voltage fluctuations are significantly reduced, and current transformer accuracy is significantly improved.

FIG. 25 shows a configuration that combines the benefits of a dedicated sensing winding 90 with the versatility of the control circuit shown in FIG. 21. Similar to FIG. 21, the configuration shown in FIG. 25 may be utilized for sensing both a-c and d-c currents, since control circuit 62 is capable of demagnetizing the magnetic core. With the configuration shown in FIG. 25, microcontroller 82. may be programmed to implement a burden-reducing method similar to FIG. 23 (controlling voltage device 63 based on current J2 and known loop impedances). Alternatively, microcontroller 82 may be programmed to control voltage device 63 to minimize the sensed voltage across winding 90. This may be done simply with a proportional type of control, controlling voltage device 63 to produce an output voltage proportionally many times larger than the sensed voltage, with polarity so as to reduce induced voltage.

The control configuration shown in FIG. 25 may be applied to many kinds of magnetic bodies in addition to current transformers. With the induced voltage across dedicated winding 90 utilized as a feedback control signal, the induction level of a magnetic body may be made to vary with time in almost any manner desired. Microcontroller 82 may be programmed to calculate changes in induction level as the integral of induced voltage over time, and utilize a P.I.D. (Proportional plus Integral plus Derivative) type of control to obtain the response desired. Other types of control, such as fuzzy logic, may also be utilized. These feedback control methods are well known in the prior art, so they will not be discussed in detail herein. Similar configurations are possible utilizing analog control means in place of the digital control means shown for control circuit 62.

FIG. 26 shows a variation of FIG. 23 with added provision for a demagnetizing sequence. This combines the accuracy of sensing current with near zero induction level fluctuation with a demagnetizing means. Similar to FIG. 21, the configuration of FIG. 26 may be used to measure d-c current as well as a-c current. FIG. 26 has the advantage of not requiring continual microcontroller supervision during the current-sensing phase. P-channel field-effect transistor Q1 and N-channel field-effect transistor Q2 along with demagnetizing controls 91 have been added to enable voltage device 63 to produce the varying voltage required for a demagnetizing sequence. Positive voltage VP and negative voltage VN are supplied by a separate power supply (not shown).

Demagnetizing controls 91 may be configured utilizing prior art. A microcontroller may be utilized for proper timing of the demagnetizing sequence, or an analog timing circuit may be utilized. The gate of field-effect transistor Q1 should be driven low to cause voltage device 63 to produce a negative voltage, and the gate of field-effect transistor Q2 should be driven high to cause voltage source 63 produce a positive voltage. With both field-effect transistors Q1 and Q2 off, the circuit functions similar to FIG. 23. Field-effect transistors Q1 and Q2 should not be turned on at the same time, as this results in a relatively low impedance between power supply connections VP and VN. Resistors R82 and R83 should have resistance values set small enough that any leakage current through field-effect transistors Q1 and Q2 during the current sensing mode will not adversely affect operation of voltage device 63.

Still referring to FIG. 26, current-sensing resistor R1 could be replaced by a complex sensing impedance similar to impedance Z5 in FIG. 24. This would facilitate counteracting the voltage drop associated with stray loop reactances (similar to the operation of FIG. 24), further reducing induction level fluctuations and further improving current transformer accuracy.

FIG. 27 shows how the concepts illustrated in FIGS. 25 and 26 may be combined to provide another embodiment of a current-sensing circuit with low burden together with a demagnetizing means. Dedicated sensing winding 90 and operational amplifier 84 are configured to normally reduce induced voltage (and induction level fluctuations) to improve current transformer accuracy (resistor R81 is relatively large compared to resistor R82 to set the gain of operational amplifier 84 relatively high). Field-effect transistors Q1 and Q2 are controlled by demagnetizing controls 91 to periodically implement a demagnetizing sequence (similar to FIG. 26).

Surge protection (not shown) for the configurations of FIGS. 21, 23, 24, 25, 26 and 27 may be provided by connecting a varistor, back-to-back zener diodes, or other voltage-limiting device between the output of operational amplifier 84 and the grounded conductor (thereby limiting voltage V1 to a safe level and still provide for sensing of surge currents). Dual silicon controlled rectifiers or a triac (both with suitable trigger circuits) may be particularly suitable. U.S. Pat. No. 4,466,039 to Moran and Reis (1984), discloses a suitable triac circuit that may be used.

FIG. 28 is a variation of FIG. 1 showing one way that induced voltage may be calculated taking into account the effects of stray impedances (and other loop impedances), and one way that calculated induced voltage may be utilized as a feedback signal to facilitate control of induced voltage.

Inductive reactance L1 has been added to resistor R1, the combination being impedance Z5 (similar to FIG. 24). The stray impedances of winding 61 are represented by winding stray impedance Z6, which is shown as a combination of resistance and inductive reactance. Other loop impedances are shown as impedance Z7, which is also shown as a combination of resistance and inductive reactance. Capacitive reactance could also be accounted for but it is assumed to be negligible for the present discussion. The total effective loop impedance is the sum of impedances Z5, Z6, and Z7.

The voltage across resistor R1 is still directly proportional to current, and may be used by an external system to sense current via terminals 88 and 89.

Voltage V2 is now strictly the measurable voltage across winding 61, with the actual induced voltage V differing from voltage V2 by a voltage drop V6 caused by current J2 flowing through stray impedance Z6. Induced voltage V may be calculated as voltage V2 minus voltage drop V6. Alternatively, induced voltage V may be calculated as voltage V1 minus voltages V5, V6, and V7 (in accordance with Kirchoff's voltage law). Of course, whether voltages are added or subtracted to calculate induced voltage depends on how the polarities of the voltages are defined. In FIG. 28, inductor L1 and resistor R1 are sized so that the ratio of the reactive component to resistive component of impedance Z5 is approximately the same as the ratio of the reactive component to resistive component of the series combination of stray winding impedances Z6 and impedance Z7. Then the instantaneous magnitude of the sum of voltages V5, V6 and V7 will be approximately proportional to the instantaneous magnitude of voltage V5. Induced voltage V may then be calculated as voltage V1 minus voltage V5 multiplied by a constant. The operational amplifiers shown in FIG. 28 are configured to calculate induced voltage V in this manner.

More specifically, operational amplifier 95 and resistors R35 and R36 are configured to produce a voltage output equal to voltage V5 multiplied by a constant. Resistor R35 is adjustable to facilitate making the output approximately equal to the sum of voltage drops V5, V6 and V7. Operational amplifier 96 and resistors R37, R38, R39, and R40 are configured such that the output of operational amplifier 96 is approximately equal to voltage V1 minus voltage V5 multiplied by a constant, which is approximately induced voltage V (resistors R37, R38, R39, and R40 should all have the same resistance value). This calculated induced voltage is conducted by conductor 97 and is a feedback input to a controller 62B.

Controller 62B may also (optionally) receive a variable control signal (from an external system) that is proportional to the induction level that is desired (the "reference induction level"). Such a control signal is shown in FIG. 28 as an input signal on conductor 98. Since the induced voltage is proportional to the rate of change (or the "derivative") of induction level (per equation no. 4), it may be beneficial to calculate the rate of change (the derivative) of the control signal. This calculation is performed by operational amplifier 99, capacitor C4, and resistor R38. Conductor 100 conducts the negative of the derivative as an input into controller 62B. Controller 62B is configured with suitable prior-art controls (such as a proportional plus integral plus derivative type of control system, or fuzzy logic controls, or any other suitable control means) to force the induced voltage to be proportional to the derivative of the control signal (with an appropriate constant of proportionality). Alternatively, the induced voltage could be integrated, and the controller could function to keep the integral of induced voltage proportional to control signal changes (per equation no. 5).

Since there may be some inaccuracies in the control loop, the induction level may drift over time away from the level corresponding to the control signal on conductor 98. For this reason, controller 62B may be configured to occasionally reset the induction level in magnetic core 60 to the preferred level as indicated by the control signal on conductor 98. A sequence similar to that shown in FIGS. 5 through 6D may be utilized to reestablish a preferred induction level.

Of course, the analog calculations performed by the operational amplifiers in FIG. 28 could also be performed digitally utilizing an analog-to-digital converter and a microcontroller, similar to the configuration of FIG. 21. If the configuration of FIG. 21 is used, induced voltage may be calculated without measuring voltage V1, since microcontroller 82 controls voltage V1 and therefore knows its magnitude without measuring it.

FIG. 29 is a variation of FIG. 28 showing how induced voltage may be calculated from winding voltage V2 and voltage V5 across sensing impedance Z5. Voltage V2 is still strictly the measurable voltage across winding 61, with the actual induced voltage V differing from voltage V2 by a voltage drop V6 across stray winding impedances Z6. The operational amplifiers shown in FIG. 29 are configured to calculate induced voltage V as voltage V2 minus voltage drop V6 (voltage drop V6 being calculated as voltage V5 times a constant).

Inductor L1 and resistor R1 are now sized so that the ratio of inductive reactance to resistance of impedance Z5 is approximately the same as the ratio of inductive reactance to resistance of just stray winding impedances Z6. Then the instantaneous magnitude of voltage V6 (which is not directly measurable) will be approximately proportional to the instantaneous magnitude of voltage V5. Induced voltage V may then be calculated as voltage V2 minus voltage V5 times a constant.

More specifically, operational amplifiers 92 and 93 are configured as buffers with very high input impedance so that all of current J2 flows through impedance ZS. The output voltages of these amplifiers are the same voltages as the inputs, referenced to ground connection 86. Operational amplifier 94 and resistors R31, R32, R33, and R34 are configured so that the output of operational amplifier 94 is the difference of the two input voltages, namely voltage V2 referenced to ground (resistors R31, R32, R33, and R34 should all have the same resistance value). Operational amplifier 95 and resistors R35 and R36 are still configured to produce a voltage output proportional to voltage V5. Resistor R35 is adjustable to facilitate making the output approximately equal to voltage drop V6. Operational amplifier 96 and resistors R37, R38, R39, and R40 are configured so that the output of operational amplifier 96 is approximately equal to voltage V2 minus voltage drop V6, which is the same as induced voltage V (resistors R37, R38, R39, and R40 should all have the same resistance value). This calculated induced voltage is conducted by conductor 97 and is a feedback input to controller 62B.

In both FIGS. 28 and 29, controllable voltage device 63 may be configured with a power operational amplifier similar to FIG. 21, or may be configured with an adjustable impedance (in appropriate applications such as current transformers), or with any other suitable voltage-producing device.

CONCLUSIONS, RAMIFICATIONS, AND SCOPE

The present invention applies a varying voltage to a conductive winding to control the induction level of a magnetic body. Improvements over prior art include, but are not limited to, the following:

(a) how induced voltage may be controlled to establish a preferred induction level, (b) how induced voltage may be controlled to maintain a preferred induction level, (c) how induced voltage may be controlled to reduce the amount that the induction level fluctuates (thereby improving accuracy in current transformer applications, and benefitting other applications as well), (d) how induced voltage may be controlled to cause the induction level of a magnetic body to vary with time in a preferred manner, (e) how induced voltage and induction level may be controlled by utilizing an adjustable impedance in the secondary circuit of a current transformer (or other multi-winding application), and (f) how induced voltage may be controlled to enable standard current transformers to measure d-c currents, as well as a-c currents with d-c components.

Several different embodiments have been described and illustrated. There are many other embodiments possible that will be apparent to those skilled in the art. It is not the intent of this disclosure to limit the invention to the embodiments that have been illustrated. The components and configurations utilized in this disclosure are intended to be illustrative only, and are not intended to limit the scope of the appended claims.

While only certain preferred features of the invention have been shown by way of illustration, many modifications and changes will occur to those skilled in the art. It is, therefore, to be understood that the appended claims are intended to cover all such modifications and changes as fall within the true spirit of the invention.

What is claimed is:

1. A method for controlling the induction level of a magnetic body; said magnetic body being positioned relative to a conductive winding in such a way that a change of said induction level is associated with an induced voltage across said winding; said induced voltage being proportional to a rate of change of said induction level; said winding conducting an electric current; said method comprising the control of a voltage device connected to said winding; said voltage device producing an output voltage that controls said induced voltage, thereby controlling said rate of change of said induction level; said output voltage causing said induced voltage to have such waveform and magnitude so as to be approximately proportional to a preferred rate of change of said induction level;

the instantaneous magnitude of said induced voltage differing from the instantaneous magnitude of said output voltage because of voltage drops associated with said electric current flowing through loop impedances; said method utilizing a parameter related to said electric current and characteristics of said loop impedances to control said output voltage so as to compensate for said voltage drops, thereby optimizing said output voltage for improved control of said inductions level.

2. The method of claim 1 wherein said output voltage is controlled for a period of time in such a way as to cause said induction level to transition from a determinate induction level at the beginning of said period of time to a preferred induction level at the end of said period of time; said output voltage causing said waveform and magnitude of said induced voltage to have such characteristics that the integral of said induced voltage over said period of time is approximately equal to a volt-time value corresponding to a change of said induction level from said determinate induction level to said preferred induction level, thereby causing said induction level to transition from said determinate induction level to said preferred induction level.

3. The method of claim 2 wherein said preferred induction level is an induction level near zero, and said method is thereby a method to demagnetize said magnetic body.

4. The method of claim 2 wherein said induced voltage during said period of time is entirely of one polarity.

5. The method of claim 2 wherein said induced voltage during said period of time sequentially comprises a first voltage and a second voltage of opposite polarities; said first voltage having such magnitude, duration and polarity so as to cause said induction level to transition to and pass said preferred induction level; said second voltage having such magnitude, duration and polarity so as to cause said induction level to transition to said preferred induction level.

6. The method of claim 2 wherein said induced voltage during said period of time comprises a plurality of sequential voltage pulses of varying form, magnitude, duration, and polarity.

7. The method of claim 1 wherein said induction level is influenced by a magnetic field caused by a magnetomotive force independent of said winding, and said output voltage is controlled for a period of time in such a way as to maintain said induction level near a preferred induction level; said preferred induction level being present at the beginning of said period of time; said output voltage further causing said induced voltage to have such waveform and magnitude during said period of time that the integral of said induced voltage from the beginning of said period of time to any point of time within said period of time does not exceed a small value, thereby causing said induction level to be maintained near said preferred induction level.

8. The method of claim 1 wherein said induction level is influenced by a fluctuating magnetic field caused by a magnetomotive force independent of said winding, and said output voltage is controlled for a period of time in such a way as to reduce the amount that said induction level fluctuates; said output voltage being controlled during said period of time in such a way as to cause the magnitude of said induced voltage to be significantly smaller than would be the case without said method, thereby reducing the amount that said induction level fluctuates.

9. The method of claim 8 wherein said output voltage is controlled in such a way that the instantaneous magnitude of said output voltage is approximately equal to the sum of said voltage drops, thereby reducing the magnitude of said induced voltage, thereby reducing the amount that said induction level fluctuates.

10. The method of claim 8 wherein said output voltage is controlled utilizing a proportional plus integral plus derivative type of control; the instantaneous magnitude of said output voltage being controlled to be approximately equal to the sum of
  (a) the instantaneous value of said electric current multiplied by a first constant of proportionality,
  (b) the integral over time of said electric current multiplied by a second constant of proportionality, and
  (c) the instantaneous rate of change of said electric current multiplied by a third constant of proportionality.

11. The method of claim 8 wherein said output voltage is controlled utilizing a proportional plus derivative type of control; the instantaneous magnitude of said output voltage being controlled to be approximately equal to the sum of
  (a) the instantaneous value of said electric current multiplied by a first constant of proportionality, and
  (b) the instantaneous rate of change of said electric current multiplied by a second constant of proportionality.

12. The method of claim 8 wherein said output voltage is controlled utilizing a proportional type of control; the instantaneous magnitude of said output voltage being controlled to be approximately equal to the instantaneous value of said electric current multiplied by a constant of proportionality.

13. The method of claim 1 wherein said method is used to cause said induction level to approximately match a reference induction level for a period of time; said reference induction level being a function of time; said method further comprising an initial step of determining a constant of proportionality; said constant of proportionality having such value that said induced voltage is approximately equal to said rate of change of said induction level multiplied by said constant of proportionality; said output voltage further causing the instantaneous magnitude of said induced voltage to continuously be approximately equal to the rate of change of said reference induction level multiplied by said constant of proportionality, thereby causing said induction level to approximately match said reference induction level.

14. The method of claim 13 wherein said output voltage is controlled utilizing a proportional plus integral plus derivative type of control; said method calculating said induced voltage and controlling said output voltage so as to minimize the error between said induced voltage and said rate of change of said reference induction level multiplied by said constant of proportionality.

15. The method of claim 1 wherein said parameter related to said electric current is a feedback signal that is instantaneously proportional to the instantaneous magnitude of said electric current; said electric current and said feedback signal both being functions of time; the instantaneous magnitude of said induced voltage being calculable as the instantaneous magnitude of said output voltage minus the instantaneous sum of said voltage drops; said instantaneous sum of said voltage drops being calculable from said feedback signal and said characteristics of said loop impedances.

16. The method of claim 15 wherein said parameter related to said electric current is the only feedback signal utilized to control said output voltage.

17. The method of claim 1 wherein said parameter related to said electric current is a first voltage measurable across a first impedance through which said electric current flows; said first voltage being directly related to said electric current in accordance with the properties of said first impedance; the instantaneous magnitude of said induced voltage being calculable as the instantaneous magnitude of said output voltage minus the instantaneous sum of said voltage drops; said instantaneous sum of said voltage drops being calculable from said first voltage and said characteristics of said loop impedances.

18. The method of claim 17 wherein said first voltage is the only feedback signal utilized to control said output voltage.

19. The method of claim 1 wherein said magnetic body is a magnetic core of a current transformer, and said winding is a secondary winding of said current transformer; said current transformer functioning to cause said electric current to be approximately proportional to a primary electric current; said primary electric current flowing in a conductor configured as a primary winding of said current transformer; said method being used to control said induction level in such a way that said electric current is more accurately proportional to said primary electric current than would be the case without said method.

20. The method of claim 19 wherein said method is utilized while said current transformer is in service, said primary electric current having a nonzero magnitude.

21. The method claim 20 wherein the accuracy of said current transformer is improved by reducing the amount that said induction level fluctuates; said induced voltage and associated fluctuation of said induction level adversely affecting the accuracy of said current transformer; said output voltage being controlled in such a way that the magnitude of said induced voltage is reduced, thereby reducing the amount that said induction level fluctuates, thereby improving the accuracy of said current transformer.

22. The method of claim 20 wherein the accuracy of said current transformer is improved by causing said magnetic core to transition to a preferred induction level; said output voltage being controlled during a first phase so as to cause said induction level to transition to a determinate induction level; said output voltage being controlled during a second phase so as to cause said induced voltage to have such waveform, magnitude and duration that the value of the integral over time of said induced voltage is approximately equal to a volt-time value corresponding to a change in said induction level from said determinate induction level to said preferred induction level, thereby causing said induction level to transition form said determinate induction level to said preferred induction level; said output voltage being controlled during a third phase so as to allow said electric current to flow freely; said electric current being approximately proportional to said primary electric current during said third phase.

23. The method of claim 22 wherein the accuracy of said current transformer is further improved by further using said method to reduce the amount that said induction level fluctuates during said third phase; said induced voltage and associated fluctuation of said induction level adversely affecting the accuracy of said current transformer; said output voltage being controlled in such a way during said third phase that the magnitude of said induced voltage is reduced, thereby reducing the amount that said induction level fluctuates, thereby improving the accuracy of said current transformer.

24. The method of claim 23 wherein said primary electric current is a direct current; said electric current being approximately proportional to said primary electric current during said third phase.

25. Apparatus for controlling the induction level of a magnetic body; said apparatus comprising (a) a winding conducting an electric current; said winding comprising one or more turns of conductive material positioned relative to said magnetic body in such a way that a change of said induction level is associated with an induced voltage across said winding; said induced voltage:being proportional to the rate of change of said induction level;

(b) a current-sensing means for providing a feedback signal containing information about said electric current;

(c) a controllable voltage device connected to said winding, said voltage device producing an output voltage which controls said induced voltage and thereby controls the rate of change of said induction level; and (d) a suitable control means for receiving said feedback signal and controlling said voltage device; said control means utilizing said feedback signal and characteristics of loop impedances through which said electric current flows to optimize said output voltage for improved control of said induction level.

26. The apparatus of claim 25 wherein said apparatus operates for a period of time to cause said induction level to transition from a determinate induction level at the beginning of said period of time to a preferred induction level at the end of said period of time; said control means controlling said voltage device so as to cause said output voltage to have such waveform and magnitude so as to cause the integral of said induced voltage over said period of time to be approximately equal to a volt-time value corresponding to a change of said induction level from said determinate induction level to said preferred induction level, thereby causing said induction level to transition from said determinate induction level to said preferred induction level.

27. The apparatus of claim 26 wherein said current-sensing means comprises a first impedance connected in series with said winding; said electric current flowing through said first impedance; a first voltage across said first impedance being directly related to said electric current in accordance with the properties of said first impedance; said feedback signal being said first voltage; the instantaneous magnitude of said induced voltage being calculable as the instantaneous magnitude of said output voltage minus the instantaneous sum of voltage drops associated with said electric current flowing through said loop impedances; said instantaneous sum of said voltage drops being calculable from said first voltage and said characteristics of said loop impedances.

28. The apparatus of claim 27 wherein said magnetic body is a magnetic core of a current transformer, and said winding is a secondary winding of said current transformer; said current transformer functioning to cause said electric current to be approximately proportional to a primary electric current; said primary electric current flowing in a conductor configured as a primary winding of said current transformer; said apparatus being utilized while said current transformer is in service; said apparatus functioning to demagnetize said current transformer, thereby causing said electric current to be more accurately proportional to said primary electric current than would be the case without said apparatus.

29. The apparatus of claim 25 wherein said induction level is influenced by a magnetic field caused by a magnetomotive force independent of said winding, and said apparatus operates for a period of time to maintain said induction level near a preferred induction level; said preferred induction level being present at the beginning of said period of time; said control means controlling said voltage device during said period of time so as to cause said induced voltage to have such waveform and magnitude that the integral over time of said induced voltage from the beginning of said period of time to any point of time within said period of time is small, thereby causing said induction level to be maintained near said preferred induction level.

30. The apparatus of claim 29 wherein said current-sensing means comprises a first impedance connected in series with said winding; said electric current flowing through said first impedance; a first voltage across said first impedance being directly related to said electric current in accordance with the properties of said first impedance; said feedback signal being said first voltage; the instantaneous magnitude of said induced voltage being calculable as the instantaneous magnitude of said output voltage minus the instantaneous sum of voltage drops associated with said electric current flowing through said loop impedances; said instantaneous sum of said voltage drops being calculable from said first voltage and said characteristics of said loop impedances.

31. The apparatus of claim 30 wherein said magnetic body is a magnetic core of a current transformer, and said winding is a secondary winding of said current transformer; said current transformer functioning to cause said electric current to be approximately proportional to a primary electric current; said primary electric current flowing in a conductor configured as a primary winding of said current transformer; said apparatus being utilized while said current transformer is in service; said apparatus functioning to maintain said magnetic core in a demagnetized state, thereby causing said electric current to be more accurately proportional to said primary electric current than would be the case without said apparatus.

32. The apparatus of claim 25 wherein said induction level is influenced by a fluctuating magnetic field caused by a magnetomotive force independent of said winding, and said apparatus operates for a period of time to reduce the amount that said induction level fluctuates; said control means controlling said voltage device during said period of time in such a way as to cause the magnitude of said induced voltage to be significantly smaller than would be the case without said apparatus, thereby reducing the amount that said induction level fluctuates.

33. The apparatus of claim 32 wherein said current-sensing means comprises a first impedance connected in series with said winding; said electric current flowing through said first impedance; a first voltage across said first impedance being directly related to said electric current in accordance with the properties of said first impedance; said feedback signal being said first voltage; the instantaneous magnitude of said induced voltage being calculable as the instantaneous magnitude of said output voltage minus the instantaneous sum of voltage drops associated with said electric current flowing through said loop impedances; said instantaneous sum of said voltage drops being calculable from said first voltage and said characteristics of said loop impedances.

34. The apparatus of claim 33 further operating to make the instantaneous magnitude of said output voltage approximately equal to the instantaneous sum of said voltage drops, thereby reducing the amount that said induction level fluctuates; the polarity of said output voltage being opposite to the polarity of said instantaneous sum of said voltage drops.

35. The apparatus of claim 34 wherein said magnetic body is a magnetic core of a current transformer, and said winding is a secondary winding of said current transformer; said current transformer functioning to cause said electric current to be approximately proportional to a primary electric current; said primary electric current flowing in a conductor configured as a primary winding of said current transformer; said apparatus being utilized while said current transformer is in service; said apparatus functioning to reduce the amount that said induction level fluctuates, thereby reducing the effective burden of the secondary circuit of said current transformer, thereby causing said electric current to be more accurately proportional to said primary electric current than would be the case without said apparatus.

36. The apparatus of claim 35 wherein said first voltage is the only feedback signal utilized by said control means to control said induction level.

37. The apparatus of claim 25 wherein said apparatus operates for a period of time to cause said induction level to approximately match a reference induction level; said induction level and said reference induction level both being functions of time; said induced voltage being approximately equal to said rate of change of said induction level multiplied by a constant of proportionality; said control means controlling said voltage device during said period of time so as to cause said induced voltage to continuously be approximately equal to the rate of change of said reference induction level multiplied by said constant of proportionality, thereby causing said induction level to approximately match said reference induction level.

38. The apparatus of claim 37 wherein said current-sensing means comprises a first impedance connected in series with said winding; said electric current flowing through said first impedance; a first voltage across said first impedance being directly related to said electric current in accordance with the properties of said first impedance; said feedback signal being said first voltage; the instantaneous magnitude of said induced voltage being calculable as the instantaneous magnitude of said output voltage minus the instantaneous sum of voltage drops associated with said electric current flowing through said loop impedances; said instantaneous sum of said voltage drops being calculable from said first voltage and said characteristics of said loop impedances.

39. The apparatus of claim 25 wherein said current-sensing means comprises a first impedance connected in series with said winding; said electric current flowing through said first impedance; a first voltage across said first impedance being directly related to said electric current in accordance with the properties of said first impedance; said feedback signal being said first voltage; the instantaneous magnitude of said induced voltage being calculable as the instantaneous magnitude of said output voltage minus the instantaneous sum of voltage drops associated with said electric current flowing through said loop impedances; said instantaneous sum of said voltage drops being calculable from said first voltage and said characteristics of said loop impedances.

40. The apparatus of claim 25 further comprising a voltage-measuring means connected to said winding and measuring a second voltage across said winding; a voltage drop caused by said electric current flowing through stray impedances of said winding being calculable from said feedback signal; said induced voltage being calculable as said second voltage minus said voltage drop.

41. The apparatus of claim 35 wherein said feedback signal is the only feedback signal utilized by said control means to control said induction level.

42. The apparatus of claim 25 wherein said winding will also be referred to as a secondary winding and said electric current will also be referred to as a secondary electric current; said magnetic body further magnetically interacting with a primary winding; said primary winding comprising one or more turns of conductive material; said primary winding conducting an alternating electric current; said primary winding being positioned relative to said magnetic body in such a way that said alternating electric current influences said induction level of said magnetic body; said voltage device comprising an adjustable impedance connected in series with said secondary winding; said secondary electric current flowing through said adjustable impedance; said control means controlling said output voltage of said voltage device by controlling the characteristics of said adjustable impedance; said output voltage being a function of the magnitude and polarity of staid secondary electric current and said characteristics of said adjustable impedance.

43. The apparatus of claim 42 wherein said magnetic body, said secondary winding, and said primary winding are configured as a current transformer; said current transformer functioning to cause said secondary electric current to be approximately proportional to said primary electric current; said apparatus being utilized while said current transformer is in service to control said induction level in such a way that said electric current is more accurately proportional to said primary electric current than would be the case without said apparatus.

44. The apparatus of claim 43 wherein said apparatus is utilized periodically to demagnetized said current transformer, thereby improving the accuracy of said current transformer.

45. The apparatus of claim 25 wherein said magnetic body is a magnetic core of a current transformer, and said winding is a secondary winding of said current transformer; said current transformer functioning to cause said electric current to be approximately proportional to a primary electric current; said primary electric current flowing in a conductor configured as a primary winding of said current transformer; said apparatus being used to control said induction level in such a way that said electric current is more accurately proportional to said primary electric current than would be the case without said apparatus.

46. The apparatus of claim 45 wherein said apparatus is utilized while said current transformer is in service, said primary electric current having a non-zero magnitude.

47. The apparatus of claim 46 wherein the accuracy of said current transformer is improved by reducing the amount that said induction level fluctuates; said induced voltage and associated fluctuation of said induction level adversely affecting the accuracy of said current transformer; said output voltage being controlled so as to counteract voltage drops caused by said electric current flowing through said loop impedances; thereby reducing the magnitude of said induced voltage, thereby reducing the amount that said induction level fluctuates, thereby improving the accuracy of said current transformer.

48. The apparatus of claim 46 wherein the accuracy of said current transformer is improved by causing said magnetic core to transition to a preferred induction level; said output voltage being controlled during a first phase so as to cause said induction level to transition to a determinate induction level; said output voltage then being controlled during a second phase so as to cause said induced voltage to have such waveform, magnitude and duration that the value of the integral over time of said induced voltage is approximately equal to a volt-time value corresponding to a change in said induction level from said determinate induction level to said preferred induction level, thereby causing said induction level to transition from said determinate induction level to said preferred induction level; said output voltage then being controlled during a third phase so as to allow said electric current to flow freely; said electric current being approximately proportional to said primary electric current during said third phase.

49. The apparatus of claim 48 wherein the accuracy of said current transformer is further improved by further using said apparatus to reduce the amount that said induction level fluctuates during said third phase; said induced voltage and associated fluctuation of said induction level adversely affecting the accuracy of said current transformer; said output voltage being controlled during said third phase so as to counteract voltage drops caused by said electric current flowing through said loop impedances; thereby reducing the magnitude of said induced voltage, thereby reducing the amount that said induction level fluctuates, thereby improving the accuracy of said current transformer.

50. The apparatus of claim 49 wherein said primary electric current is a direct current; said electric current being approximately proportional to said primary electric current during said third phase.

51. Apparatus for determining an induced voltage in a winding, said induced voltage being proportional to the rate of change of magnetic flux enclosed by said winding; an electric current flowing in said winding; said electric current also flowing through any impedance elements that may be connected in series with said winding; a voltage measurable across said winding being referred to herein as a first voltage; said winding having stray impedances that cause said first voltage to differ from said induced voltage by an amount referred to herein as a first voltage drop; a second voltage drop being associated with said electric current flowing through said impedance elements; said first voltage drop and said second voltage drop being calculable from characteristics of said electric current and characteristics of said stray impedances and characteristics of said impedance elements; said induced voltage being approximately equal to the sum of any voltages produced by active voltage sources in the loop through which said electric current flows minus said first voltage drop and said second voltage drop; said apparatus comprising (a) a current-sensing means for providing an information signal containing information about said electric current; and (b) a calculating means for receiving said information signal and for calculating said induced voltage.

52. The apparatus of claim 51 wherein said current-sensing means comprises a sensing impedance connected in series with said winding; said electric current flowing through said sensing impedance; a second voltage across said sensing impedance being directly related to said electric current in accordance with the properties of said sensing impedance; said information signal being said second voltage.

53. The apparatus of claim 52 wherein said sensing impedance is a resistor and said second voltage is therefore directly proportional to said electric current; the combination of said impedance elements and said stray impedances together functioning as a resistive component and an inductive reactance component; said calculating means calculating the instantaneous voltage drop across said resistive component to be approximately equal to the instantaneous magnitude of said second voltage multiplied by a first constant of proportionality; said calculating means calculating the instantaneous voltage drop across said inductive reactance component to be approximately equal to the instantaneous rate of change of said second voltage multiplied by a second constant of proportionality; said calculating means calculating the instantaneous value of said induced voltage to equal the sum of:

(a) the instantaneous magnitude of any voltages produced by said active voltage sources in said loop, (b) said instantaneous voltage drop across said resistive component, and (c) said instantaneous voltage drop across said inductive reactance component.

54. The apparatus of claim 52 wherein said apparatus further comprises a voltage-measuring means measuring said first voltage, and said sensing impedance is a resistor; said second voltage therefore being directly proportional to said electric current; said stray impedances functioning as a resistive component and an inductive reactance component; said calculating means calculating the instantaneous voltage drop across said resistive component to be approximately equal to the instantaneous magnitude of said second voltage multiplied by a first constant of proportionality; said calculating means calculating the instantaneous voltage drop across said inductive reactance component to be approximately equal to the instantaneous rate of change of said second voltage multiplied by a second constant of proportionality; said calculating means calculating the instantaneous value of said induced voltage to be approximately equal to the sum of
- (a) the instantaneous value of said first voltage,
- (b) said instantaneous voltage drop across said resistive component, and
- (c) said instantaneous voltage drop across said inductive reactance component.

55. The apparatus of claim 52 wherein the combination of said stray impedances plus all said impedance elements function together as a second reactive component and a second resistive component; said sensing impedance comprising a first reactive component and a first resistive component such that the ratio of said first reactive component to said first resistive component is approximately equal to the ratio of said second reactive component to said second resistive component; the instantaneous magnitude of said second voltage therefore being approximately proportional to the instantaneous sum of said first voltage drop and said second voltage drop; said calculating means calculating the instantaneous magnitude of said induced voltage as the instantaneous sum of any voltages produced by said active voltage sources in said loop minus the instantaneous magnitude of said second voltage multiplied by a constant of proportionality.

56. The apparatus of claim 52 wherein said apparatus further comprises a voltage-measuring means measuring said first voltage; said stray impedances functioning together as a first reactive component and a first resistive component; said sensing impedance comprising a second reactive component and a second resistive component with magnitudes such that the ratio of said second reactive component to said second resistive component is approximately equal to the ratio of said first reactive component to said first resistive component; the instantaneous magnitude of said second voltage therefore being proportional to the instantaneous magnitude of said first voltage drop; said calculating means calculating the instantaneous magnitude of said induced voltage as the instantaneous magnitude of said first voltage minus the instantaneous magnitude of said second voltage multiplied by a constant of proportionality.

57. The apparatus of claim 51 wherein said calculating means comprises one or more operational amplifiers configured so as to receive said information signal and utilize analog arithmetic means to generate a voltage signal that is proportional to said induced voltage.

58. The apparatus of claim 51 wherein said calculating means comprises an analog-to-digital converter circuit and a digital-processing means; said analog-to-digital converter circuit receiving said information signal and communicating digital information about said electric current to said digital-processing means; said digital-processing means calculating said induced voltage utilizing said digital information.

59. A method for controlling the induction level of a magnetic body;
said magnetic body being positioned relative to a conductive first winding in such a way that a change of said induction level is associated with a first induced voltage across said first winding; said first induced voltage being proportional to the rate of change of said induction level; a first electric current flowing in said first winding;

said magnetic body also being positioned relative to a conductive second winding in such a way that a change of said induction level is associated with a second induced voltage across said second winding; said second induced voltage being proportional to said rate of change of said induction level; said second winding being terminated in a high-resistance manner so that a second electric current flowing in said second winding is small, a second voltage measurable across said second winding therefore being approximately equal to said second induced voltage;

said method comprising the control of a voltage device connected to said first winding; said voltage device producing an output voltage that controls said first induced voltage and thereby controls said rate of change of said induction level and said second induced voltage and said second voltage; said output voltage being controlled so that said second voltage has such waveform and magnitude so as to be approximately proportional to a preferred rate of change of said induction level; the waveform and magnitude of said output voltage being controlled based on said second voltage and said preferred rate of change of said induction level; said preferred rate of change of said induction level being a function of time not continuously equal to zero.

60. The method of claim 59 wherein said output voltage is controlled for a period of time in such a way as to cause said induction level to transition from a determinate induction level at the beginning of said period of time to a preferred induction level at the end of said period of time; said output voltage causing said waveform and magnitude of said second voltage to have such characteristics that the integral of said second voltage over said period of time is approximately equal to a volt-time value corresponding to a change of said induction level from said determinate induction level to said preferred induction level, thereby causing said induction level to transition from said determinate induction level to said preferred induction level.

61. The method of claim 60 wherein said preferred induction level is an induction level near zero, and said method is thereby a method to demagnetize said magnetic body.

62. The method of claim 60 wherein said output voltage during said period of time is entirely of one polarity.

63. The method of claim 60 wherein said output voltage during said period of time sequentially comprises a first output voltage and a second output voltage of opposite polarities; said first output voltage having such magnitude, duration and polarity so as to cause said induction level to transition to and pass said preferred induction level; said second output voltage having such magnitude, duration and polarity so as to cause said induction level to transition to said preferred induction level.

64. The method of claim 60 wherein said output voltage during said period of time comprises a plurality of sequential voltage pulses of varying form, magnitude, duration, and polarity.

65. The method of claim 60 wherein said magnetic body is a magnetic core of a current transformer, and said first winding is a secondary winding of said current transformer; said current transformer functioning to cause said first electric current flowing in said first winding to be approximately proportional to a primary electric current; said primary electric current flowing in a conductor configured as a third winding; said method being utilized while said current transformer is in service; said method being used to periodically cause said induction level to transition to a preferred induction level near zero, thereby demagnetizing said current transformer, thereby making said first electric current more accurately proportional to said primary electric current than would be the case without said method.

66. The method of claim 65 wherein said primary electric current is a direct current.

67. The method of claim 59 wherein said induction level is influenced by a magnetic field caused by a magnetomotive force independent of said first winding, and said output voltage is controlled for a period of time in such a way as to maintain said induction level near a preferred induction level; said preferred induction level being present at the beginning of said period of time; said output voltage further causing said second voltage to have such waveform and magnitude during said period of time that the integral of said second voltage from the beginning of said period of time to any point of time within said period of time does not exceed a predetermined value, thereby causing said induction level to be maintained near said preferred induction level.

68. The method of claim 59 wherein said method causes said induction level to approximately match a reference induction level for a period of time; said reference induction level being a function of time; said method further comprising an initial step of determining a constant of proportionality; said constant of proportionality having such value that said second voltage is approximately equal to said rate of change of said induction level multiplied by said constant of proportionality; said output voltage further causing the instantaneous magnitude of said second voltage to continuously be approximately equal to the rate of change of said reference induction level multiplied by said constant of proportionality, thereby causing said induction level to approximately match said reference induction level.

69. Apparatus for controlling the induction level of a magnetic body; said apparatus comprising (a) a first winding conducting a first electric current, said first winding comprising one or more turns of conductive material positioned relative to said magnetic body in such a way that a change of said induction level is associated with a first induced voltage across said winding; said first induced voltage being proportional to the rate of change of said induction level;

(b) a second winding, said second winding comprising one or more turns of conductive material positioned relative to said magnetic body in such a way that a change of said induction level is associated with a second induced voltage across said second winding; said second induced voltage being proportional to said rate of change of said induction level; said second winding being terminated in a high-impedance manner so that a second electric current flowing in said second winding is sufficiently small so that a second voltage measurable across said second winding is approximately equal to said second induced voltage;

(c) a voltage-measuring means for providing an information signal containing information about said second voltage;

(d) a controllable voltage device connected to said first winding; said voltage device producing an output voltage which controls said first induced voltage and thereby controls said rate of change of said induction level and said second induced voltage and said second voltage; and (e) a suitable control means for controlling said voltage device; said control means receiving said information signal and controlling said voltage device in such a way that said second voltage correlates to a preferred rate of change of said induction level; said preferred rate of change of said induction level being a function of time not continuously equal to zero.

70. The apparatus of claim 69 wherein said apparatus operates for a period of time to cause said induction level to transition from a determinate induction level at the beginning of said period of time to a preferred induction level at the end of said period of time; said control means causing said output voltage to have such waveform and magnitude so as to cause the integral of said second voltage over said period of time to be approximately equal to a volt-time value corresponding to a change of said induction level from said determinate induction level to said preferred induction level, thereby causing said induction level to transition from said determinate induction level to said preferred induction level.

71. The apparatus of claim 70 wherein said magnetic body is a magnetic core of a current transformer, and said first winding is a secondary winding of said current transformer; said current transformer functioning to cause said first electric current to be approximately proportional to a primary electric current; said primary electric current flowing in a conductor configured as a third winding; said apparatus being utilized while said current transformer is in service; said apparatus functioning to periodically cause said induction level to transition to a preferred induction level near zero, thereby demagnetizing said current transformer, thereby causing said first electric current to be more accurately proportional to said primary electric current than would be the case without said apparatus.

72. The apparatus of claim 71 wherein said primary electric current is a direct current.

73. The apparatus of claim 69 wherein said induction level is influenced by a magnetic field caused by a magnetomotive force independent of said first winding and said output voltage is controlled for a period of time in such a way as to maintain said induction level near a preferred induction level; said preferred induction level being present at the beginning of said period of time; said output voltage further causing said second voltage to have such waveform and magnitude during said period of time that the integral of said second voltage from the beginning of said period of time to any point of time within said period of time does not exceed a predetermined value, thereby causing said induction level to be maintained near said preferred induction level.

74. The apparatus of claim 69 wherein said apparatus causes said induction level to approximately match a reference induction level for a period of time; said reference induction level being a function of time; said second voltage being approximately equal to said rate of change of said induction level multiplied by a constant of proportionality; said output voltage further causing the instantaneous magnitude of said second voltage to continuously be approximately equal to the rate of change of said reference induction level multiplied by said constant of proportionality, thereby causing said induction level to approximately match said reference induction level.

75. The apparatus of claim 69 wherein said magnetic body further magnetically interacts with a primary winding; said primary winding comprising one or more turns of conductive material; said primary winding conducting an alternating electric current; said primary winding being positioned relative to said magnetic body in such a way that said alternating electric current influences said induction level of said magnetic body; said voltage device comprising an adjustable impedance connected in series with said first winding; said first electric current flowing through said adjustable impedance; said control means controlling said output voltage of said voltage device by controlling the characteristics of said adjustable impedance; said output voltage being a function of the magnitude and polarity of said secondary electric current and said characteristics of said adjustable impedance.

* * * * *

UNITED STATES PATENT AND TRADEMARK OFFICE
CERTIFICATE OF CORRECTION

PATENT NO. : 6,522,517 B1
DATED : February 18, 2003
INVENTOR(S) : Thomas G. Edel It is certified that error appears in the above-identified patent and that said Letters Patent is hereby corrected as shown below:

Column 9,
Line 8, change "level $B_2$ to" to -- level $B_1$ to --.

Column 19,
Line 3, change "mmtfs" to -- mmf's --.
Line 5, change "mmf s" to -- mmf's --.

Column 20,
Line 50, change "resistor R" to -- resistor R1 --.

Column 23,
Line 41, change "non-zero so" to -- non-zero --.

Column 33,
Line 14, change "some'safety" to -- some safety --.

Column 40,
Line 10, change "ZS, Z6, and Z7" to -- Z5, Z6 and Z7 --.

Column 41,
Line 38, change "impedance ZS" to -- impedance Z5 --.

Column 42,
Line 60, change "inductions level" to -- induction level --.

Column 45,
Line 6, change "The method claim" to -- The method of claim --.
Line 55, change "voltage:being" to -- voltage being --.

UNITED STATES PATENT AND TRADEMARK OFFICE
CERTIFICATE OF CORRECTION

PATENT NO. : 6,522,517 B1
DATED : February 18, 2003
INVENTOR(S) : Thomas G. Edel It is certified that error appears in the above-identified patent and that said Letters Patent is hereby corrected as shown below:

Column 48,
Line 42, change "claim 35" to -- claim 25 --.

Signed and Sealed this

Eleventh Day of April, 2006

JON W. DUDAS
*Director of the United States Patent and Trademark Office*